(12) United States Patent
Lee et al.

(10) Patent No.: US 10,497,846 B2
(45) Date of Patent: Dec. 3, 2019

(54) LIGHT EMITTING DEVICE PACKAGE

(71) Applicant: LG INNOTEK CO., LTD., Seoul (KR)

(72) Inventors: Tae Sung Lee, Seoul (KR); Chang Man Lim, Seoul (KR); June O Song, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 0 days.

(21) Appl. No.: 16/031,657

(22) Filed: Jul. 10, 2018

(65) Prior Publication Data

US 2019/0019926 A1 Jan. 17, 2019

(30) Foreign Application Priority Data

Jul. 11, 2017 (KR) .................. 10-2017-0087641
Dec. 1, 2017 (KR) .................. 10-2017-0164481

(51) Int. Cl.
| | |
|---|---|
| H01L 33/56 | (2010.01) |
| H01L 33/62 | (2010.01) |
| H01L 33/48 | (2010.01) |
| H01L 33/38 | (2010.01) |

(52) U.S. Cl.
CPC ............ *H01L 33/62* (2013.01); *H01L 33/486* (2013.01); *H01L 33/38* (2013.01); *H01L 2933/0033* (2013.01); *H01L 2933/0066* (2013.01)

(58) Field of Classification Search
None
See application file for complete search history.

(56) References Cited

U.S. PATENT DOCUMENTS

| | | | | |
|---|---|---|---|---|
| 8,253,229 | B2* | 8/2012 | Yamano | H01L 25/105 257/686 |
| 2005/0116354 | A1* | 6/2005 | Kashiwazaki | H01L 23/49816 257/779 |
| 2008/0055859 | A1* | 3/2008 | Furukawa | H01C 1/148 361/704 |
| 2008/0315230 | A1* | 12/2008 | Murayama | H01L 23/045 257/98 |
| 2010/0133568 | A1* | 6/2010 | Komatsu | H01L 33/58 257/98 |
| 2012/0113328 | A1* | 5/2012 | Takeshima | G02F 1/133603 348/739 |
| 2012/0248486 | A1* | 10/2012 | Suh | H01L 33/486 257/98 |
| 2015/0228867 | A1* | 8/2015 | Kim | H01L 33/505 362/97.1 |

* cited by examiner

*Primary Examiner* — Dung A. Le
(74) *Attorney, Agent, or Firm* — Birch, Stewart, Kolasch & Birch, LLP

(57) ABSTRACT

A light emitting device package according to an embodiment includes: a body including first and second openings passing through an upper surface of the body and a lower surface of the body; a light emitting device disposed on the body and including first and second bonding parts; and first and second conductive layers disposed under the body and electrically connected to the first and second bonding parts, respectively, wherein each of the first and second bonding parts includes a protrusion portion protruding and extending in a downwards direction within the first and second openings, respectively.

20 Claims, 37 Drawing Sheets

LIGHT EMITTING DEVICE PACKAGE

CROSS-REFERENCE TO RELATED APPLICATIONS

This application claims priority under 35 U.S.C. § 119 to Korean Patent Application No. 10-2017-0087641 filed in Korea on Jul. 11, 2017, and Korean Patent Application No. 10-2017-0164481 filed in Korea on Dec. 1, 2017 which are hereby incorporated in their entirety by reference as if fully set forth herein.

TECHNICAL FIELD

The embodiment relates to a semiconductor device package, a method of manufacturing the semiconductor device package, and a light source apparatus.

BACKGROUND

A semiconductor device including compounds such as GaN and AlGaN has many merits such as wide and easily adjustable bandgap energy, so the device can be used variously as light emitting devices, light receiving devices and various kinds of diodes.

In particular, light emitting devices such as light emitting diodes and laser diodes obtained by using group III-V or group II-VI compound semiconductor substances can implement light having various wavelength band such as red, green, blue and ultraviolet rays due to the development of thin film growth technology and device materials. In addition, the light emitting devices such as light emitting diodes and laser diodes obtained by using group III-V or group II-VI compound semiconductor substances can implement a white light source having high efficiency by using fluorescent substances or combining colors. Such a light emitting device has advantages such as low power consumption, semi-permanent lifetime, quick response speed, safety, and environmental friendliness compared to conventional light sources such as fluorescent lamps and incandescent lamps.

In addition, when a light receiving device such as a photodetector or a solar cell is manufactured using the group III-V or group II-VI compound semiconductor substances, a photoelectric current is generated by absorbing light having various wavelength domains with the development of device materials, so that light having various wavelength domains such as from gamma rays to radio waves can be used. In addition, the above light receiving device has advantages such as quick response speed, safety, environmental friendliness and easy control of device materials, so that the light receiving device can be easily used for a power control, a super-high frequency circuit or a communication module.

Accordingly, the semiconductor device has been applied and expanded to a transmission module of an optical communication tool, a light emitting diode backlight replacing a cold cathode fluorescent lamp (CCFL) constituting a backlight of a liquid crystal display (LCD), a white light emitting diode lighting apparatus replaceable with a fluorescent lamp or an incandescent bulb, a vehicular headlight, a traffic light and a sensor for detecting gas or fire. In addition, the applications of the semiconductor device can be expanded to a high frequency application circuit, a power control apparatus, or a communication module.

For example, the light emitting device may be provided as a p-n junction diode having a characteristic in which electrical energy is converted into light energy by using a group III-V element or a group II-VI element in the periodic table, and various wavelengths can be realized by adjusting the composition ratio of the compound semiconductor substances.

For example, since a nitride semiconductor has high thermal stability and wide bandgap energy, it has received great attention in the field of development of optical devices and high power electronic devices. Particularly, a blue light emitting device, a green light emitting device, an ultraviolet (UV) light emitting device, and a red light emitting device using the nitride semiconductor are commercialized and widely used.

For example, the ultraviolet light emitting device refers to a light emitting diode that generates light distributed in a wavelength range of 200 nm to 400 nm. In the above wavelength range, a short wavelength may be used for sterilization, purification or the like and a long wavelength may be used for a stepper, a curing apparatus or the like.

Ultraviolet rays may be classified into UV-A (315 nm to 400 nm), UV-B (280 nm to 315 nm) and UV-C (200 nm to 280 nm) in an order of the long wavelength. The UV-A (315 nm to 400 nm) domain is applied to various fields such as industrial UV curing, curing of printing ink, exposure machine, discrimination of counterfeit money, photocatalytic sterilization, special lighting (such as aquarium/agriculture), the UV-B (280 nm to 315 nm) domain is applied to medical use, and the UV-C (200 nm to 280 nm) domain is applied to air purification, water purification, sterilization products and the like.

Meanwhile, as a semiconductor device capable of providing a high output has been requested, studied on a semiconductor device capable of increasing an output power by applying a high power source has been proceeding.

In addition, as for a semiconductor device package, studies on a method of improving the light extraction efficiency of a semiconductor device and improving the light intensity in a package stage has been proceeding. In addition, as for the semiconductor device package, studies on a method of improving bonding strength between a package electrode and a semiconductor device has been proceeding.

In addition, as for the semiconductor device package, studies on a method of reducing the manufacturing cost and improving the manufacturing yield by improving the process efficiency and changing the structure has been proceeding.

SUMMARY

The embodiments may provide a semiconductor device package capable of improving the light extraction efficiency and electrical characteristics, a method of manufacturing the semiconductor device package, and a light source apparatus.

The embodiments may provide a semiconductor device package capable of reducing the manufacturing cost and improving the manufacturing yield, a method of manufacturing the semiconductor device package, and a light source apparatus.

Embodiments provide a semiconductor device package and a method of manufacturing a semiconductor device package that may prevent a re-melting phenomenon from occurring in a bonding region of the semiconductor device package during a process of re-bonding the semiconductor device package to a substrate or the like.

A light emitting device package according to an embodiment comprises: a body comprising first and second openings passing through an upper surface of the body and a lower surface of the body; a light emitting device disposed on the body and comprising first and second bonding parts; and first and second conductive layers disposed under the body and electrically connected to the first and second bonding parts, respectively, wherein each of the first and second bonding parts comprises a protrusion portion protruding and extending in downwards direction within the first and second openings, respectively.

A light emitting device package according to an embodiment may further comprise a resin disposed between the body and the light emitting device.

According to an embodiment, the protrusion portions of the first and second bonding parts may be disposed in the first and second openings, respectively.

According to an embodiment, a lower surface of the protrusion portion of the first bonding part may be disposed lower than an upper surface of the first opening.

According to an embodiment, the protrusion portion of the first bonding part may be provided in a cylindrical shape or a polygonal column shape.

According to an embodiment, a shape of the first and second bonding parts may be provided corresponding to shapes of upper regions of the first and second openings.

According to an embodiment, the first conductive layer and the second conductive layer may be disposed to be spaced apart from each other on a lower surface of the body.

According to an embodiment, a width of the protrusion portions of the first and second bonding parts may be provided smaller than that of the upper regions of the first and second openings.

According to an embodiment, a first region of an upper surface of the first conductive layer is disposed under the first opening, and a second region of the upper surface of the first conductive layer may be disposed under the lower surface of the body.

According to an embodiment, the first region of the upper surface of the first conductive layer may be disposed to be overlapped with the first opening in a vertical direction.

According to an embodiment, the second region on the upper surface of the first conductive layer may be disposed to be overlapped with the lower surface of the body in a vertical direction.

According to an embodiment, a portion of the first conductive layer may be disposed at the periphery of the protrusion portion of the first bonding part.

According to an embodiment, the first and second bonding parts may comprise at least one material selected from the group consisting of Ti, Al, In, Ir, Ta, Pd, Co, Cr, Mg, Zn, Ni, Si, Ge, Ag, Ag alloy, Au, Hf, Pt, Ru, Rh, Sn, Cu, ZnO, IrOx, RuOx, NiO, RuOx/ITO, Ni/IrOx/Au, Ni/IrOx/Au/ITO, or an alloy thereof.

According to an embodiment, the first and second conductive layers may comprise at least one material selected from the group consisting of Ag, Au, Pt, Sn, Cu, SAC (Sn—Ag—Cu) or an alloy thereof.

According to an embodiment, the resin may comprise a white silicone.

According to an embodiment, the resin may be provided in direct contact with the upper surface of the body and a lower surface of the light emitting device.

According to an embodiment, the resin may be provided at the periphery of the first and second bonding parts.

According to an embodiment, the body may further comprise a recess provided to concave from the upper surface of the body toward the lower surface thereof, and the resin may be provided to the recess.

According to the embodiment, a side surface of the body and a side surface of the first conductive layer may be provided in the same plane.

According to an embodiment, the upper surface of the body may be provided in a flat shape in the entire region.

A light emitting device package according to an embodiment comprises: a body comprising first and second openings passing through an upper surface of the body and a lower surface of the body; a light emitting device disposed on the body; and an adhesive comprising a reflective material, wherein the body comprises a first recess disposed between the first opening and the second opening, and the adhesive is disposed in the first recess, and wherein the light emitting device comprises: a first electrode disposed on the first opening; a second electrode disposed on the second opening; a semiconductor structure comprising a first semiconductor layer electrically connected to the first electrode, a second semiconductor layer electrically connected to the second electrode, and an active layer disposed between the first and second semiconductor layers; and a substrate disposed on the semiconductor structure, and wherein the first electrode comprises a first bonding part overlapped with the first opening in a first direction and a first branched electrode extended from the first bonding part, and the second electrode comprises a second bonding part overlapped with the second opening in the first direction, and wherein the first direction is a direction from a lower surface of the body toward an upper surface of the body, and a sum of areas of the first and second bonding parts may be provided at 10% or less based on an area of an upper surface of the substrate.

According to the embodiment, an area where the adhesive is overlapped with the light emitting device based on the first direction may be provided to be larger than that of a region where the first and second openings are overlapped with the first and second bonding parts.

According to the embodiment, the adhesive may be disposed in direct contact with the upper surface of the body and the lower surface of the light emitting device.

A light emitting device package according to an embodiment comprises: a first conductive layer provided in the first opening and disposed in direct contact with a lower surface of the first bonding part; and a second conductive layer provided in the second opening and disposed in direct contact with a lower surface of the second bonding part.

According to an embodiment, the first conductive layer comprises a first upper conductive layer provided in an upper region of the first opening and a first lower conductive layer provided in a lower region of the first opening, and the first upper conductive layer and the first lower conductive layer may comprise different materials from each other.

A light emitting device package according to an embodiment comprises: a first upper recess provided on the upper surface of the body and disposed to be spaced apart from the first opening; and a second upper recess provided on the upper surface of the body and disposed to be spaced apart from the second opening.

A light emitting device package according to an embodiment may comprise a first resin portion provided on the first upper recess and a second resin portion provided on the second upper recess, and the first resin portion and the second resin portion may comprise a white silicone.

A light emitting device package according to an embodiment comprises: a first lower recess provided on the lower surface of the body and disposed to be spaced apart from the first opening; and a second lower recess provided on the lower surface of the body and disposed to be spaced apart from the second opening.

A light emitting device package according to an embodiment comprises a first resin portion provided on the first lower recess and a second resin portion provided on the second lower recess, and the first resin portion and the second resin portion may comprise the same materials as the body.

A light emitting device package according to an embodiment comprises: a body comprising first and second openings passing through an upper surface and a lower surface, and a first recess disposed between the first and second openings; an adhesive disposed on the first recess; a light emitting device disposed on the adhesive; and first and second conductors disposed between the body and the light emitting device, wherein the light emitting device comprises: a first electrode disposed on the first opening; a second electrode disposed on the second opening; a semiconductor structure comprising a first conductive type semiconductor layer electrically connected to the first electrode, a second conductive type semiconductor layer electrically connected to the second electrode, and an active layer disposed between the first conductive type semiconductor layer and the second conductive type semiconductor layer; and a substrate disposed on the semiconductor structure, and wherein the first conductor may be disposed from the first electrode to an inside of the first opening, and the second conductor may be disposed from the second electrode to an inside of the second opening.

According to an embodiment, the first electrode comprises a first bonding part overlapped with the first opening in a first direction and a first branched electrode extended from the first bonding part, and the second electrode comprises a second bonding part overlapped with the second opening in the first direction, and wherein the first direction is a direction from a lower surface of the body toward an upper surface of the body, and a sum of an areas of the first and second bonding parts may be provided at 10% or less based on an area of an upper surface of the substrate.

A light emitting device package according to an embodiment comprises: a body comprising first and second openings passing through an upper surface and a lower surface; a light emitting device disposed on the body and comprising a first electrode and a second electrode; an adhesive comprising a reflective material and disposed between the body and the light emitting device; a first conductor disposed at the first opening of the body and electrically connected to a first electrode of the light emitting device; a second conductor disposed at the second opening of the body and electrically connected to a second electrode of the light emitting device; a first conductive layer disposed at the first opening and electrically connected to the first conductor; and a second conductive layer disposed at the second opening and electrically connected to the second conductor, wherein the light emitting device comprises: a substrate; an active layer disposed between a first semiconductor layer disposed on the body, a second semiconductor layer, and the first and second semiconductor layers; the first electrode disposed on the first semiconductor layer and comprising a first pad electrode and a first branched electrode extended from the first pad electrode; and the second electrode disposed on the second semiconductor layer and comprising a second pad electrode, and wherein the body comprises a first recess disposed between the first opening and the second opening, the adhesive is disposed at the first recess, the first opening is overlapped with the first pad electrode based on a first direction from the lower surface of the body toward the upper surface of the body, the second opening is overlapped with the second pad electrode based on the first direction, the first conductive layer is disposed in direct contact with a lower surface and a side surface of the first conductor, the second conductive layer may be disposed in direct contact with a lower surface and a side surface of the second conductor.

According to an embodiment, a sum of areas of the first and second pad electrodes may be provided at 10% or less based on an area of an upper surface of the substrate.

According to the embodiment, an area where the adhesive is overlapped with the light emitting device based on the first direction may be provided to be larger than that of a region where the first and second openings are overlapped with the first and second pad electrodes.

A light emitting device package according to an embodiment comprises: a first conductive layer provided in the first opening and disposed in direct contact with a side surface and a lower surface of the first bonding part; and a second conductive layer provided in the second opening and disposed in direct contact with a side surface and a lower surface of the second bonding part.

According to an embodiment, the first conductive layer comprises a first upper conductive layer provided in an upper region of the first opening and a first lower conductive layer provided in a lower region of the first opening, and the first upper conductive layer and the first lower conductive layer may comprise different materials from each other.

The semiconductor device package and the method of manufacturing the semiconductor device package according to the embodiment can improve light extraction efficiency, electrical characteristics and reliability The semiconductor device package and the method of manufacturing the semiconductor device package according to the embodiment can improve the process efficiency and propose a new package structure, thereby reducing manufacturing cost and improving manufacturing yield.

According to embodiments, the semiconductor device package is provided with a body having high reflectance, so that a reflector can be prevented from being discolored, thereby improving reliability of the semiconductor device package.

According to embodiments, the semiconductor device package and the method of manufacturing a semiconductor device can prevent a re-melting phenomenon from occurring in a bonding region of the semiconductor device package during a process of re-bonding the semiconductor device package to a substrate or the like or heat-treating the semiconductor device package.

DETAILED DESCRIPTION OF THE EMBODIMENTS

Hereinafter, embodiments will be described with reference to the accompanying drawings. In the description of embodiments, it will be understood that when a layer (or film), region, pattern or structure is referred to as being "on" or "under" another layer (or film), region, pattern or structure, the terminology of "on" and "under" comprises both the meanings of "directly" or "by interposing another layer (indirectly)". Further, the reference about "on" and "under" each layer will be made on the basis of drawings, but embodiments are not limited thereto.

Hereinafter, a semiconductor device package according to embodiments of the present invention and a method of manufacturing a semiconductor device package will be described in detail with reference to the accompanying drawings. Hereinafter, it will be described based on the case where a light emitting device is applied as an example of a semiconductor device.

First, a light emitting device package according to an embodiment of the present invention will be described with reference to FIGS. 1 to 3.

Figure 1:
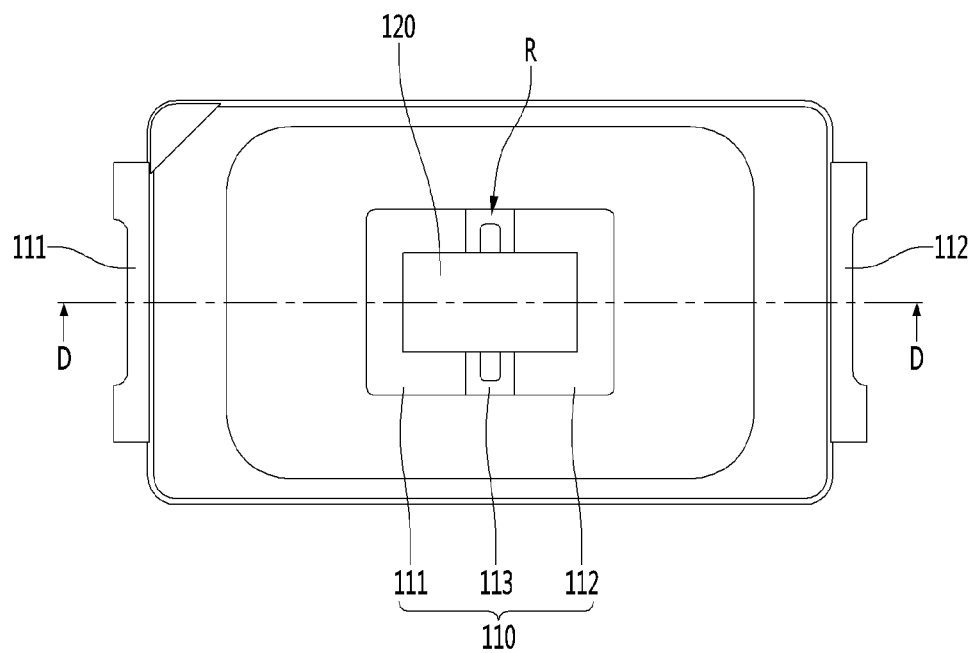
FIG. 1 is a plan view of a light emitting device package according to an embodiment of the present invention.
Figure 2:
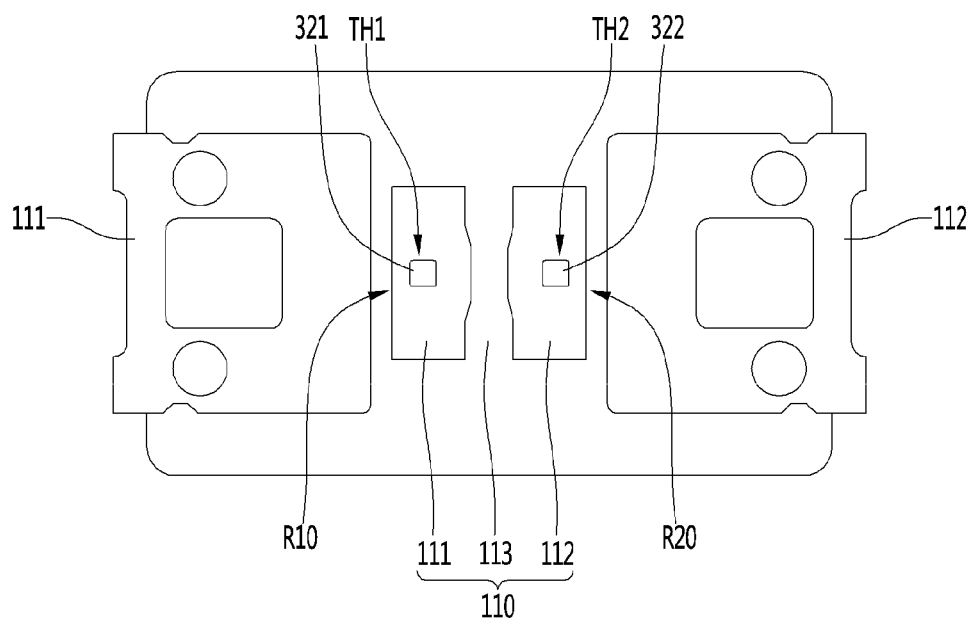
FIG. 2 is a bottom view of the light emitting device package shown in FIG. 1.
Figure 3:
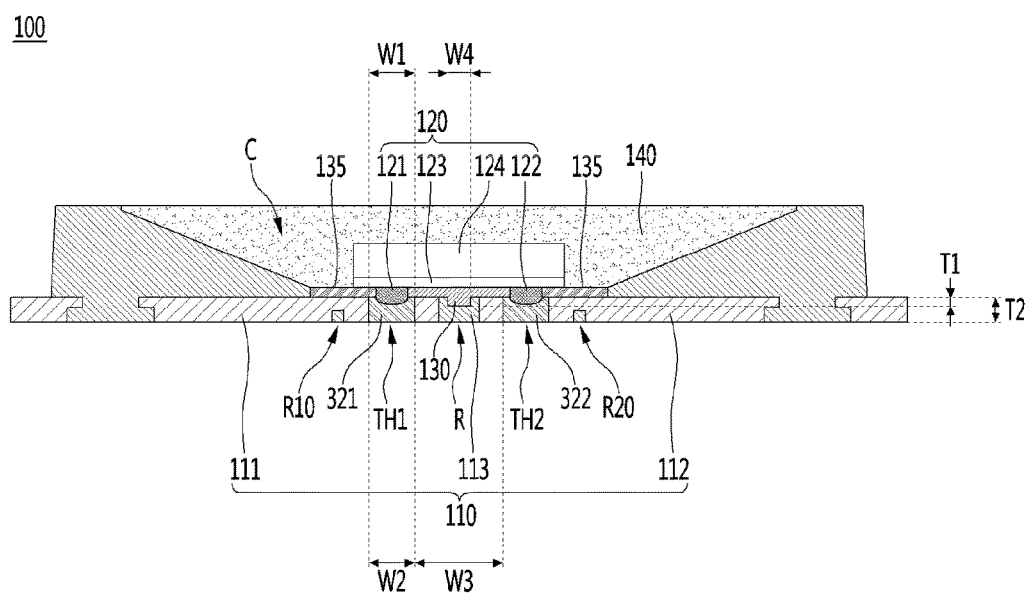
FIG. 3 is a cross-sectional view taken along line D-D of the light emitting device package shown in FIG. 1.

FIG. 1 is a plan view of a light emitting device package according to an embodiment of the present invention, FIG. 2 is a bottom view of the light emitting device package according to an embodiment of the present invention, FIG. 3 is a cross-sectional view taken along line D-D of the light emitting device package.

The light emitting device package 100 according to an embodiment may comprise a package body 110 and a light emitting device 120, as shown in FIGS. 1 to 3.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112. The body 113 may perform a function as a kind of electrode separation line. The body 113 may also be referred to as an insulating member.

The body 113 may be disposed on the first frame 111. In addition, the body 113 may be disposed on the second frame 112.

The body 113 may provide an inclined surface disposed on the first frame 111 and the second frame 112. A cavity C may be provided on the first frame 111 and the second frame 112 by the inclined surface of the body 113.

According to the embodiment, the package body 110 may be provided in a structure with the cavity C, or may be provided a structure with a flat upper surface without the cavity C.

For example, the body 113 may be formed of at least one selected from the group consisting of polyphthalamide (PPA), polychloro tri phenyl (PCT), liquid crystal polymer (LCP), polyamide 9T (PA9T), silicone, epoxy molding compound (EMC), silicone molding compound (SMC), ceramic, photo sensitive glass (PSG), sapphire ($Al_2O_3$), and the like. In addition, the body 113 may comprise a high refractive index filler such as $TiO_2$ and $SiO_2$.

The first frame 111 and the second frame 112 may be provided as an insulating frame. The first frame 111 and the second frame 112 may stably provide a structural strength of the package body 110.

In addition, the first frame 111 and the second frame 112 may be provided as a conductive frame. The first frame 111 and the second frame 112 may stably provide the structural strength of the package body 110 and may be electrically connected to the light emitting device 120.

A difference between the case of forming the first frame 111 and the second frame 112 as the insulating frame and the case of forming the first frame 111 and the second frame 112 as the conductive frame will be described later.

According to the embodiment, the light emitting device 120 may comprise a first pad electrode 121, a second pad electrode 122, a semiconductor structure 123, and a substrate 124.

The light emitting device 120 may comprise the semiconductor structure 123 disposed under the substrate 124, as shown in FIG. 3. The first pad electrode 121 and the second pad electrode 122 may be disposed between the semiconductor structure 123 and the body 113.

The first pad electrode 121 and the second pad electrode 122 may be referred to as a bonding part. For example, the first pad electrode 121 may be referred to as a first bonding part, and the second pad electrode 122 may be referred to as a second bonding part.

The semiconductor structure 123 may comprise a first conductive type semiconductor layer, a second conductive type semiconductor layer, and an active layer disposed between the first conductive type semiconductor layer and the second conductive type semiconductor layer. The first pad electrode 121 may be electrically connected to the first conductive type semiconductor layer. In addition, the second pad electrode 122 may be electrically connected to the second conductive type semiconductor layer.

The light emitting device 120 may be disposed on the package body 110. The light emitting device 120 may be disposed on the first frame 111 and the second frame 112. The light emitting device 120 may be disposed in the cavity C provided by the package body 110.

The first pad electrode 121 may be disposed on a lower surface of the light emitting device 120. The second pad electrode 122 may be disposed on the lower surface of the light emitting device 120. The first pad electrode 121 and the second pad electrode 122 may be disposed to be spaced apart from each other on the lower surface of the light emitting device 120.

The first pad electrode 121 may be disposed on the first frame 111. The second pad electrode 122 may be disposed on the second frame 112.

The first pad electrode 121 may be disposed between the semiconductor structure 123 and the first frame 111. The second pad electrode 122 may be disposed between the semiconductor structure 123 and the second frame 112.

The first pad electrode 121 and the second pad electrode 122 may be formed in a single layer of multiple layers by using at least one material selected from the group consisting of Ti, Al, In, Ir, Ta, Pd, Co, Cr, Mg, Zn, Ni, Si, Ge, Ag, Ag alloy, Au, Hf, Pt, Ru, Rh, Sn, Cu, ZnO, IrOx, RuOx, NiO, RuOx/ITO, Ni/IrOx/Au, Ni/IrOx/Au/ITO, or an alloy thereof.

Meanwhile, the light emitting device package 100 according to the embodiment may comprise a first opening TH1 and a second opening TH2, as shown in FIGS. 1 to 3. The first frame 111 may comprise the first opening TH1. The second frame 112 may comprise the second opening TH2.

The first opening TH1 may be provided at the first frame 111. The first opening TH1 may be provided by passing through the first frame 111. The first opening TH1 may be provided by passing through an upper surface and a lower surface of the first frame 111 in a first direction.

The first opening TH1 may be disposed under the first pad electrode 121 of the light emitting device 120. The first opening TH1 may be provided to be overlapped with the first pad electrode 121 of the light emitting device 120. The first opening TH1 may be provided to be overlapped with the first pad electrode 121 of the light emitting device 120 in the first direction from the upper surface of the first frame 111 toward the lower surface thereof.

The second opening TH2 may be provided at the second frame 112. The second opening TH2 may be provided by passing through the second frame 112. The second opening TH2 may be provided by passing through an upper surface and a lower surface of the second frame 112 in a first direction.

The second opening TH2 may be disposed under the second pad electrode 122 of the light emitting device 120. The second opening TH2 may be provided to be overlapped with the second pad electrode 122 of the light emitting device 120. The second opening TH2 may be provided to be overlapped with the second pad electrode 122 of the light emitting device 120 in the first direction from the upper surface of the second frame 112 toward the lower surface thereof.

The first opening TH1 and the second opening TH2 may be disposed to be spaced apart from each other. The first opening TH1 and the second opening TH2 may be disposed to be spaced apart from each other under the lower surface of the light emitting device 120.

According to the embodiment, a width W1 of an upper region of the first opening TH1 may be greater than that of the first pad electrode 121. In addition, a width of an upper region of the second opening TH2 may be greater than that of the second pad electrode 122.

According to the embodiment, a lower portion of the first pad electrode 121 may be disposed in the upper region of the first opening TH1. A bottom surface of the first pad electrode 121 may be disposed lower than the upper surface of the first frame 111.

In addition, a lower portion of the second pad electrode 122 may be disposed in the upper region of the second opening TH2. A bottom surface of the second pad electrode 122 may be disposed lower than the upper surface of the second frame 112.

In addition, the width W1 of the upper region of the first opening TH1 may be smaller than or equal to a width W2 of a lower region of the first opening TH1. The width of the upper region of the second opening TH2 may be smaller than or equal to the width of a lower region of the second opening TH2.

The first opening TH1 may be provided in an inclined shape in which a width gradually decreases from the lower region to the upper region. The second opening TH2 may be provided in an inclined shape in which a width gradually decreases from the lower region to the upper region.

However, the present invention is not limited thereto, and the inclined surfaces between the upper and lower regions of the first and second openings TH1 and TH2 may have a plurality of inclined surfaces having different slopes, and the inclined surfaces may be disposed with a curvature.

A width W3 between the first opening TH1 and the second opening TH2 in lower surface regions of the first frame 111 and the second frame 112 may be provided at several hundreds of micrometers. The width W3 between the first opening TH1 and the second opening TH2 in the lower surface regions of the first frame 111 and the second frame 112 may be provided at 100 to 150 micrometers, as an example.

The width W3 between the first opening TH1 and the second opening TH2 in the lower surface regions of the first frame 111 and the second frame 112 may be selected to be provided more than a predetermined distance to prevent electrical short between the pads when the light emitting device package 100 according to the embodiment is mounted on a circuit board, a submount, or the like later.

In addition, the light emitting device package 100 according to the embodiment may comprise an adhesive 130.

The adhesive 130 may be disposed between the body 113 and the light emitting device 120. The adhesive 130 may be disposed between an upper surface of the body 113 and a lower surface of the light emitting device 120.

In addition, the light emitting device package 100 according to the embodiment may comprise a recess R, as shown in FIGS. 1 to 3.

The recess R may be provided at the body 113. The recess R may be provided between the first opening TH1 and the second opening TH2. The recess R may be provided to concave from the upper surface of the body 113 toward the lower surface thereof. The recess R may be disposed under the light emitting device 120. The recess R may be provided to be overlapped with the light emitting device 120 in the first direction.

As an example, the adhesive 130 may be disposed in the recess R. The adhesive 130 may be disposed between the light emitting device 120 and the body 113. The adhesive 130 may be disposed between the first pad electrode 121 and the second pad electrode 122. As an example, the adhesive 130 may be disposed in contact with a side surface of the first pad electrode 121 and a side surface of the second pad electrode 122.

The adhesive 130 may provide a stable fixing force between the light emitting device 120 and the package body 110. The adhesive 130 may provide a stable fixing force between the light emitting device 120 and the body 113. The adhesive 130 may be disposed, as an example, in direct contact with the upper surface of the body 113. In addition, the adhesive 130 may be disposed in direct contact with the lower surface of the light emitting device 120.

As an example, the adhesive 130 may comprise at least one of an epoxy-based material, a silicone-based material, and a hybrid material comprising an epoxy-based material and a silicone-based material. Also, as an example, when the adhesive 130 comprises a reflective function, the adhesive 130 may comprise a white silicone. The adhesive 130 may be referred to as a first resin as another representation.

The adhesive 130 may provide a stable fixing force between the body 113 and the light emitting device 120. When light is emitted to the lower surface of the light emitting device 120, the adhesive 130 may provide a light diffusion function between the light emitting device 120 and the body 113. When the light is emitted from the light emitting device 120 to the lower surface of the light emitting device 120, the adhesive 130 may improve the light extraction efficiency of the light emitting device package 100 by providing the light diffusion function. In addition, the adhesive 130 may reflect the light emitted from the light emitting device 120. When the adhesive 130 comprises the reflection function, the adhesive 130 may be formed of a material comprising $TiO_2$, Silicone, and the like.

According to an embodiment, a depth T1 of the recess R may be provided to be smaller than a depth T2 of the first opening TH1 or a depth T2 of the second opening TH2.

The depth T1 of the recess R may be determined in consideration of adhesion force of the adhesive 130. In addition, the depth T1 of the recess R may be determined by considering stable strength of the body 113 and/or not to occur a crack in the light emitting device package 100 due to heat emitted from the light emitting device 120.

The recess R may provide a proper space in which a kind of under-filling process may be performed under the light emitting device 120. Here, the under-filling process may be a process of mounting the light emitting device 120 on the package body 110 and then disposing the adhesive 130 under the light emitting device 120, and may be a process of disposing the adhesive 130 in the recess R and then disposing the light emitting device 120 in order to mount by the adhesive 130 in the process of mounting the light emitting device 120 on to the package body 110. The recess R may be provided at a first depth or more so that the adhesive 130 may be sufficiently provided between the lower surface of the light emitting device 120 and the upper surface of the body 113. In addition, the recesses R may be provided at a second depth or less to provide a stable strength of the body 113.

The depth T1 and the width W4 of the recess R may affect a forming position and fixing force of the adhesive 130. The depth T1 and the width W4 of the recess R may be determined so that a fixing force may be sufficiently provided by the adhesive 130 disposed between the body 113 and the light emitting device 120.

As an example, the depth T1 of the recess R may be provided at several tens of micrometers. The depth T1 of the recess R may be provided at 40 to 60 micrometers.

In addition, the width W4 of the recess R may be provided at several tens of micrometers to several hundreds of micrometers. Here, the width W4 of the recess R may be provided in the major axis direction of the light emitting device 120.

The width W4 of the recess R may be narrower than a distance between the first pad electrode 121 and the second pad electrode 122. The width W4 of the recess R may be provided at 140 to 160 micrometers. As an example, the width W4 of the recess R may be provided at 150 micrometers.

The depth T2 of the first opening TH1 may be provided to correspond to a thickness of the first frame 111. The depth T2 of the first opening TH1 may be provided at a thickness capable of maintaining a stable strength of the first frame 111.

The depth T2 of the second opening TH2 may be provided to correspond to a thickness of the second frame 112. The depth T2 of the second opening TH2 may be provided at a thickness capable of maintaining a stable strength of the second frame 112.

The depth T2 of the first opening TH1 and the depth T2 of the second opening TH2 may be provided to correspond to a thickness of the body 113. The depth T2 of the first opening TH1 and the depth T2 of the second opening TH2 may be provided at a thickness capable of maintaining a stable strength of the body 113.

As an example, the depth T2 of the first opening TH1 may be provided at several hundreds of micrometers. The depth T2 of the first opening TH1 may be provided at 180 to 220 micrometers. As an example, the depth T2 of the first opening TH1 may be provided at 200 micrometers.

As an example, a thickness of T2−T1 may be selected to be at least 100 micrometers or more. This is in consideration of a thickness of an injection process capable of providing crack free of the body 113.

According to an embodiment, a ratio of the thickness T2 to the thickness T1, T2/T1, may be provided at 2 to 10. As an example, when a thickness of T2 is provided at 200 micrometers, the thickness of T1 may be provided at 20 to 100 micrometers.

In addition, according to an embodiment, a sum of areas of the first and second pad electrodes 121 and 122 may be provided at 10% or less based on an area of an upper surface of the substrate 124. According to the light emitting device package according to the embodiment, the sum of the areas of the first and second pad electrodes 121 and 122 may be set at 10% or less based on the area of the upper surface of the substrate 124 in order to secure a light emitting area emitted from the light emitting device and increase light extraction efficiency.

In addition, according to an embodiment, the sum of the areas of the first and second pad electrodes 121 and 122 may be provided at 0.7% or more based on the area of the upper surface of the substrate 124. According to the light emitting device package according to an embodiment, the sum of the areas of the first and second pad electrodes 121 and 122 may be set at 0.7% or more based on the area of the upper surface of the substrate 124 in order to provide a stable bonding force to the light emitting device to be mounted.

According to the embodiment, an area where the adhesive 130 is overlapped with the light emitting device 120 based on the first direction may be provided to be larger than that of a region where the first and second openings TH1 and TH2 are overlapped with the first and second pad electrodes 121 and 122.

As described above, as the area of the first and second pad electrodes 121 and 122 is provided to be small, an amount of light transmitted to the lower surface of the light emitting device 120 may be increased. In addition, the adhesive 130 having a good reflection characteristic may be provided under the light emitting device 120. Therefore, the light emitted in a downwards direction of the light emitting device 120 is reflected at the adhesive 130, and is effectively emitted toward an upper direction of the light emitting device package 100, so that the light extraction efficiency may be improved.

In addition, the light emitting device package 100 according to the embodiment may comprise a molding part 140, as shown in FIGS. 1 to 3.

The molding part 140 may be provided on the light emitting device 120. The molding part 140 may be disposed on the first frame 111 and the second frame 112. The molding part 140 may be disposed at the cavity C provided by the package body 110.

The molding part 140 may comprise an insulating material. In addition, the molding part 140 may comprise wavelength converting means configured to be incident light emitted from the light emitting device 120 and provide wavelength converted light. As an example, the molding part 140 may comprise at least one selected from the group consisting of a phosphor, a quantum dot, and the like.

In addition, as shown in FIGS. 1 to 3, the light emitting device package 100 according to an embodiment may comprise a first conductive layer 321 and a second conductive layer 322. The first conductive layer 321 may be disposed to be spaced apart from the second conductive layer 322.

The first conductive layer 321 may be provided at the first opening TH1. The first conductive layer 321 may be disposed under the first pad electrode 121. A width of the first conductive layer 321 may be provided to be greater than that of the first pad electrode 121.

The first pad electrode 121 may have a width of a second direction perpendicular to the first direction in which the first opening TH1 is formed. The width of the first pad electrode 121 may be provided to be smaller than that of the second direction of the first opening TH1.

The first conductive layer 321 may be disposed in direct contact with the lower surface of the first pad electrode 121. The first conductive layer 321 may be electrically connected to the first pad electrode 121. The first conductive layer 321 may be disposed to be surrounded by the first frame 111.

In the upper region of the first opening TH1, an upper portion of the first conductive layer 321 may be disposed at the periphery of a lower portion of the first pad electrode 121. The upper surface of the first conductive layer 321 may be disposed to be higher than the lower surface of the first pad electrode 121.

The second conductive layer 322 may be provided at the second opening TH2. The second conductive layer 322 may be disposed under the second pad electrode 122. A width of the second conductive layer 322 may be provided to be greater than that of the second pad electrode 122.

The second pad electrode 122 may have a width of a second direction perpendicular to the first direction in which the second opening TH2 is formed. The width of the second pad electrode 122 may be provided to be smaller than that of the second direction of the second opening TH2.

The second conductive layer 322 may be disposed in direct contact with the lower surface of the second pad electrode 122. The second conductive layer 322 may be electrically connected to the second pad electrode 122. The second conductive layer 322 may be disposed to be surrounded by the second frame 112.

In the upper region of the second opening TH2, an upper portion of the second conductive layer 322 may be disposed at the periphery of a lower portion of the second pad electrode 122. The upper surface of the second conductive layer 322 may be disposed to be higher than the lower surface of the second pad electrode 122.

The first conductive layer 321 and the second conductive layer 322 may comprise one material selected from the group consisting of Ag, Au, Pt, Sn, Cu or an alloy thereof. However, the present invention is not limited thereto, and a material capable of securing a conductive function may be used in the first conductive layer 321 and the second conductive layer 322.

As an example, the first conductive layer 321 and the second conductive layer 322 may be formed by using a conductive paste. The conductive paste may comprise a solder paste, a silver paste, or the like, and may be composed of multiple layers or a single layer composed of multiple layers or alloys composed of different materials. As an example, the first and second conductive layers 321 and 322 may comprise a SAC (Sn—Ag—Cu) material.

In addition, as shown in FIGS. 1 to 3, the light emitting device package 100 according to the embodiment may comprise a first lower recess R10 and a second lower recess R20. The first lower recess R10 and the second lower recess R20 may be disposed to be spaced apart from each other.

The first lower recess R10 may be provided at the lower surface of the first frame 111. The first lower recess R10 may be provided to concave from the lower surface of the first frame 111 toward the upper surface thereof. The first lower recess R10 may be disposed to be spaced apart from the first opening TH1.

The first lower recess R10 may be provided with a width of several micrometers to several tens of micrometers. A resin portion may be provided at the first lower recess R10. The resin portion filled at the first lower recess R10 may be provided with, as an example, the same material as the body 113.

However, the present invention is not limited thereto, and the resin portion may be provided with a material selected from materials having poor adhesion force and wettability with the first and second conductive layers 321 and 322. Alternatively, the resin portion may be provided and selected from a material having low surface tension with respect to the first and second conductive layers 321 and 322.

As an example, the resin portion filled at the first lower recess R10 may be provided in a process in which the first frame 111, the second frame 112, and the body 113 are formed through an injection process or the like.

The resin portion filled at the first lower recess R10 may be disposed around a lower surface region of the first frame 111 in which the first opening TH1 is provided. The lower surface region of the first frame 111 in which the first opening TH1 is provided may be disposed to be separated from the lower surface forming the first frame 111 therearound in a shape of an island.

As an example, as shown in FIG. 2, the lower surface region of the first frame 111 in which the first opening TH1 is provided may be isolated from the first frame 111 therearound by a resin portion filled at the first lower recess R10 and the body 113.

Therefore, when the resin portion is disposed of a material having poor adhesion force and wettability with the first and second conductive layers 321 and 322 or a material having low surface tension between the resin portion and the first and second conductive layers 321 and 322, it is possible to prevent the first conductive layer 321 provided in the first opening TH1 from being moved from the first opening TH1 and diffused over the resin portion filled at the first lower recess R10 or the body 113.

This is based on facts that an adhesion relationship between the first conductive layer 321 and the resin portion and the body 113, or the wettability, the surface tension, and the like between the resin portion and the first and second conductive layers 321 and 322 are not good. That is, the material forming the first conductive layer 321 may be selected to have a good adhesion property with the first frame 111. In addition, a material forming the first conductive layer 321 may be selected to have a poor adhesion property with the resin portion and the body 113.

Since the first conductive layer 321 does not overflow from the first opening TH1 toward a region in which the resin portion or the body 113 is provided, it is possible to prevent the first conductive layer 321 from overflowing or extending an outside of the region in which the resin portion or the body 113 is provided, so that the first conductive layer 321 may be stably disposed in a region in which the first opening TH1 is provided. Therefore, when the first conductive layer 321 is disposed in the first opening TH1, it is possible to prevent the first conductive layer 321 from being extended to an outside of the first lower recess R10 in which the resin portion or the body 113 are provided. In addition, the first conductive layer 321 may be stably connected to the lower surface of the first pad electrode 121 in the first opening TH1.

Therefore, when the light emitting device package is mounted on a circuit board, it is possible to prevent a problem that the first conductive layer 321 and the second conductive layer 322 come into contact with each other and are short-circuited, and it is very easy to control an amount of the first and second conductive layers 321 and 322 in the process of disposing the first and second conductive layers 321 and 322.

In addition, the first conductive layer 321 may be disposed to be extended from the first opening TH1 to the first lower recess R10. Therefore, the first conductive layer 321 and/or the resin portion may be disposed in the first lower recess R10.

In addition, the second lower recess R20 may be provided at the lower surface of the second frame 112. The second lower recess R20 may be provided to concave from the lower surface of the second frame 112 toward the upper surface thereof. The second lower recess R20 may be disposed to be spaced apart from the second opening TH2.

The second lower recess R20 may be provided with a width of several micrometers to several tens of micrometers. A resin portion may be provided at the second lower recess R20. The resin portion filled at the second lower recess R20 may be provided with, as an example, the same material as the body 113.

However, the present invention is not limited thereto, and the resin portion may be provided with a material selected from materials having poor adhesion force and wettability with the first and second conductive layers 321 and 322. Alternatively, the resin portion may be provided and selected from a material having a low surface tension with respect to the first and second conductive layers 321 and 322.

As an example, the resin portion filled at the second lower recess R20 may be provided in a process in which the first frame 111, the second frame 112, and the body 113 are formed through an injection process or the like.

The resin portion filled at the second lower recess R20 may be disposed around a lower surface region of the second frame 112 in which the second opening TH2 is provided. The lower surface region of the second frame 112 in which the second opening TH2 is provided may be disposed to be separated from the lower surface forming the second frame 112 therearound in a shape of an island.

As an example, as shown in FIG. 2, the lower surface region of the second frame 112 in which the second opening TH2 is provided may be isolated from the second frame 112 therearound by a resin portion filled at the second lower recess R20 and the body 113.

Therefore, when the resin portion is disposed of a material having poor adhesion force and wettability with the first and second conductive layers 321 and 322 or a material having low surface tension between the resin portion and the first and second conductive layers 321 and 322, it is possible to prevent the first and second conductive layer 322 in which the second opening TH2 is provided from being moved from the second opening TH2 and diffused over the resin portion filled at the second lower recess R20 or the body 113.

This is based on facts that an adhesion relationship between the second conductive layer 322 and the resin portion and the body 113, or the wettability, the surface tension, and the like between the resin portion and the first and second conductive layers 321 and 322 are not good. That is, the material forming the second conductive layer 322 may be selected to have a good adhesion property with the second frame 112. In addition, a material forming the second conductive layer 322 may be selected to have a poor adhesion property with the resin portion and the body 113.

Since the second conductive layer 322 does not overflow from the second opening TH2 toward a region in which the resin portion or the body 113 is provided, it is possible to prevent the second conductive layer 322 from overflowing or extending an outside of a region in which the resin portion or the body 113 is provided, so that the second conductive layer 322 may be stably disposed in a region in which the second opening TH2 is provided. Therefore, when the second conductive layer 322 is disposed in the second opening TH2, it is possible to prevent the second conductive layer 322 from being extended to an outside of the second lower recess R20 in which the resin portion or the body 113 are provided. In addition, the second conductive layer 322 may be stably connected to the lower surface of the second pad electrode 122 in the second opening TH2.

Therefore, when the light emitting device package is mounted on a circuit board, it is possible to prevent a problem that the first conductive layer 321 and the second conductive layer 322 come into contact with each other and are short-circuited, and it is very easy to control an amount of the first and second conductive layers 321 and 322 in the process of disposing the first and second conductive layers 321 and 322.

In addition, the second conductive layer 322 may be disposed to be extended from the second opening TH2 to the second lower recess R20. Therefore, the second conductive layer 322 and/or the resin portion may be disposed in the second lower recess R20.

In addition, the light emitting device package 100 according to the embodiment may comprise a resin portion 135, as shown in FIG. 3.

For reference, as shown in FIG. 1, the resin portion 135 and the molding part 140 are not shown so that an arrangement relationship of the first frame 111, the second frame 112, and the body 113 may be well displayed.

The resin portion 135 may be disposed between the first frame 111 and the light emitting device 120. The resin portion 135 may be disposed between the second frame 112 and the light emitting device 120. The resin portion 135 may be provided at the bottom surface of the cavity C provided in the package body 110.

The resin portion 135 may be disposed on the side surface of the first pad electrode 121. The resin portion 135 may be disposed on the side surface of the second pad electrode 122. The resin portion 135 may be disposed under the semiconductor structure 123.

As an example, the resin portion 135 may comprise at least one of an epoxy-based material, a silicone-based material, and a hybrid material comprising an epoxy-based material and a silicone-based material. In addition, the resin portion 135 may be a reflective part that reflects light emitted from the light emitting device 120, as an example, a resin containing a reflective material such as $TiO_2$, or may comprise white silicone.

The resin portion 135 may be disposed under the light emitting device 120 to perform a sealing function. In addition, the resin portion 135 may improve adhesion force between the light emitting device 120 and the first frame 111. In addition, the resin portion 135 may improve adhesion force between the light emitting device 120 and the second frame 112.

The resin portion 135 may seal around the first pad electrode 121 and the second pad electrode 122. The resin portion 135 may prevent the first conductive layer 321 and the second conductive layer 322 from being moved from the first opening TH1 region and the second opening TH2 region, and diffusing and moving in direction of an outer side surface of the light emitting device 120. When the first and second conductive layers 321 and 322 are diffused and moved in the outer side surface direction of the light emitting device 120, the first and second conductive layers 321 and 322 may be in contact with the active layer of the light emitting device 120, thereby causing a failure due to a short-circuit. Therefore, when the resin portion 135 is disposed, it is possible to prevent a short-circuit t due to the first and second conductive layers 321 and 322 and the active layer, thereby improving reliability of the light emitting device package according to the embodiment.

In addition, according to an embodiment, a protective layer may be provided on the lower surface and the periphery of the light emitting device 120. In such a case, since an insulating protective layer is provided on the surface of the active layer, even when the first and second conductive layers 321 and 322 are diffused and moved in an outer side surface direction of the light emitting device 120, it is possible to prevent the first and second conductive layers 321 and 322 from being electrically connected to the active layer of the light emitting device 120.

Meanwhile, in the case in which an insulating protective layer is disposed on the lower surface and the periphery of the light emitting device 120, an insulating protective layer may not be disposed at the periphery of the substrate 124 of the light emitting device 120. At this point, when the substrate 124 is provided with a conductive material, when the first and second conductive layers 321 and 322 come into contact with the substrate 124, a failure due to a short-circuit may occur. Therefore, when the resin portion 135 is disposed, it is possible to prevent a short-circuit due to the first and second conductive layers 321 and 322 and the substrate 124, thereby improving reliability of the light emitting device package according to the embodiment.

In addition, when the resin portion 135 comprises a material having a reflective property such as white silicone, the resin portion 135 may reflect light emitted from the light emitting device 120 toward an upper direction of the package body 110, thereby improving the light extraction efficiency of the light emitting device package 100.

Meanwhile, according to another example of the light emitting device package according to the embodiment of the present invention, the resin portion 135 may not be provided separately, and the molding part 140 may be disposed so as to be in direct contact with the first frame 111 and the second frame 112.

In addition, according to another example of the light emitting device package according to the embodiment of the present invention, the resin portion 135 may not be provided separately, and the adhesive 130 may be provided at the periphery of the first and second pad electrodes 121 and 122.

At this point, the adhesive 130 may be referred to as a first resin, and the first and second pad electrodes 121 and 122 may be referred to as first and second bonding parts, respectively.

Meanwhile, the adhesive 130 may be disposed at the upper region of the first and second openings TH1 and TH2. A part of the adhesive 130 may be moved to the first and second openings TH1 and TH2 in a process in which the light emitting device 120 is provided on the package body 110. A part of the adhesive 130 may be disposed at a side surface region of the first and second pad electrodes 121 and 122 in the first and second openings TH1 and TH2. A part of the adhesive 130 may be disposed on the first and second conductive layers 321 and 322 in the first and second openings TH1 and TH2.

The adhesive 130 may seal the upper region of the first and second openings TH1 and TH2, and prevent moisture or foreign substance from flowing from outside into a region in which the light emitting device 120 is disposed through the first and second openings TH1 and TH2.

In addition, when a space for providing the adhesive 130 between the light emitting device 120 and the package body 110 is sufficiently secured, the recess R may not be provided on the upper surface of the package body 110.

In addition, according to an embodiment, the semiconductor structure 123 may be provided as a compound semiconductor. The semiconductor structure 123 may be provided as, for example, a Group II-VI or Group III-V compound semiconductor. As an example, the semiconductor structure 123 may be provided with at least two or more elements selected from aluminum (Al), gallium (Ga), indium (In), phosphorus (P), arsenic (As), and nitrogen (N).

The semiconductor structure 123 may comprise a first conductive type semiconductor layer, an active layer, and a second conductive type semiconductor layer.

The first and second conductive type semiconductor layers may be implemented as at least one of the Group II-VI or Group III-V compound semiconductors. The first and second conductive type semiconductor layers may be formed of a semiconductor material having an empirical formula of $In_xAl_yGa_{1-x-y}N$ ($0 \leq x \leq 1$, $0 \leq y \leq 1$, $0 \leq x+y \leq 1$). For example, the first and second conductive type semiconductor layers may comprise at least one selected from the group consisting of GaN, AlN, AlGaN, InGaN, InN, InAlGaN, AlInN, AlGaAs, GaP, GaAs, GaAsP, AlGaInP, and the like. The first conductive type semiconductor layer may be an n-type semiconductor layer doped with an n-type dopant such as Si, Ge, Sn, Se, or Te. The second conductive type semiconductor layer may be a p-type semiconductor layer doped with a p-type dopant such as Mg, Zn, Ca, Sr, or Ba.

The active layer may be implemented as a compound semiconductor. The active layer may be implemented as at least one of the Group III-V or Group II-VI compound semiconductors. When the active layer is implemented as a multi-well structure, the active layer may comprise a plurality of well layers and a plurality of barrier layers that are alternately disposed, and the active layer may be disposed as the semiconductor material having an empirical formula of $In_xAl_yGa_{1-x-y}N$ ($0 \leq x \leq 1$, $0 \leq y \leq 1$, $0 \leq x+y \leq 1$). For example, the active layer may comprise at least one selected from the group consisting of InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, and InP/GaAs.

In the light emitting device package 100 according to the embodiment, power may be connected to the first pad electrode 121 through the region of the first opening TH1, and power may be connected to the second pad electrode 122 through the region of the second opening TH2.

Accordingly, the light emitting device 120 may be driven by the driving power supplied through the first pad electrode 121 and the second pad electrode 122. In addition, the light emitted from the light emitting device 120 may be provided in the upper direction of the package body 110.

Meanwhile, the light emitting device package 100 according to an embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided in the light emitting device package, so that stability of electrical connection and physical coupling may be weakened.

However, according to the light emitting device package and a manufacturing method of the light emitting device package according to an embodiment, the first pad electrode and the second pad electrode of the light emitting device according to the embodiment may be provided with driving power by the conductive layers disposed in the openings. In addition, the melting point of the conductive layers disposed in the openings may be selected so as to have a higher value than that of the general bonding material.

Therefore, since the light emitting device package 100 according to the embodiment does not cause a re-melting phenomenon even when the light emitting device package 100 is bonded to the main substrate by a reflow process, the electrical connection and the physical bonding force may not be deteriorated.

In addition, according to the light emitting device package 100 and the manufacturing method of the light emitting device package according to an embodiment, the package body 110 does not need to be exposed to a high temperature in the manufacturing process of the light emitting device package. Therefore, according to an embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphthalamide (PPA) resin, polycyclohexylenedimethylene terephthalate (PCT) resin, epoxy molding compound (EMC) resin, and silicone molding compound (SMC) resin.

Then, referring to FIGS. 4 to 8, a manufacturing method of a light emitting device package according to an embodiment of the present invention will be described.

In describing the manufacturing method of the light emitting device package according to the embodiment of the present invention with reference to FIGS. 4 to 8, the description of the contents overlapping with the contents described with reference to FIGS. 1 to 3 may be omitted.

Figure 4:
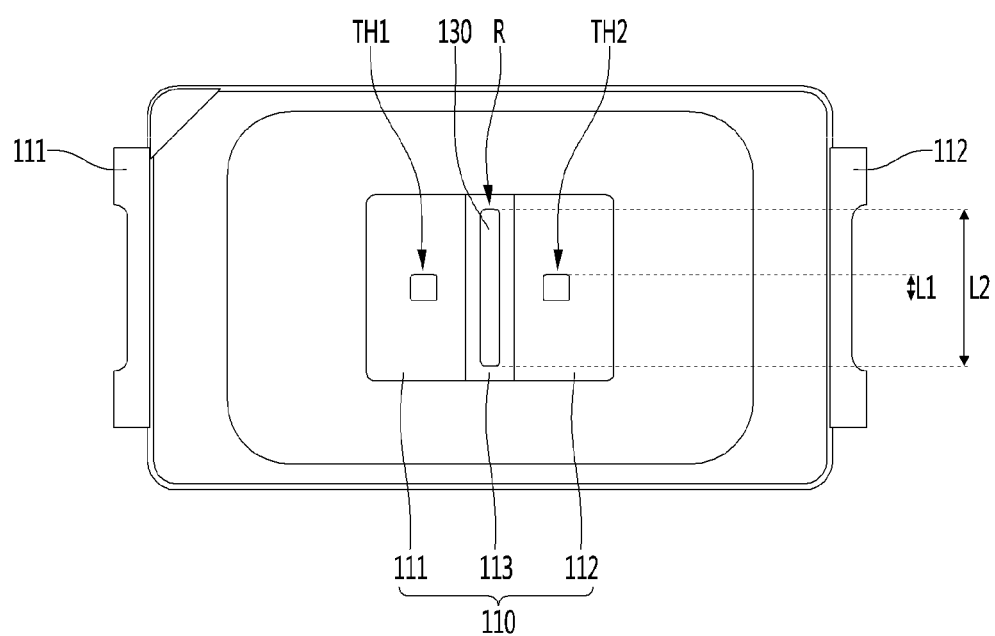
FIGS. 4 to 8 are views explaining a manufacturing method of a light emitting device package according to an embodiment of the present invention.

First, according to the manufacturing method of the light emitting device package according to an embodiment of the present invention, as shown in FIG. 4, a package body 110 may be provided.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112.

The body 113 may be disposed on the first frame 111. In addition, the body 113 may be disposed on the second frame 112.

The body 113 may provide an inclined surface disposed on the first frame 111 and the second frame 112. A cavity C may be provided on the first frame 111 and the second frame 112 by the inclined surface of the body 113.

In addition, the first frame 111 may comprise the first opening TH1. The second frame 112 may comprise the second opening TH2.

The first opening TH1 may be provided at the first frame 111. The first opening TH1 may be provided by passing through the first frame 111. The first opening TH1 may be provided by passing through an upper surface and a lower surface of the first frame 111 in a first direction.

The second opening TH2 may be provided at the second frame 112. The second opening TH2 may be provided by passing through the second frame 112. The second opening TH2 may be provided by passing through an upper surface and a lower surface of the second frame 112 in a first direction.

The package body 110 may comprise a recess R provided in the body 113.

The recess R may be provided at the body 113. The recess R may be provided between the first opening TH1 and the second opening TH2. The recess R may be provided to concave from the upper surface of the body 113 toward the lower surface thereof.

According to an embodiment, a length L2 of the recess R may be greater than a length L1 of the first opening TH1 or a length L1 of the second opening TH2.

Next, in the manufacturing method of the light emitting device package according to the embodiment, an adhesive 130 may be provided at the recess R as shown in FIG. 4.

The adhesive 130 may be provided at a recess region through a dotting method or the like. For example, the adhesive 130 may be provided at a predetermined amount to a region in which the recess R is formed, and may be provided to overflow the recess R.

In addition, according to the embodiment, as shown in FIG. 4, the length L2 of the recess R may be larger than the length L1 of the second opening TH2. The length L1 of the second opening TH2 may be smaller than a length of the light emitting device 120 in a short axis direction. In addition, the length L2 of the recess R may be greater than the length of the light emitting device 120 in the short axis direction.

In the light emitting device package manufacturing process according to an embodiment, when an amount of the adhesive 130 provided under the light emitting device 120 is large, an overflowing portion of the adhesive 130 provided at the recess R while being adhered to the lower portion of the light emitting device 120 may be moved in a length L2 direction of the recess R. Accordingly, even when an amount of the adhesive 130 is applied to be greater than that of the design, the light emitting device 120 may be stably fixed without being lifted from the body 113.

Figure 5:
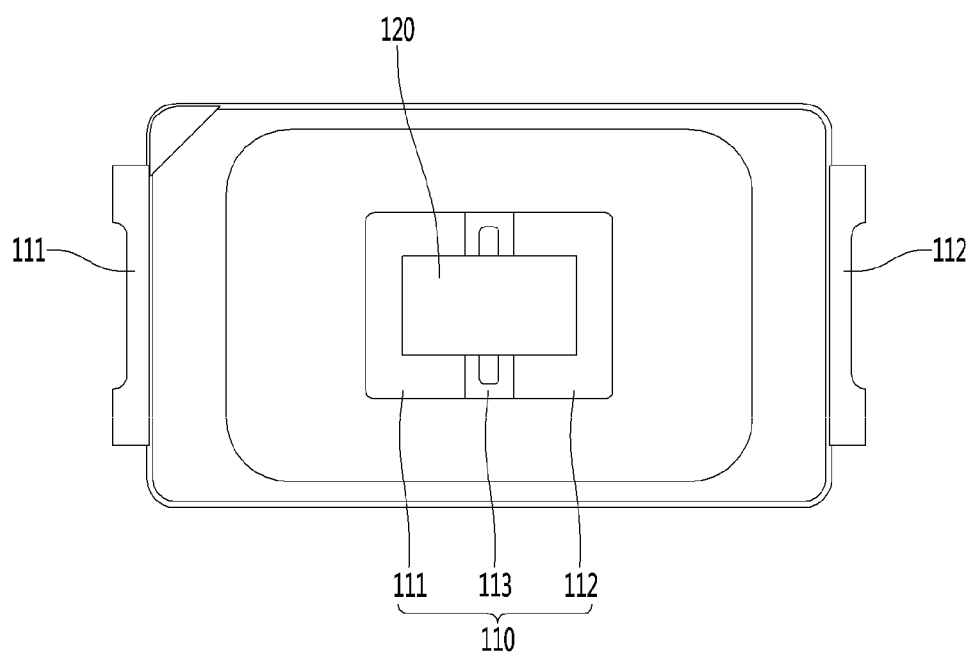

In addition, according to the manufacturing method of the light emitting device package according to an embodiment, as shown in FIG. 5, the light emitting device 120 may be provided on the package body 110.

According to the embodiment, in the process of disposing the light emitting device 120 on the package body 110, the recess R may also be used to function as a kind of align key.

The light emitting device 120 may be fixed at the body 113 by the adhesive 130. A part of the adhesive 130 provided at the recess R may be moved in a direction of the first pad electrode 121 and the second pad electrode 122 of the light emitting device 120 and may be cured.

Accordingly, the adhesive 130 may be provided at a wide region between the lower surface of the light emitting device 120 and the upper surface of the body 113, and the fixing force between the light emitting device 120 and the body 113 may be improved.

According to the embodiment, as described above referring to FIG. 3, the first opening TH1 may be disposed under the first pad electrode 121 of the light emitting device 120. The first opening TH1 may be provided to be overlapped with the first pad electrode 121 of the light emitting device 120. The first opening TH1 may be provided to be overlapped with the first pad electrode 121 of the light emitting device 120 in the first direction from the upper surface of the first frame 111 toward the lower surface thereof.

The second opening TH2 may be disposed under the second pad electrode 122 of the light emitting device 120. The second opening TH2 may be provided to be overlapped with the second pad electrode 122 of the light emitting device 120. The second opening TH2 may be provided to be overlapped with the second pad electrode 122 of the light emitting device 120 in the first direction from the upper surface of the second frame 112 toward the lower surface thereof.

Figure 6:
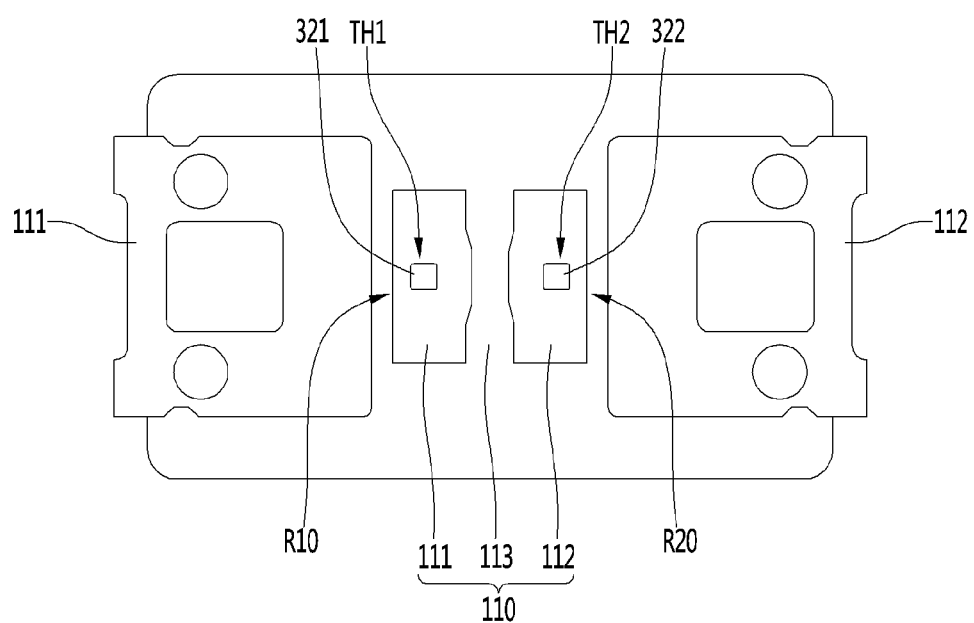

Next, according to the manufacturing method of the light emitting device package according to an embodiment, as shown in FIG. 6, the first conductive layer 321 and the second conductive layer 322 may be formed.

In the light emitting device package 100 according to the embodiment, as shown in FIGS. 3 and 6, the lower surface of the first pad electrode 121 may be exposed through the first opening TH1. In addition, the lower surface of the second pad electrode 122 may be exposed through the second opening TH2.

According to the embodiment, the first conductive layer 321 may be formed at the first opening TH1. In addition, the second conductive layer 322 may be formed at the second opening TH2.

The first conductive layer 321 may be provided at the first opening TH1. The first conductive layer 321 may be disposed under the first pad electrode 121. A width of the first conductive layer 321 may be provided to be greater than that of the first pad electrode 121. The first conductive layer 321 may be disposed in direct contact with the lower surface of the first pad electrode 121. The first conductive layer 321 may be electrically connected to the first pad electrode 121. The first conductive layer 321 may be disposed to be surrounded by the first frame 111.

As shown in FIG. 3, in the upper region of the first opening TH1, an upper portion of the first conductive layer 321 may be disposed at the periphery of a lower portion of the first pad electrode 121. The upper surface of the first conductive layer 321 may be disposed to be higher than the lower surface of the first pad electrode 121.

The second conductive layer 322 may be provided at the second opening TH2. The second conductive layer 322 may be disposed under the second pad electrode 122. A width of the second conductive layer 322 may be provided to be greater than that of the second pad electrode 122. The second conductive layer 322 may be disposed in direct contact with the lower surface of the second pad electrode 122. The second conductive layer 322 may be electrically connected to the second pad electrode 122. The second conductive layer 322 may be disposed to be surrounded by the second frame 112.

As shown in FIG. 3, in the upper region of the second opening TH2, an upper portion of the second conductive layer 322 may be disposed at the periphery of a lower portion of the second pad electrode 122. The upper surface of the second conductive layer 322 may be disposed to be higher than the lower surface of the second pad electrode 122.

As an example, the first conductive layer 321 and the second conductive layer 322 may also be formed by using a conductive paste. The first conductive layer 321 and the second conductive layer 322 may be formed by a solder paste, a silver paste, or the like.

Figure 7:
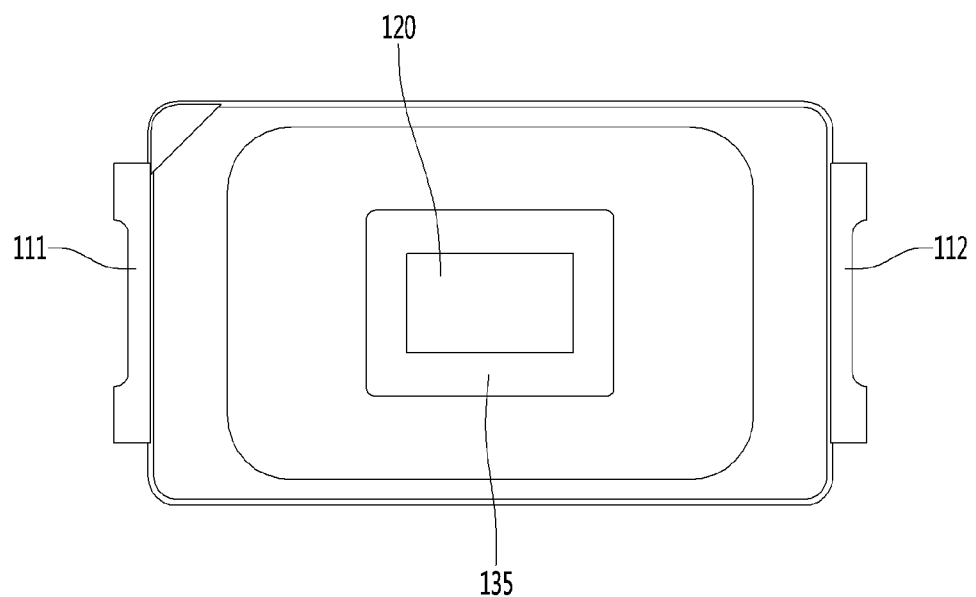

In addition, according to the manufacturing method of the light emitting device package according to an embodiment, as shown in FIG. 7, a resin portion 135 may be formed.

The resin portion 135, as described above referring to FIG. 3, may be disposed between the first frame 111 and the light emitting device 120. The resin portion 135 may be disposed between the second frame 112 and the light emitting device 120.

The resin portion 135 may be disposed on the side surface of the first pad electrode 121. The resin portion 135 may be disposed on the side surface of the second pad electrode 122. The resin portion 135 may be disposed under the semiconductor structure 123.

As an example, the resin portion 135 may comprise at least one of an epoxy-based material, a silicone-based material, and a hybrid material comprising an epoxy-based material and a silicone-based material. In addition, the resin portion 135 may be a reflective part that reflects light emitted from the light emitting device 120, as an example, a resin containing a reflective material such as TiO$_2$. The resin portion 135 may comprise white silicone.

The resin portion 135 may be disposed under the light emitting device 120 to perform a sealing function. In addition, the resin portion 135 may improve adhesion force between the light emitting device 120 and the first frame 111. In addition, the resin portion 135 may improve adhesion force between the light emitting device 120 and the second frame 112.

In addition, when the resin portion 135 comprises a material having a reflective property such as white silicone, the resin portion 135 may reflect light emitted from the light emitting device 120 toward an upper direction of the package body 110, thereby improving the light extraction efficiency of the light emitting device package 100.

Figure 8:
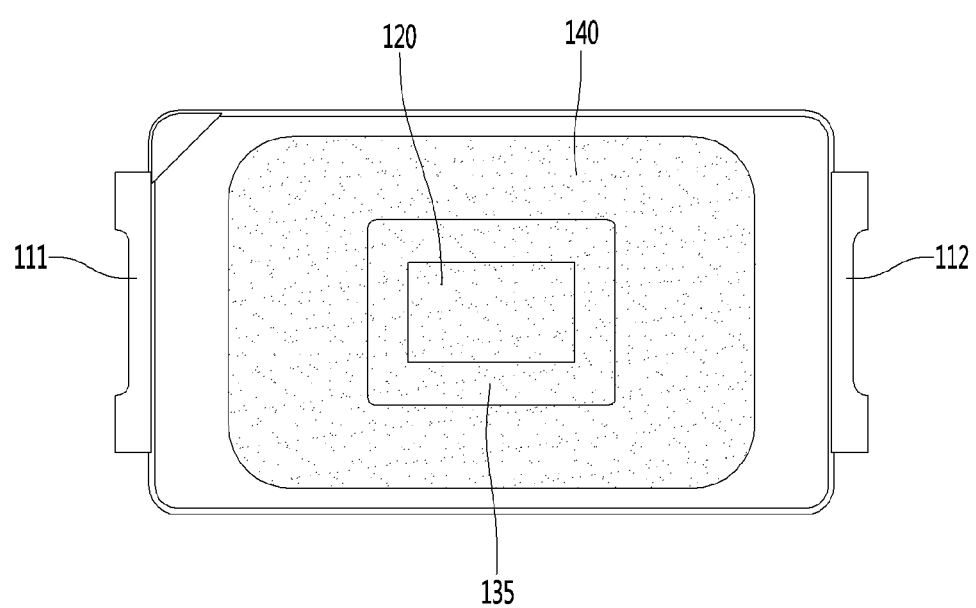

Next, according to the manufacturing method of the light emitting device package according to an embodiment, as shown in FIG. 8, the molding part 140 may be provided on the light emitting device 120.

The molding part 140 may be provided on the light emitting device 120. The molding part 140 may be disposed on the first frame 111 and the second frame 112. The molding part 140 may be disposed at the cavity C provided by the package body 110. The molding part 140 may be disposed on the resin portion 135.

The molding part 140 may comprise an insulating material. In addition, the molding part 140 may comprise wavelength converting means configured to be incident light emitted from the light emitting device 120 and provide wavelength converted light. As an example, the molding part 140 may comprise at least one selected from the group consisting of a phosphor, a quantum dot, and the like.

Meanwhile, in the above description, as shown in FIG. 6, first, the case in which the first conductive layer 321 and the second conductive layer 322 are formed is described, and then as shown in FIGS. 7 and 8, the case in which the resin portion 135 and the molding part 140 are formed has been described.

However, according to another example of the manufacturing method of the light emitting device package according to the embodiment, the resin portion 135 and the molding part 140 may be formed first, and the first conductive layer 321 and the second conductive layer 322 may be formed later.

According to another example of the manufacturing method of the light emitting device package according to the embodiment, the resin portion 135 may not be formed and only the molding part 140 may be formed at the cavity of the package body 110.

In the light emitting device package 100 according to the embodiment, power may be connected to the first pad electrode 121 through the region of the first opening TH1, and power may be connected to the second pad electrode 122 through the region of the second opening TH2.

Accordingly, the light emitting device 120 may be driven by the driving power supplied through the first pad electrode 121 and the second pad electrode 122. In addition, the light emitted from the light emitting device 120 may be provided in the upper direction of the package body 110.

Meanwhile, the light emitting device package 100 according to an embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between the frame and the light emitting device provided in the light emitting device package, so that stability of electrical connection and physical coupling may be weakened. Accordingly, a position of the light emitting device may be changed, and the optical and electrical characteristics and reliability of the light emitting device package may be deteriorated.

However, according to the light emitting device package and a manufacturing method of the light emitting device package according to an embodiment, the first electrode and the second electrode of the light emitting device according to the embodiment may be provided with driving power by the conductive layers disposed in the openings. In addition, the melting point of the conductive layers disposed in the openings may be selected so as to have a higher value than that of the general bonding material.

Therefore, since the light emitting device package 100 according to the embodiment does not cause a re-melting phenomenon even when the light emitting device package 100 is bonded to the main substrate by a reflow process, the electrical connection and the physical bonding force may not be deteriorated.

In addition, according to the light emitting device package 100 and the manufacturing method of the light emitting device package according to an embodiment, the package body 110 does not need to be exposed to a high temperature in the manufacturing process of the light emitting device package. Therefore, according to an embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphthalamide (PPA) resin, polycyclohexylenedimethylene terephthalate (PCT) resin, epoxy molding compound (EMC) resin, and silicone molding compound (SMC) resin.

In addition, according to an embodiment, a sum of areas of the first and second pad electrodes 121 and 122 may be provided at 10% or less based on an area of an upper surface of the substrate 124. According to the light emitting device package according to the embodiment, the sum of the areas of the first and second pad electrodes 121 and 122 may be set at 10% or less based on the area of the upper surface of the substrate 124 in order to secure a light emitting area emitted from the light emitting device and increase light extraction efficiency.

In addition, according to an embodiment, the sum of the areas of the first and second pad electrodes 121 and 122 may be provided at 0.7% or more based on the area of the upper surface of the substrate 124. According to the light emitting device package according to an embodiment, the sum of the areas of the first and second pad electrodes 121 and 122 may be set at 0.7% or more based on the area of the upper surface of the substrate 124 in order to provide a stable bonding force to the light emitting device to be mounted.

According to the embodiment, an area where the adhesive 130 is overlapped with the light emitting device 120 based on the first direction may be provided to be larger than that of a region where the first and second openings TH1 and TH2 are overlapped with the first and second pad electrodes 121 and 122.

As described above, as the area of the first and second pad electrodes 121 and 122 is provided to be small, an amount of light transmitted to the lower surface of the light emitting device 120 may be increased. In addition, the adhesive 130 having a good reflection characteristic may be provided under the light emitting device 120. Therefore, the light emitted in a downwards direction of the light emitting device 120 is reflected at the adhesive 130, and is effectively emitted toward an upper direction of the light emitting device package 100, so that the light extraction efficiency may be improved.

Meanwhile, the light emitting device package according to the embodiment described above may comprise various modifications.

First, an example of modifications of the body applied to the light emitting device package according to an embodiment will be described with reference to FIGS. 9 to 17. In describing the light emitting device package according to the embodiment with reference to FIGS. 9 to 17, the description of the contents overlapping with the contents described with reference to FIGS. 1 to 8 may be omitted.

Figure 9:
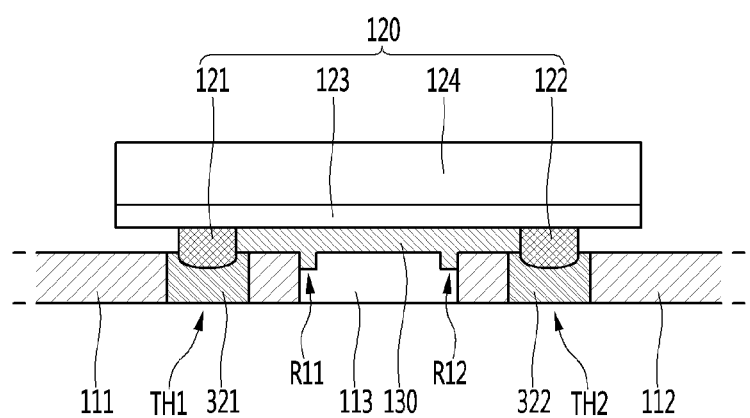
FIGS. 9 to 11 are views explaining a modified example of the body applied to the light emitting device package shown in FIG. 3.
Figure 10:
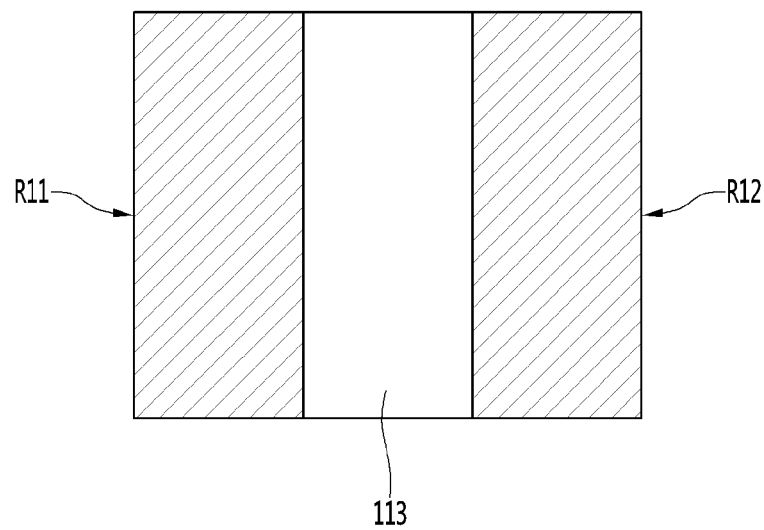
Figure 11:
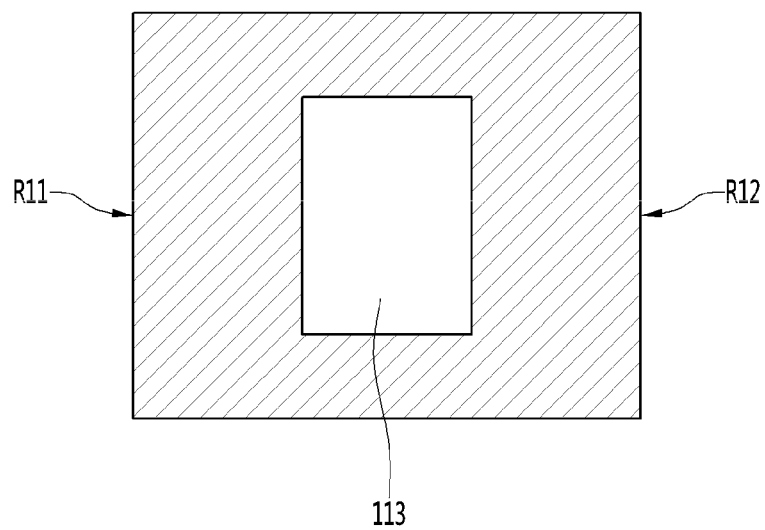

FIGS. 9 to 11 are views explaining a modified example of the body applied to the light emitting device package shown in FIG. 3.

According to the light emitting device package 100 according to an embodiment, as shown in FIG. 9, the body 113 may comprise at least two recesses provided at the upper surface thereof.

As an example, the body 113 may comprise a first recess R11 disposed at the first frame 111 side from a central region of the upper surface thereof. The first recess R11 may be provided in contact with an end portion of the first frame 111.

In addition, the body 113 may comprise a second recess R12 disposed at the second frame 112 side from a central region of the upper surface thereof. The second recess R12 may be provided in contact with an end portion of the second frame 112.

The first recess R11 may be provided to concave downward from the upper surface of the body 113 and the upper surface of the first frame 111. The second recess R12 may be provided to concave downward from the upper surface of the body 113 and the upper surface of the second frame 112.

According to the light emitting device package 100 according to the embodiment, the adhesive 130 may be provided to the first recess Ru and the second recess R12. The adhesive 130 may be disposed between the light emitting device 120 and the body 113. The adhesive 130 may be disposed between the first pad electrode 121 and the second pad electrode 122. For example, the adhesive 130 may be disposed in contact with a side surface of the first pad electrode 121 and a side surface of the second pad electrode 122.

The first recess R11 and the second recess R12 may provide a proper space in which a kind of under-filling process may be performed under the light emitting device 120.

The first recess Ru and the second recess R12 may be provided at a first depth or more so that the adhesive 130 may be sufficiently provided between the lower surface of the light emitting device 120 and the upper surface of the body 113. In addition, the first recess R11 and the second recess R12 may be provided at a second depth or less to provide a stable strength of the body 113.

The adhesive 130 may provide a stable fixing force between the light emitting device 120 and the package body 110. The adhesive 130 may provide a stable fixing force between the light emitting device 120 and the body 113. The adhesive 130 may be disposed, as an example, in direct contact with the upper surface of the body 113. In addition, the adhesive 130 may be disposed in direct contact with the lower surface of the light emitting device 120.

In addition, the first recess R11 and the adhesive 130 may prevent the first conductive layer 321 provided at the first opening TH1 from being moved to a lower region of the light emitting device 120. In addition, the second recess R12 and the adhesive 130 may prevent the second conductive layer 322 provided at the second opening TH2 from being moved to the lower region of the light emitting device 120. Accordingly, it is possible to prevent the light emitting device 120 from being electrically short-circuited or degraded by a movement of the first conductive layer 321 or a movement of the second conductive layer 322.

Meanwhile, FIG. 9 shows cross-sectional view of the body 113 applied to the light emitting device package according to an embodiment, and FIGS. 10 and 11 show plan views of the body 113 shown in FIG. 9.

For example, as shown in FIG. 10, the first recess Ru and the second recess R12 may be spaced apart from each other with a central region of the body 113 interposed therebetween. The first recess R11 and the second recess R12 may be disposed in parallel to each other with the central region of the body 113 interposed therebetween.

In addition, as shown in FIG. 11, the first recess R11 and the second recess R12 may be spaced apart from each other with the central region of the body 113 interposed therebetween. Meanwhile, the first recess R11 and the second recess R12 may be disposed to be connected to each other in a closed loop shape around the central region of the body 113.

Figure 12:
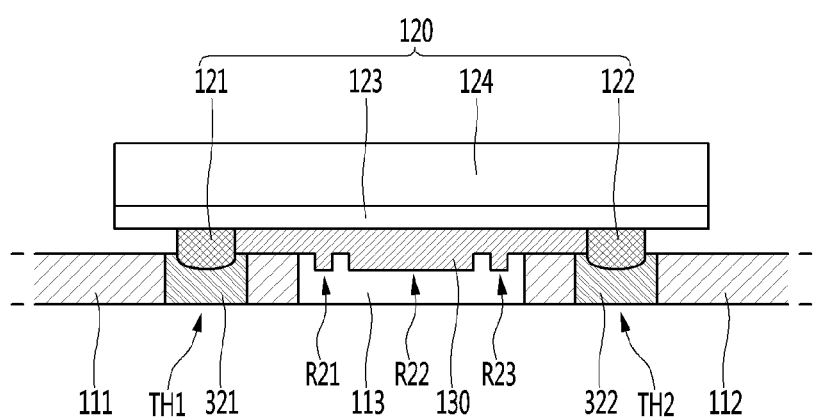
FIGS. 12 to 14 are views explaining another modified example of the body applied to the light emitting device package shown in FIG. 3.
Figure 13:
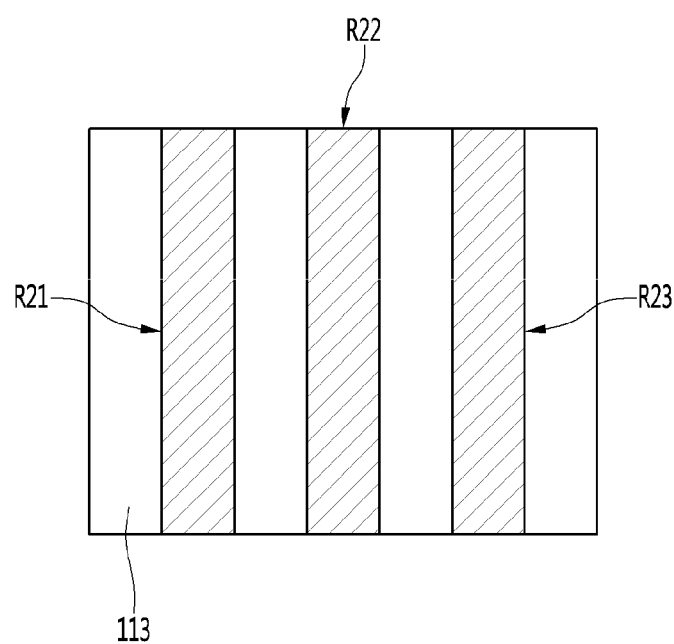
Figure 14:
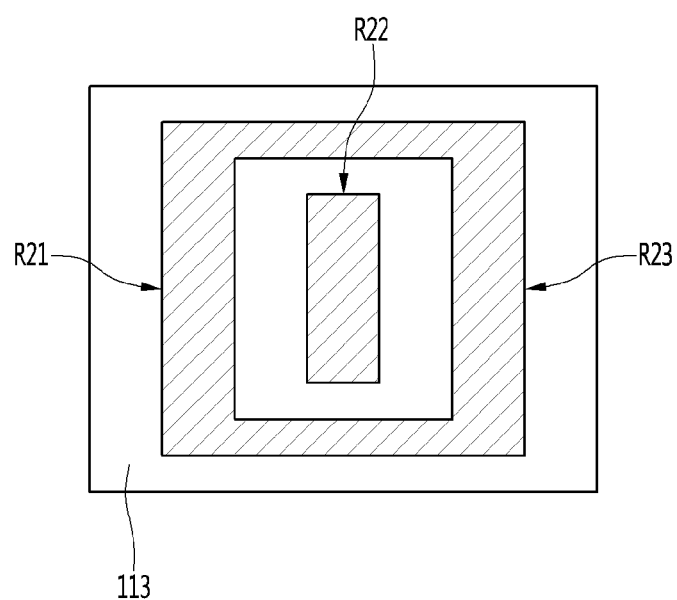

Meanwhile, FIGS. 12 to 14 are views explaining another modified example of the body applied to a light emitting device package shown in FIG. 3.

According to a light emitting device package 100 according to an embodiment, as shown in FIG. 12, the body 113 may comprise at least three recesses provided on the upper surface thereof.

As an example, the body 113 may comprise a first recess R21 disposed on the first frame 111 side from a central region of the upper surface thereof. The first recess R21 may be provided to concave in a lower surface direction from the upper surface of the body 113.

In addition, the body 113 may comprise a third recess R23 disposed at the second frame 112 side from the central region of the upper surface thereof. The third recess R23 may be provided to concave in the lower surface direction from the upper surface of the body 113.

In addition, the body 113 may comprise a second recess R22 disposed at the central region of the upper surface thereof. The second recess R22 may be provided to concave in the lower surface direction from the upper surface of the body 113. The second recess R22 may be disposed between the first recess R21 and the third recess R23.

According to the light emitting device package 100 according to the embodiment, the adhesive 130 may be provided in the first recess R21, the second recess R22, and the third recess R23. The adhesive 130 may be disposed between the light emitting device 120 and the body 113. The adhesive 130 may be disposed between the first pad electrode 121 and the second pad electrode 122. For example, the adhesive 130 may be disposed in contact with a side surface of the first pad electrode 121 and a side surface of the second pad electrode 122.

The first recess R21, the second recess R22, and the third recess R23 may provide a proper space in which a kind of under-filling process may be performed under the light emitting device 120 in order to attach the light emitting device 120 to the package body.

The first recess R21, the second recess R22, and the third recess R23 may be provided at a first depth or more so that the adhesive 130 may be sufficiently provided between the lower surface of the light emitting device 120 and the upper surface of the body 113. In addition, the first recess R21, the second recess R22, and the third recess R23 may be provided at a second depth or less to provide a stable strength of the body 113.

The adhesive 130 may provide a stable fixing force between the light emitting device 120 and the package body 110. The adhesive 130 may provide a stable fixing force between the light emitting device 120 and the body 113. The adhesive 130 may be disposed, as an example, in direct contact with the upper surface of the body 113. In addition, the adhesive 130 may be disposed in direct contact with the lower surface of the light emitting device 120.

In addition, the first recess R11 and the adhesive 130 may prevent the first conductive layer 321 provided at the first opening TH1 from being moved to a lower region of the light emitting device 120. In addition, the second recess R12 and the adhesive 130 may prevent the second conductive layer 322 provided at the second opening TH2 from being moved to the lower region of the light emitting device 120. Accordingly, it is possible to prevent the light emitting device 120 from being electrically short-circuited or degraded by a movement of the first conductive layer 321 or a movement of the second conductive layer 322.

Meanwhile, FIG. 12 shows cross-sectional view of the body 113 applied to the light emitting device package according to an embodiment, and FIGS. 13 and 14 show plan views of the body 113 shown in FIG. 12.

For example, as shown in FIG. 13, the first recess R21, the second recess R22, and the third recess R23 may be spaced apart from each other on the upper surface of the body 113 and disposed in parallel in one direction. The first recess R21, the second recess R22, and the third recess R23 may be disposed to extend in one direction on the upper surface of the body 113.

In addition, as shown in FIG. 14, the first recess R21 and the third recess R23 may be spaced apart from each other with the central region of the body 113 interposed therebetween. Meanwhile, the first recess R21 and the third recess R23 may be disposed to be connected to each other in a closed loop shape around the central region of the body 113. In addition, the second recess R22 may be disposed in the central region of the body 113. The second recess R22 may be disposed in a space surrounded by the first recess R21 and the third recess R23.

Figure 15:
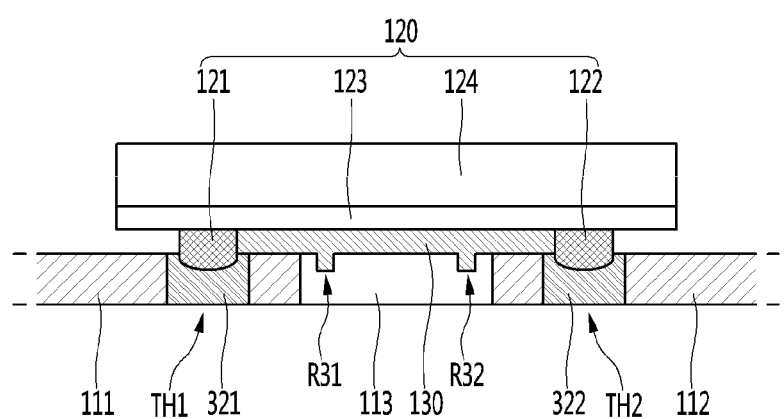
FIGS. 15 to 17 are views explaining still another modified example of the body applied to the light emitting device package shown in FIG. 3.
Figure 16:
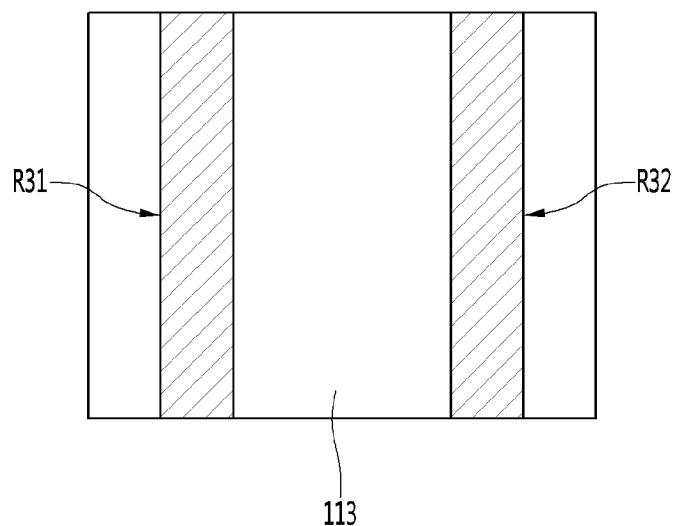
Figure 17:
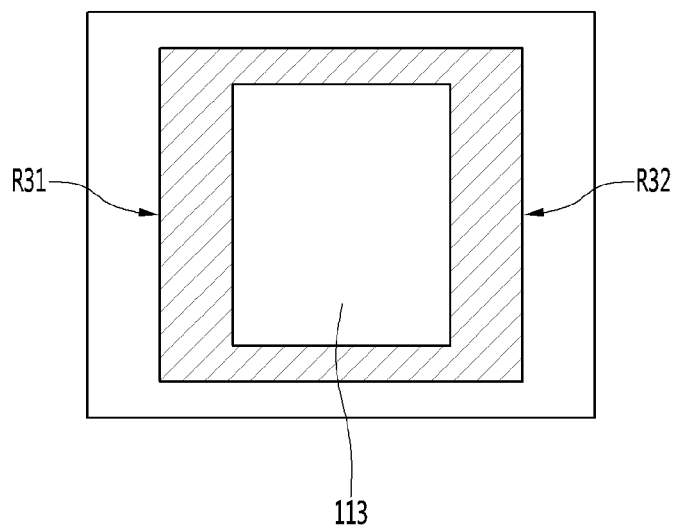

Meanwhile, FIGS. 15 to 17 are views explaining still another modified example of the body applied to the light emitting device package shown in FIG. 3.

According to a light emitting device package 100 according to an embodiment, as shown in FIG. 15, the body 113 may comprise at least two recesses provided on the upper surface thereof.

As an example, the body 113 may comprise a first recess R31 disposed on the first frame 111 side from a central region of the upper surface thereof. The first recess R31 may be provided to concave in a lower surface direction from the upper surface of the body 113. The first recess R31 may be disposed to be spaced apart from an end portion of the first frame 111.

In addition, the body 113 may comprise a second recess R32 disposed at the second frame 112 side from the central region of the upper surface thereof. The second recess R32 may be provided to concave in the lower surface direction from the upper surface of the body 113. The second recess R32 may be disposed to be spaced apart from an end portion of the second frame 112.

According to the light emitting device package 100 according to the embodiment, the adhesive 130 may be provided in the first recess R31 and the second recess R32. The adhesive 130 may be disposed between the light emitting device 120 and the body 113. The adhesive 130 may be disposed between the first pad electrode 121 and the second pad electrode 122. For example, the adhesive 130 may be disposed in contact with a side surface of the first pad electrode 121 and a side surface of the second pad electrode 122.

The first recess R31 and the second recess R32 may provide a proper space in which a kind of under-filling process may be performed under the light emitting device 120.

The first recess R31 and the second recess R32 may be provided at a first depth or more so that the adhesive 130 may be sufficiently provided between the lower surface of the light emitting device 120 and the upper surface of the body 113. In addition, the first recess R31 and the second recess R32 may be provided at a second depth or less to provide a stable strength of the body 113.

The adhesive 130 may provide a stable fixing force between the light emitting device 120 and the package body 110. The adhesive 130 may provide a stable fixing force between the light emitting device 120 and the body 113. The adhesive 130 may be disposed, as an example, in direct contact with the upper surface of the body 113. In addition, the adhesive 130 may be disposed in direct contact with the lower surface of the light emitting device 120.

In addition, the first recess R31 and the adhesive 130 may prevent the first conductive layer 321 provided at the first opening TH1 from being moved to a lower region of the light emitting device 120. In addition, the second recess R32 and the adhesive 130 may prevent the second conductive layer 322 provided at the second opening TH2 from being moved to the lower region of the light emitting device 120. Accordingly, it is possible to prevent the light emitting device 120 from being electrically short-circuited or degraded by a movement of the first conductive layer 321 or a movement of the second conductive layer 322.

Meanwhile, FIG. 15 shows cross-sectional view of the body 113 applied to the light emitting device package according to an embodiment, and FIGS. 16 and 17 show plan views of the body 113 shown in FIG. 15.

For example, as shown in FIG. 16, the first recess R31 and the second recess R32 may be spaced apart from each other on the upper surface of the body 113 and disposed in parallel in one direction. The first recess R31 and the second recess R32 may be disposed to extend in one direction on the upper surface of the body 113.

In addition, as shown in FIG. 17, the first recess R31 and the second recess R32 may be spaced apart from each other with the central region of the body 113 interposed therebetween. Meanwhile, the first recess R31 and the second recess R32 may be disposed to be connected to each other in a closed loop shape around the central region of the body 113.

Next, another example of a light emitting device package according to an embodiment of the present invention will be described with reference to FIGS. 18 and 19.

Figure 18:
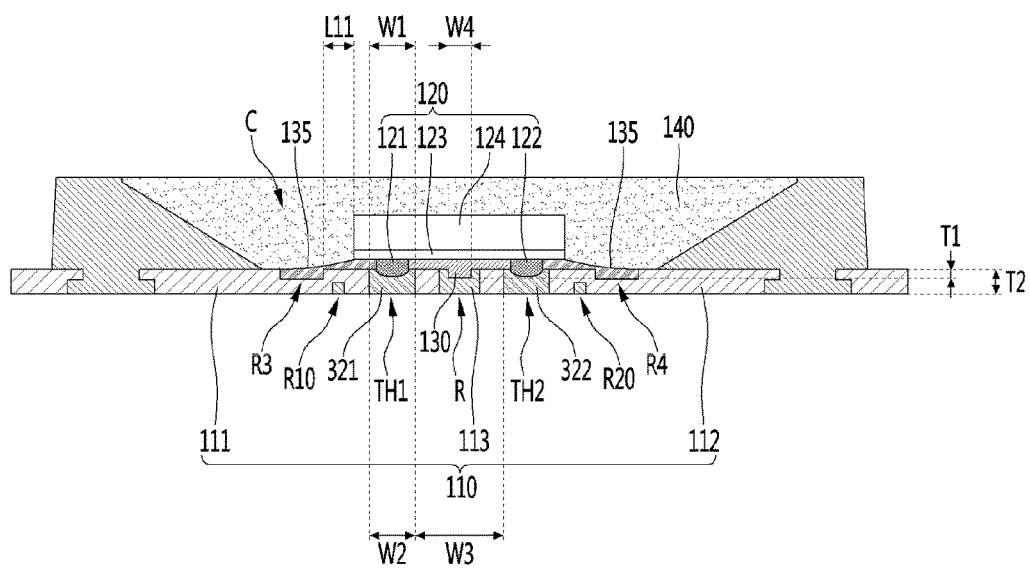
FIG. 18 is a view illustrating another example of a light emitting device package according to an embodiment of the present invention.
Figure 19:
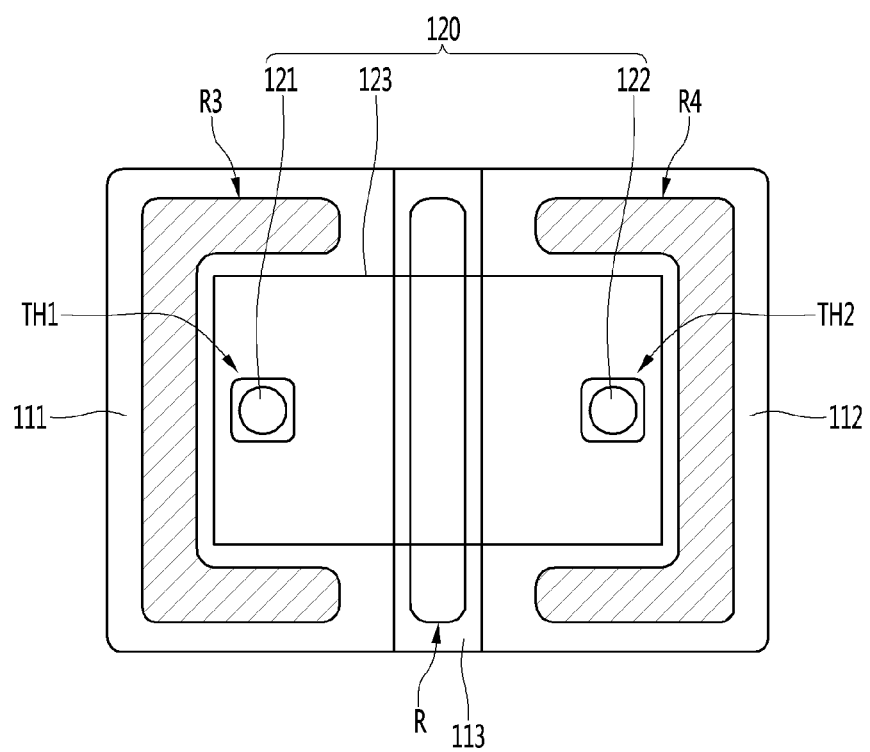
FIG. 19 is a view explaining the arrangement relationship of the first frame, the second frame, and the body applied to the light emitting device package shown in FIG. 18.

FIG. 18 is a view illustrating another example of a light emitting device package according to an embodiment of the present invention, and FIG. 19 is a view explaining the arrangement relationship of the first frame, the second frame, and the body applied to the light emitting device package shown in FIG. 18.

In describing the light emitting device package according to the embodiment with reference to FIGS. 18 and 19, the description of the contents overlapping with the contents described with reference to FIGS. 1 to 17 may be omitted.

The light emitting device package 100 according to an embodiment may comprise a package body 110 and a light emitting device 120, as shown in FIGS. 18 and 19.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112. The body 113 may perform a function as a kind of electrode separation line.

The first frame 111 and the second frame 112 may be provided as an insulating frame. The first frame 111 and the second frame 112 may stably provide a structural strength of the package body 110.

In addition, the first frame 111 and the second frame 112 may be provided as a conductive frame. The first frame 111 and the second frame 112 may stably provide the structural strength of the package body 110 and may be electrically connected to the light emitting device 120.

A difference between the case of forming the first frame 111 and the second frame 112 as the insulating frame and the case of forming the first frame 111 and the second frame 112 as the conductive frame will be described later.

For example, the body 113 may be formed of at least one selected from the group consisting of polyphthalamide (PPA), polychloro tri phenyl (PCT), liquid crystal polymer (LCP), polyamide 9T (PA9T), silicone, epoxy molding compound (EMC), silicone molding compound (SMC), ceramic, photo sensitive glass (PSG), sapphire ($Al_2O_3$), and the like. In addition, the body 113 may comprise a high refractive index filler such as $TiO_2$ and $SiO_2$.

According to the embodiment, the light emitting device 120 may comprise a first pad electrode 121, a second pad electrode 122, a semiconductor structure 123, and a substrate 124.

The light emitting device 120 may comprise the semiconductor structure 123 disposed under the substrate 124, as shown in FIG. 18. The first pad electrode 121 and the second pad electrode 122 may be disposed between the semiconductor structure 123 and the body 113.

The light emitting device 120 may be disposed on the package body 110. The light emitting device 120 may be disposed on the first frame 111 and the second frame 112. The light emitting device 120 may be disposed in the cavity C provided by the package body 110.

The first pad electrode 121 may be disposed on a lower surface of the light emitting device 120. The second pad electrode 122 may be disposed on the lower surface of the light emitting device 120. The first pad electrode 121 and the second pad electrode 122 may be disposed to be spaced apart from each other on the lower surface of the light emitting device 120.

The first pad electrode 121 may be disposed on the first frame 111. The second pad electrode 122 may be disposed on the second frame 112.

The first pad electrode 121 may be disposed between the semiconductor structure 123 and the first frame 111. The second pad electrode 122 may be disposed between the semiconductor structure 123 and the second frame 112.

Meanwhile, the light emitting device package according to the embodiment may comprise a first opening TH1 and a second opening TH2, as shown in FIGS. 18 and 19. The first frame 111 may comprise the first opening TH1. The second frame 112 may comprise the second opening TH2.

The first opening TH1 may be provided at the first frame 111. The first opening TH1 may be provided by passing through the first frame 111. The first opening TH1 may be provided by passing through an upper surface and a lower surface of the first frame 111 in a first direction.

The first opening TH1 may be disposed under the first pad electrode 121 of the light emitting device 120. The first opening TH1 may be provided to be overlapped with the first pad electrode 121 of the light emitting device 120. The first opening TH1 may be provided to be overlapped with the first pad electrode 121 of the light emitting device 120 in the first direction from the upper surface of the first frame 111 toward the lower surface thereof.

The second opening TH2 may be provided at the second frame 112. The second opening TH2 may be provided by passing through the second frame 112. The second opening TH2 may be provided by passing through an upper surface and a lower surface of the second frame 112 in a first direction.

The second opening TH2 may be disposed under the second pad electrode 122 of the light emitting device 120. The second opening TH2 may be provided to be overlapped with the second pad electrode 122 of the light emitting device 120. The second opening TH2 may be provided to be overlapped with the second pad electrode 122 of the light emitting device 120 in the first direction from the upper surface of the second frame 112 toward the lower surface thereof.

The first opening TH1 and the second opening TH2 may be disposed to be spaced apart from each other. The first opening TH1 and the second opening TH2 may be disposed to be spaced apart from each other under the lower surface of the light emitting device 120.

According to the embodiment, a width W1 of an upper region of the first opening TH1 may be greater than that of the first pad electrode 121. In addition, a width of an upper region of the second opening TH2 may be greater than that of the second pad electrode 122.

According to the embodiment, a lower portion of the first pad electrode 121 may be disposed in the upper region of the first opening TH1. A bottom surface of the first pad electrode 121 may be disposed lower than the upper surface of the first frame 111.

In addition, a lower portion of the second pad electrode 122 may be disposed in the upper region of the second opening TH2. A bottom surface of the second pad electrode 122 may be disposed lower than the upper surface of the second frame 112.

In addition, the light emitting device package according to the embodiment may comprise an adhesive 130.

The adhesive 130 may be disposed between the body 113 and the light emitting device 120. The adhesive 130 may be disposed between an upper surface of the body 113 and a lower surface of the light emitting device 120.

In addition, the light emitting device package according to the embodiment may comprise a recess R, as shown in FIGS. 18 and 19.

The recess R may be provided at the body 113. The recess R may be provided between the first opening TH1 and the second opening TH2. The recess R may be provided to concave from the upper surface of the body 113 toward the lower surface thereof. The recess R may be disposed under the light emitting device 120. The recess R may be provided to be overlapped with the light emitting device 120 in the first direction.

As an example, the adhesive 130 may be disposed in the recess R. The adhesive 130 may be disposed between the light emitting device 120 and the body 113. The adhesive 130 may be disposed between the first pad electrode 121 and the second pad electrode 122. As an example, the adhesive 130 may be disposed in contact with a side surface of the first pad electrode 121 and a side surface of the second pad electrode 122.

The adhesive 130 may provide a stable fixing force between the light emitting device 120 and the package body 110. The adhesive 130 may provide a stable fixing force between the light emitting device 120 and the body 113. The adhesive 130 may be disposed, as an example, in direct contact with the upper surface of the body 113. In addition, the adhesive 130 may be disposed in direct contact with the lower surface of the light emitting device 120.

As an example, the adhesive 130 may comprise at least one of an epoxy-based material, a silicone-based material, and a hybrid material comprising an epoxy-based material and a silicone-based material. As an example, the adhesive 130 may comprise a white silicone. The adhesive 130 may be referred to as a first resin as another representation.

The adhesive 130 may provide a stable fixing force between the body 113 and the light emitting device 120. When light is emitted to the lower surface of the light emitting device 120, the adhesive 130 may provide a light diffusion function between the light emitting device 120 and the body 113. When the light is emitted from the light emitting device 120 to the lower surface of the light emitting device 120, the adhesive 130 may improve the light extraction efficiency of the light emitting device package 100 by providing the light diffusion function.

The recess R may provide a proper space in which a kind of under-filling process may be performed under the light emitting device 120. The recess R may be provided at a first depth or more so that the adhesive 130 may be sufficiently provided between the lower surface of the light emitting device 120 and the upper surface of the body 113. In addition, the recesses R may be provided at a second depth or less to provide a stable strength of the body 113.

In addition, the light emitting device package according to an embodiment may comprise a first conductive layer 321 and a second conductive layer 322. The first conductive layer 321 may be disposed to be spaced apart from the second conductive layer 322.

The first conductive layer 321 may be provided at the first opening TH1. The first conductive layer 321 may be disposed under the first pad electrode 121. A width of the first conductive layer 321 may be provided to be greater than that of the first pad electrode 121.

The first pad electrode 121 may have a width of a second direction perpendicular to the first direction in which the first opening TH1 is formed. The width of the first pad electrode 121 may be provided to be smaller than that of the second direction of the first opening TH1.

The first conductive layer 321 may be disposed in direct contact with the lower surface of the first pad electrode 121. The first conductive layer 321 may be electrically connected to the first pad electrode 121. The first conductive layer 321 may be disposed to be surrounded by the first frame 111.

In the upper region of the first opening TH1, an upper portion of the first conductive layer 321 may be disposed at the periphery of a lower portion of the first pad electrode 121. The upper surface of the first conductive layer 321 may be disposed to be higher than the lower surface of the first pad electrode 121.

The second conductive layer 322 may be provided at the second opening TH2. The second conductive layer 322 may be disposed under the second pad electrode 122. A width of the second conductive layer 322 may be provided to be greater than that of the second pad electrode 122.

The second pad electrode 122 may have a width of a second direction perpendicular to the first direction in which the second opening TH2 is formed. The width of the second pad electrode 122 may be provided to be smaller than that of the second direction of the second opening TH2.

The second conductive layer 322 may be disposed in direct contact with the lower surface of the second pad electrode 122. The second conductive layer 322 may be electrically connected to the second pad electrode 122. The second conductive layer 322 may be disposed to be surrounded by the second frame 112.

In the upper region of the second opening TH2, an upper portion of the second conductive layer 322 may be disposed at the periphery of a lower portion of the second pad electrode 122. The upper surface of the second conductive layer 322 may be disposed to be higher than the lower surface of the second pad electrode 122.

The first conductive layer 321 and the second conductive layer 322 may comprise one material selected from the group consisting of Ag, Au, Pt, Sn, Cu or an alloy thereof. However, the present invention is not limited thereto, and a material capable of securing a conductive function may be used in the first conductive layer 321 and the second conductive layer 322.

As an example, the first conductive layer 321 and the second conductive layer 322 may be formed by using a conductive paste. The conductive paste may comprise a solder paste, a silver paste, or the like, and may be composed of multiple layers or a single layer composed of multiple layers or alloys composed of different materials. As an example, the first and second conductive layers 321 and 322 may comprise a SAC (Sn—Ag—Cu) material.

In addition, as shown in FIGS. 18 and 19, the light emitting device package according to the embodiment may comprise a first lower recess R10 and a second lower recess R20. The first lower recess R10 and the second lower recess R20 may be disposed to be spaced apart from each other.

The first lower recess R10 may be provided at the lower surface of the first frame 111. The first lower recess R10 may be provided to concave from the lower surface of the first frame 111 toward the upper surface thereof. The first lower recess R10 may be disposed to be spaced apart from the first opening TH1.

The first lower recess R10 may be provided with a width of several micrometers to several tens of micrometers. A resin portion may be provided at the first lower recess R10. The resin portion filled at the first lower recess R10 may be provided with, as an example, the same material as the body 113.

As an example, the resin portion filled at the first lower recess R10 may be provided in a process in which the first frame 111, the second frame 112, and the body 113 are formed through an injection process or the like.

The resin portion filled at the first lower recess R10, as described above referring to FIG. 2, may be disposed around a lower surface region of the first frame 111 in which the first opening TH1 is provided. The lower surface region of the first frame 111 in which the first opening TH1 is provided may be disposed to be separated from the lower surface forming the first frame 111 therearound in a shape of an island.

As an example, as described above referring to FIG. 2, the lower surface region of the first frame 111 in which the first opening TH1 is provided may be isolated from the first frame 111 therearound by a resin portion filled at the first lower recess R10 and the body 113.

Therefore, it is possible to prevent the first conductive layer 321 provided in the first opening TH1 from being moved from the first opening TH1 and diffused over the resin portion filled at the first lower recess R10 or the body 113.

Since the first conductive layer 321 does not overflow from the first opening TH1 toward a region in which the resin portion or the body 113 is provided, it is possible to prevent the first conductive layer 321 from overflowing or extending an outside of a region in which the resin portion or the body 113 is provided, so that the first conductive layer 321 may be stably disposed in a region in which the first opening TH1 is provided. In addition, the first conductive layer 321 may be stably connected to the lower surface of the first pad electrode 121 in the first opening TH1.

In addition, the second lower recess R20 may be provided at the lower surface of the second frame 112. The second lower recess R20 may be provided to concave from the lower surface of the second frame 112 toward the upper surface thereof. The second lower recess R20 may be disposed to be spaced apart from the second opening TH2.

The second lower recess R20 may be provided with a width of several micrometers to several tens of micrometers. A resin portion may be provided at the second lower recess R20. The resin portion filled at the second lower recess R20 may be provided with, as an example, the same material as the body 113.

As an example, the resin portion filled at the second lower recess R20 may be provided in a process in which the first frame 111, the second frame 112, and the body 113 are formed through an injection process or the like.

The resin portion filled at the second lower recess R20, as described above referring to FIG. 2, may be disposed around a lower surface region of the second frame 112 in which the second opening TH2 is provided. The lower surface region of the second frame 112 in which the second opening TH2 is provided may be disposed to be separated from the lower surface forming the second frame 112 therearound in a shape of an island.

As an example, as described above referring to FIG. 2, the lower surface region of the second frame 112 in which the second opening TH2 is provided may be isolated from the second frame 112 therearound by a resin portion filled at the second lower recess R20 and the body 113.

Therefore, it is possible to prevent the second conductive layer 322 provided in the second opening TH2 from being moved from the second opening TH2 and diffused over the resin portion filled at the second lower recess R20 or the body 113.

Since the second conductive layer 322 does not overflow from the second opening TH2 toward a region in which the resin portion or the body 113 is provided, it is possible to prevent the second conductive layer 322 from overflowing or extending an outside of a region in which the resin portion or the body 113 is provided, so that the second conductive layer 322 may be stably disposed in a region in which the second opening TH2 is provided. In addition, the second conductive layer 322 may be stably connected to the lower surface of the second pad electrode 122 in the second opening TH2.

In addition, the light emitting device package according to the embodiment may comprise a first upper recess R3 and a second upper recess R4, as shown in FIGS. 18 and 19.

The first upper recess R3 may be provided on an upper surface of the first frame 111. The first upper recess R3 may be provided to concave in the lower surface direction from the upper surface of the first frame 111. The first upper recess R3 may be disposed to be spaced apart from the first opening TH1.

The first upper recess R3 may be provided adjacent to the periphery of the first pad electrode 121 when viewed from the upper direction thereof, as shown in FIG. 19. For example, the first upper recess R3 may be provided to the periphery of the first pad electrode 121 in a "[" shape.

According to an embodiment, the first upper recess R3 may be provided so as not to be overlapped with the first lower recess R10 in a vertical direction. When the first upper recess R3 and the first lower recess R10 are overlapped with each other in the vertical direction and a thickness of the first frame 111 disposed therebetween is too thin, a strength of the first frame 111 may be reduced.

According to another embodiment, when a thickness of the first frame 111 is sufficiently provided, the first upper recess R3 and the first lower recess R10 are provided so as to be overlapped with each other in the vertical direction.

The second upper recess R4 may be provided on an upper surface of the second frame 112. The second upper recess R4 may be provided to concave in the lower surface direction from the upper surface of the second frame 112. The second upper recess R4 may be disposed to be spaced apart from the second opening TH2.

According to an embodiment, the second upper recess R4 may be provided so as not to be overlapped with the second lower recess R20 in a vertical direction. When the second upper recess R4 and the second lower recess R20 are overlapped with each other in the vertical direction and a thickness of the second frame 112 disposed therebetween is too thin, a strength of the second frame 112 may be reduced.

According to another embodiment, when a thickness of the second frame 112 is sufficiently provided, the second upper recess R4 and the second lower recess R20 are provided so as to be overlapped with each other in the vertical direction.

The second upper recess R4 may be provided adjacent to the periphery of the second pad electrode 122 when viewed from the upper direction thereof, as shown in FIG. 19. For example, the second upper recess R4 may be provided to the periphery of the second pad electrode 122 in a "]" shape.

For example, the first upper recesses R3 and the second upper recess R4 may be provided with a width of several tens of micrometers to several hundreds of micrometers.

In addition, the light emitting device package according to an embodiment may comprise a resin portion 135, as shown in FIG. 18.

The resin portion 135 may be provided at the first upper recess R3 and the second upper recess R4.

The resin portion 135 may be disposed at a side surface of the first pad electrode 121. The resin portion 135 may be provided at the first upper recess R3 and provided to be extended to a region in which the first pad electrode 121 is disposed. The resin portion 135 may be disposed under the semiconductor structure 123.

A distance L11 from an end of the first upper recess R3 to an adjacent end portion of the light emitting device 120 may be several hundreds of micrometers or less. As an example, the distance L11 from the end portion of the first upper recess R3 to the adjacent end portion of the light emitting device 120 may be provided to be equal to or smaller than 200 micrometers.

The distance L11 from the end portion of the first upper recess R3 to the adjacent end portion of the light emitting device 120 may be determined by viscosity of the resin portion 135 filled at the first upper recess R3 and the like.

The distance L11 from the end portion of the first upper recess R3 to the adjacent end portion of the light emitting device 120 may be determined by viscosity of the resin portion 135 filled at the first upper recess R3 and the like.

In addition, the resin portion 135 may be disposed at a side surface of the second pad electrode 122. The resin portion 135 may be provided at the second upper recess R4 and provided to be extended to a region in which the second pad electrode 122 is disposed. The resin portion 135 may be disposed under the semiconductor structure 123.

In addition, the resin portion 135 may also be provided at a side surface of the semiconductor structure 123. The resin portion 135 may be disposed on the side surface of the semiconductor structure 123, and thus it is possible to effectively prevent the first and second conductive layers 321 and 322 from moving to the side surface of the semiconductor structure 123. In addition, when the resin portion 135 is disposed on the side surface of the semiconductor structure 123, the resin portion 135 may be disposed under the active layer of the semiconductor structure 123, and thus the light extraction efficiency of the light emitting device 120 may be improved.

The first upper recess R3 and the second upper recess R4 may provide a sufficient space in which the resin portion 135 may be provided.

As an example, the resin portion 135 may comprise at least one of an epoxy-based material, a silicone-based material, and a hybrid material comprising an epoxy-based material and a silicone-based material. In addition, the resin portion 135 may comprise a reflective material such as $TiO_2$, and/or a white silicone comprising a silicone.

The resin portion 135 may be disposed under the light emitting device 120 to perform a sealing function. In addition, the resin portion 135 may improve adhesion force between the light emitting device 120 and the first frame 111. In addition, the resin portion 135 may improve adhesion force between the light emitting device 120 and the second frame 112.

The resin portion 135 may seal around the first pad electrode 121 and the second pad electrode 122. The resin portion 135 may prevent the first conductive layer 321 and the second conductive layer 322 from being moved from the first opening TH1 region and the second opening TH2 region, and diffusing and moving toward the light emitting device 120.

In addition, when the resin portion 135 comprises a material having a reflective property such as white silicone, the resin portion 135 may reflect light emitted from the light emitting device 120 toward an upper direction of the package body 110, thereby improving the light extraction efficiency of the light emitting device package 100.

In addition, according to an embodiment, a sum of areas of the first and second pad electrodes 121 and 122 may be provided at 10% or less based on an area of an upper surface of the substrate 124. According to the light emitting device package according to the embodiment, the sum of the areas of the first and second pad electrodes 121 and 122 may be set at 10% or less based on the area of the upper surface of the substrate 124 in order to secure a light emitting area emitted from the light emitting device and increase light extraction efficiency.

In addition, according to an embodiment, the sum of the areas of the first and second pad electrodes 121 and 122 may be provided at 0.7% or more based on the area of the upper surface of the substrate 124. According to the light emitting device package according to an embodiment, the sum of the areas of the first and second pad electrodes 121 and 122 may be set at 0.7% or more based on the area of the upper surface of the substrate 124 in order to provide a stable bonding force to the light emitting device to be mounted.

According to the embodiment, an area where the adhesive 130 is overlapped with the light emitting device 120 based on the first direction may be provided to be larger than that of a region where the first and second openings TH1 and TH2 are overlapped with the first and second pad electrodes 121 and 122.

As described above, as the area of the first and second pad electrodes 121 and 122 is provided to be small, an amount of light transmitted to the lower surface of the light emitting device 120 may be increased. In addition, the adhesive 130 having a good reflection characteristic may be provided under the light emitting device 120. Therefore, the light emitted in a downwards direction of the light emitting device 120 is reflected at the adhesive 130, and is effectively emitted toward an upper direction of the light emitting device package 100, so that the light extraction efficiency may be improved.

In addition, the light emitting device package according to the embodiment may comprise a molding part 140.

The molding part 140 may be provided on the light emitting device 120. The molding part 140 may be disposed on the first frame 111 and the second frame 112. The molding part 140 may be disposed at the cavity C provided by the package body 110. The molding part 140 may disposed on the resin portion 135.

In addition, according to another example of the light emitting device package according to the embodiment of the present invention, the resin portion 135 may not be provided separately, and the adhesive 130 may be provided at the periphery of the first and second pad electrodes 121 and 122.

At this point, the adhesive 130 may be referred to as a first resin, and the first and second pad electrodes 121 and 122 may be referred to as first and second bonding parts, respectively.

Meanwhile, the adhesive 130 may be disposed at the upper region of the first and second openings TH1 and TH2. A part of the adhesive 130 may be moved to the first and second openings TH1 and TH2 in a process in which the light emitting device 120 is provided on the package body 110. A part of the adhesive 130 may be disposed at a side surface region of the first and second pad electrodes 121 and 122 in the first and second openings TH1 and TH2. A part of the adhesive 130 may be disposed on the first and second conductive layers 321 and 322 in the first and second openings TH1 and TH2.

The adhesive 130 may seal the upper region of the first and second openings TH1 and TH2, and prevent moisture or foreign substance from flowing from outside into a region in which the light emitting device 120 is disposed through the first and second openings TH1 and TH2.

In addition, when a space for providing the adhesive 130 between the light emitting device 120 and the package body 110 is sufficiently secured, the recess R may not be provided on the upper surface of the package body 110.

In the light emitting device package 100 according to the embodiment, power may be connected to the first pad electrode 121 through the region of the first opening TH1, and power may be connected to the second pad electrode 122 through the region of the second opening TH2.

Accordingly, the light emitting device 120 may be driven by the driving power supplied through the first pad electrode 121 and the second pad electrode 122. In addition, the light emitted from the light emitting device 120 may be provided in the upper direction of the package body 110.

Meanwhile, the light emitting device package 100 according to an embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided in the light emitting device package, so that stability of electrical connection and physical coupling may be weakened.

However, according to the light emitting device package and a manufacturing method of the light emitting device package according to an embodiment, the first pad electrode and the second pad electrode of the light emitting device according to the embodiment may be provided with driving power by the conductive layers disposed in the openings. In addition, the melting point of the conductive layers disposed in the openings may be selected so as to have a higher value than that of the general bonding material.

Therefore, since the light emitting device package 100 according to the embodiment does not cause a re-melting phenomenon even when the light emitting device package 100 is bonded to the main substrate by a reflow process, the electrical connection and the physical bonding force may not be deteriorated.

In addition, according to the light emitting device package 100 and the manufacturing method of the light emitting device package according to an embodiment, the package body 110 does not need to be exposed to a high temperature in the manufacturing process of the light emitting device package. Therefore, according to an embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphthalamide (PPA) resin, polycyclohexylenedimethylene terephthalate (PCT) resin, epoxy molding compound (EMC) resin, and silicone molding compound (SMC) resin.

Next, another example of a light emitting device package according to an embodiment of the present invention will be described with reference to FIG. 20.

In describing the light emitting device package according to the embodiment with reference to FIG. 20, the description of the contents overlapping with the contents described with reference to FIGS. 1 to 19 may be omitted.

Figure 20:
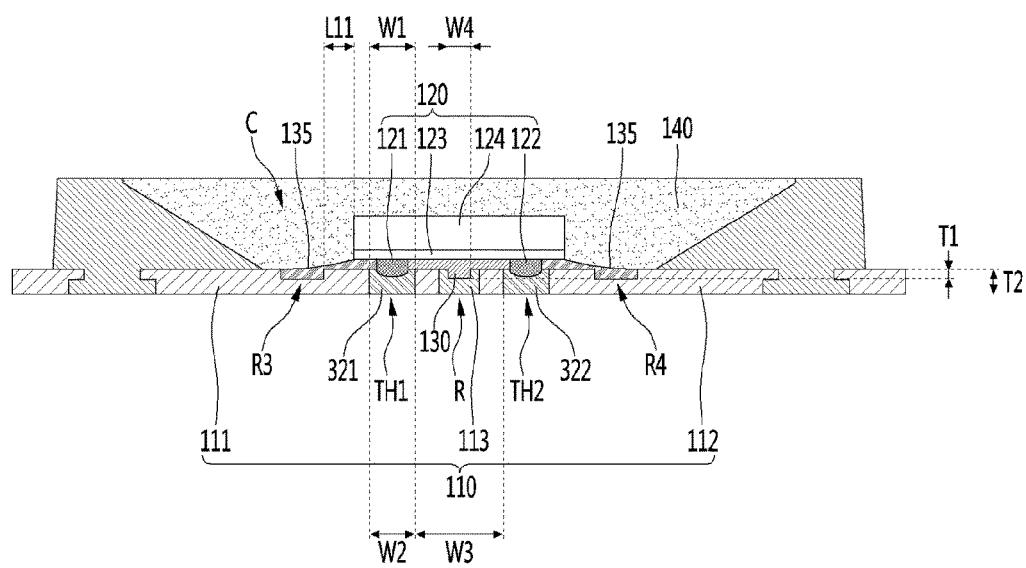
FIG. 20 is a view illustrating another example of a light emitting device package according to an embodiment of the present invention.

The light emitting device package according to an embodiment may comprise a package body 110 and a light emitting device 120, as shown in FIG. 20.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112. The body 113 may perform a function as a kind of electrode separation line.

The first frame 111 and the second frame 112 may be provided as an insulating frame. The first frame 111 and the second frame 112 may stably provide a structural strength of the package body 110.

In addition, the first frame 111 and the second frame 112 may be provided as a conductive frame. The first frame 111 and the second frame 112 may stably provide the structural strength of the package body 110 and may be electrically connected to the light emitting device 120.

A difference between the case of forming the first frame 111 and the second frame 112 as the insulating frame and the case of forming the first frame 111 and the second frame 112 as the conductive frame will be described later.

For example, the body 113 may be formed of at least one selected from the group consisting of polyphthalamide (PPA), polychloro tri phenyl (PCT), liquid crystal polymer (LCP), polyamide 9T (PA9T), silicone, epoxy molding compound (EMC), silicone molding compound (SMC), ceramic, photo sensitive glass (PSG), sapphire ($Al_2O_3$), and the like. In addition, the body 113 may comprise a high refractive index filler such as $TiO_2$ and $SiO_2$.

According to the embodiment, the light emitting device 120 may comprise a first pad electrode 121, a second pad electrode 122, a semiconductor structure 123, and a substrate 124.

The light emitting device 120 may comprise the semiconductor structure 123 disposed under the substrate 124, as shown in FIG. 20. The first pad electrode 121 and the second pad electrode 122 may be disposed between the semiconductor structure 123 and the body 113.

The light emitting device 120 may be disposed on the package body 110. The light emitting device 120 may be disposed on the first frame 111 and the second frame 112. The light emitting device 120 may be disposed in the cavity C provided by the package body 110.

The first pad electrode 121 may be disposed on a lower surface of the light emitting device 120. The second pad electrode 122 may be disposed on the lower surface of the light emitting device 120. The first pad electrode 121 and the second pad electrode 122 may be disposed to be spaced apart from each other on the lower surface of the light emitting device 120.

The first pad electrode 121 may be disposed on the first frame 111. The second pad electrode 122 may be disposed on the second frame 112.

The first pad electrode 121 may be disposed between the semiconductor structure 123 and the first frame 111. The second pad electrode 122 may be disposed between the semiconductor structure 123 and the second frame 112.

Meanwhile, the light emitting device package according to the embodiment may comprise a first opening TH1 and a second opening TH2, as shown in FIG. 20. The first frame 111 may comprise the first opening TH1. The second frame 112 may comprise the second opening TH2.

The first opening TH1 may be provided at the first frame 111. The first opening TH1 may be provided by passing through the first frame 111. The first opening TH1 may be provided by passing through an upper surface and a lower surface of the first frame 111 in a first direction.

The first opening TH1 may be disposed under the first pad electrode 121 of the light emitting device 120. The first opening TH1 may be provided to be overlapped with the first pad electrode 121 of the light emitting device 120. The first opening TH1 may be provided to be overlapped with the first pad electrode 121 of the light emitting device 120 in the first direction from the upper surface of the first frame 111 toward the lower surface thereof.

The second opening TH2 may be provided at the second frame 112. The second opening TH2 may be provided by passing through the second frame 112. The second opening TH2 may be provided by passing through an upper surface and a lower surface of the second frame 112 in a first direction.

The second opening TH2 may be disposed under the second pad electrode 122 of the light emitting device 120. The second opening TH2 may be provided to be overlapped with the second pad electrode 122 of the light emitting device 120. The second opening TH2 may be provided to be overlapped with the second pad electrode 122 of the light emitting device 120 in the first direction from the upper surface of the second frame 112 toward the lower surface thereof.

The first opening TH1 and the second opening TH2 may be disposed to be spaced apart from each other. The first opening TH1 and the second opening TH2 may be disposed to be spaced apart from each other under the lower surface of the light emitting device 120.

According to the embodiment, a width W1 of an upper region of the first opening TH1 may be greater than that of the first pad electrode 121. In addition, a width of an upper region of the second opening TH2 may be greater than that of the second pad electrode 122.

According to the embodiment, a lower portion of the first pad electrode 121 may be disposed in the upper region of the first opening TH1. A bottom surface of the first pad electrode 121 may be disposed lower than the upper surface of the first frame 111.

In addition, a lower portion of the second pad electrode 122 may be disposed in the upper region of the second opening TH2. A bottom surface of the second pad electrode 122 may be disposed lower than the upper surface of the second frame 112.

The light emitting device package according to the embodiment may comprise an adhesive 130.

The adhesive 130 may be disposed between the body 113 and the light emitting device 120. The adhesive 130 may be disposed between an upper surface of the body 113 and a lower surface of the light emitting device 120.

The light emitting device package according to the embodiment may comprise a recess R, as shown in FIG. 20.

The recess R may be provided at the body 113. The recess R may be provided between the first opening TH1 and the second opening TH2. The recess R may be provided to concave from the upper surface of the body 113 toward the lower surface thereof. The recess R may be disposed under the light emitting device 120. The recess R may be provided to be overlapped with the light emitting device 120 in the first direction.

As an example, the adhesive 130 may be disposed in the recess R. The adhesive 130 may be disposed between the light emitting device 120 and the body 113. The adhesive 130 may be disposed between the first pad electrode 121 and the second pad electrode 122. As an example, the adhesive 130 may be disposed in contact with a side surface of the first pad electrode 121 and a side surface of the second pad electrode 122.

The adhesive 130 may provide a stable fixing force between the light emitting device 120 and the package body 110. The adhesive 130 may provide a stable fixing force between the light emitting device 120 and the body 113. The adhesive 130 may be disposed, as an example, in direct contact with the upper surface of the body 113. In addition, the adhesive 130 may be disposed in direct contact with the lower surface of the light emitting device 120.

As an example, the adhesive 130 may comprise at least one of an epoxy-based material, a silicone-based material, and a hybrid material comprising an epoxy-based material and a silicone-based material. As an example, the adhesive 130 may comprise a white silicone. The adhesive 130 may be referred to as a first resin as another representation.

The adhesive 130 may provide a stable fixing force between the body 113 and the light emitting device 120. When light is emitted to the lower surface of the light emitting device 120, the adhesive 130 may provide a light diffusion function between the light emitting device 120 and the body 113. When the light is emitted from the light emitting device 120 to the lower surface of the light emitting device 120, the adhesive 130 may improve the light extraction efficiency of the light emitting device package 100 by providing the light diffusion function.

The recess R may provide a proper space in which a kind of under-filling process may be performed under the light emitting device 120. The recess R may be provided at a first depth or more so that the adhesive 130 may be sufficiently provided between the lower surface of the light emitting device 120 and the upper surface of the body 113. In addition, the recesses R may be provided at a second depth or less to provide a stable strength of the body 113.

In addition, according to an embodiment, a sum of areas of the first and second pad electrodes 121 and 122 may be provided at 10% or less based on an area of an upper surface of the substrate 124. According to the light emitting device package according to the embodiment, the sum of the areas of the first and second pad electrodes 121 and 122 may be set at 10% or less based on the area of the upper surface of the substrate 124 in order to secure a light emitting area emitted from the light emitting device and increase light extraction efficiency.

In addition, according to an embodiment, the sum of the areas of the first and second pad electrodes 121 and 122 may be provided at 0.7% or more based on the area of the upper surface of the substrate 124. According to the light emitting device package according to an embodiment, the sum of the areas of the first and second pad electrodes 121 and 122 may be set at 0.7% or more based on the area of the upper surface of the substrate 124 in order to provide a stable bonding force to the light emitting device to be mounted.

According to the embodiment, an area where the adhesive 130 is overlapped with the light emitting device 120 based on the first direction may be provided to be larger than that of a region where the first and second openings TH1 and TH2 are overlapped with the first and second pad electrodes 121 and 122.

As described above, as the area of the first and second pad electrodes 121 and 122 is provided to be small, an amount of light transmitted to the lower surface of the light emitting device 120 may be increased. In addition, the adhesive 130 having a good reflection characteristic may be provided under the light emitting device 120. Therefore, the light emitted in a downwards direction of the light emitting device 120 is reflected at the adhesive 130, and is effectively emitted toward an upper direction of the light emitting device package 100, so that the light extraction efficiency may be improved.

In addition, the light emitting device package according to an embodiment may comprise a first conductive layer 321 and a second conductive layer 322. The first conductive layer 321 may be disposed to be spaced apart from the second conductive layer 322.

The first conductive layer 321 may be provided at the first opening TH1. The first conductive layer 321 may be disposed under the first pad electrode 121. A width of the first conductive layer 321 may be provided to be greater than that of the first pad electrode 121.

The first pad electrode 121 may have a width of a second direction perpendicular to the first direction in which the first opening TH1 is formed. The width of the first pad electrode 121 may be provided to be smaller than that of the second direction of the first opening TH1.

The first conductive layer 321 may be disposed in direct contact with the lower surface of the first pad electrode 121. The first conductive layer 321 may be electrically connected to the first pad electrode 121. The first conductive layer 321 may be disposed to be surrounded by the first frame 111.

In the upper region of the first opening TH1, an upper portion of the first conductive layer 321 may be disposed at the periphery of a lower portion of the first pad electrode 121. The upper surface of the first conductive layer 321 may be disposed to be higher than the lower surface of the first pad electrode 121.

The second conductive layer 322 may be provided at the second opening TH2. The second conductive layer 322 may be disposed under the second pad electrode 122. A width of the second conductive layer 322 may be provided to be greater than that of the second pad electrode 122.

The second pad electrode 122 may have a width of a second direction perpendicular to the first direction in which the second opening TH2 is formed. The width of the second pad electrode 122 may be provided to be smaller than that of the second direction of the second opening TH2.

The second conductive layer 322 may be disposed in direct contact with the lower surface of the second pad electrode 122. The second conductive layer 322 may be electrically connected to the second pad electrode 122. The second conductive layer 322 may be disposed to be surrounded by the second frame 112.

In the upper region of the second opening TH2, an upper portion of the second conductive layer 322 may be disposed at the periphery of a lower portion of the second pad electrode 122. The upper surface of the second conductive layer 322 may be disposed to be higher than the lower surface of the second pad electrode 122.

The first conductive layer 321 and the second conductive layer 322 may comprise one material selected from the group consisting of Ag, Au, Pt, Sn, Cu or an alloy thereof. However, the present invention is not limited thereto, and a material capable of securing a conductive function may be used in the first conductive layer 321 and the second conductive layer 322.

As an example, the first conductive layer 321 and the second conductive layer 322 may be formed by using a conductive paste. The conductive paste may comprise a solder paste, a silver paste, or the like, and may be composed of multiple layers or a single layer composed of multiple layers or alloys composed of different materials. As an example, the first and second conductive layers 321 and 322 may comprise a SAC (Sn—Ag—Cu) material.

In addition, the light emitting device package according to the embodiment may comprise a first upper recess R3 and a second upper recess R4, as shown in FIG. 20.

The first upper recess R3 may be provided on an upper surface of the first frame 111. The first upper recess R3 may be provided to concave in the lower surface direction from the upper surface of the first frame 111. The first upper recess R3 may be disposed to be spaced apart from the first opening TH1.

The first upper recess R3 may be provided adjacent to the periphery of the first pad electrode 121 when viewed from the upper direction thereof, as shown in FIG. 19. For example, the first upper recess R3 may be provided to the periphery of the first pad electrode 121 in a "[" shape.

The second upper recess R4 may be provided on an upper surface of the second frame 112. The second upper recess R4 may be provided to concave in the lower surface direction from the upper surface of the second frame 112. The second upper recess R4 may be disposed to be spaced apart from the second opening TH2.

The second upper recess R4 may be provided adjacent to the periphery of the second pad electrode 122 when viewed from the upper direction thereof, as shown in FIG. 19. For example, the second upper recess R4 may be provided to the periphery of the second pad electrode 122 in a "]" shape.

For example, the first upper recesses R3 and the second upper recess R4 may be provided with a width of several tens of micrometers to several hundreds of micrometers.

In addition, the light emitting device package according to an embodiment may comprise a resin portion 135, as shown in FIG. 20.

The resin portion 135 may be provided at the first upper recess R3 and the second upper recess R4.

The resin portion 135 may be disposed at a side surface of the first pad electrode 121. The resin portion 135 may be provided at the first upper recess R3 and provided to be extended to a region in which the first pad electrode 121 is disposed. The resin portion 135 may be disposed under the semiconductor structure 123.

A distance L11 from an end of the first upper recess R3 to an adjacent end portion of the light emitting device 120 may be several hundreds of micrometers or less. As an example, the distance L11 from the end portion of the first upper recess R3 to the adjacent end portion of the light emitting device 120 may be provided to be equal to or smaller than 200 micrometers.

The distance L11 from the end portion of the first upper recess R3 to the adjacent end portion of the light emitting device 120 may be determined by viscosity of the resin portion 135 filled at the first upper recess R3 and the like.

The distance L11 from the end portion of the first upper recess R3 to the adjacent end portion of the light emitting device 120 may be determined by viscosity of the resin portion 135 filled at the first upper recess R3 and the like.

In addition, the resin portion 135 may be disposed at a side surface of the second pad electrode 122. The resin portion 135 may be provided at the second upper recess R4 and provided to be extended to a region in which the second pad electrode 122 is disposed. The resin portion 135 may be disposed under the semiconductor structure 123.

In addition, the resin portion 135 may also be provided at a side surface of the semiconductor structure 123. The resin portion 135 may be disposed on the side surface of the semiconductor structure 123, and thus it is possible to effectively prevent the first and second conductive layers 321 and 322 from moving to the side surface of the semiconductor structure 123. In addition, when the resin portion 135 is disposed on the side surface of the semiconductor structure 123, the resin portion 135 may be disposed under the active layer of the semiconductor structure 123, and thus the light extraction efficiency of the light emitting device 120 may be improved.

The first upper recess R3 and the second upper recess R4 may provide a sufficient space in which the resin portion 135 may be provided.

As an example, the resin portion 135 may comprise at least one of an epoxy-based material, a silicone-based material, and a hybrid material comprising an epoxy-based material and a silicone-based material. In addition, the resin portion 135 may comprise a reflective material such as $TiO_2$, and/or a white silicone comprising a silicone.

The resin portion 135 may be disposed under the light emitting device 120 to perform a sealing function. In addition, the resin portion 135 may improve adhesion force between the light emitting device 120 and the first frame 111. In addition, the resin portion 135 may improve adhesion force between the light emitting device 120 and the second frame 112.

The resin portion 135 may seal around the first pad electrode 121 and the second pad electrode 122. The resin portion 135 may prevent the first conductive layer 321 and the second conductive layer 322 from being moved from the first opening TH1 region and the second opening TH2 region, and diffusing and moving toward the light emitting device 120.

In addition, when the resin portion 135 comprises a material having a reflective property such as white silicone, the resin portion 135 may reflect light emitted from the light emitting device 120 toward an upper direction of the package body 110, thereby improving the light extraction efficiency of the light emitting device package 100.

In addition, the light emitting device package according to the embodiment may comprise a molding part 140.

The molding part 140 may be provided on the light emitting device 120. The molding part 140 may be disposed on the first frame 111 and the second frame 112. The molding part 140 may be disposed at the cavity C provided by the package body 110. The molding part 140 may disposed on the resin portion 135.

In addition, according to another example of the light emitting device package according to the embodiment of the present invention, the resin portion 135 may not be provided separately, and the adhesive 130 may be provided at the periphery of the first and second pad electrodes 121 and 122.

At this point, the adhesive 130 may be referred to as a first resin, and the first and second pad electrodes 121 and 122 may be referred to as first and second bonding parts, respectively.

Meanwhile, the adhesive 130 may be disposed at the upper region of the first and second openings TH1 and TH2. A part of the adhesive 130 may be moved to the first and second openings TH1 and TH2 in a process in which the light emitting device 120 is provided on the package body 110. A part of the adhesive 130 may be disposed at a side surface region of the first and second pad electrodes 121 and 122 in the first and second openings TH1 and TH2. A part of the adhesive 130 may be disposed on the first and second conductive layers 321 and 322 in the first and second openings TH1 and TH2.

The adhesive 130 may seal the upper region of the first and second openings TH1 and TH2, and prevent moisture or foreign substance from flowing from outside into a region in which the light emitting device 120 is disposed through the first and second openings TH1 and TH2.

In addition, when a space for providing the adhesive 130 between the light emitting device 120 and the package body 110 is sufficiently secured, the recess R may not be provided on the upper surface of the package body 110.

In the light emitting device package 100 according to the embodiment, power may be connected to the first pad electrode 121 through the region of the first opening TH1, and power may be connected to the second pad electrode 122 through the region of the second opening TH2.

Accordingly, the light emitting device 120 may be driven by the driving power supplied through the first pad electrode 121 and the second pad electrode 122. In addition, the light emitted from the light emitting device 120 may be provided in the upper direction of the package body 110.

Meanwhile, the light emitting device package 100 according to an embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided in the light emitting device package, so that stability of electrical connection and physical coupling may be weakened.

However, according to the light emitting device package and a manufacturing method of the light emitting device package according to an embodiment, the first pad electrode and the second pad electrode of the light emitting device according to the embodiment may be provided with driving power by the conductive layers disposed in the openings. In addition, the melting point of the conductive layers disposed in the openings may be selected so as to have a higher value than that of the general bonding material.

Therefore, since the light emitting device package 100 according to the embodiment does not cause a re-melting phenomenon even when the light emitting device package 100 is bonded to the main substrate by a reflow process, the electrical connection and the physical bonding force may not be deteriorated.

In addition, according to the light emitting device package 100 and the manufacturing method of the light emitting device package according to an embodiment, the package body 110 does not need to be exposed to a high temperature in the manufacturing process of the light emitting device package. Therefore, according to an embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphthalamide (PPA) resin, polycyclohexylenedimethylene terephthalate (PCT) resin, epoxy molding compound (EMC) resin, and silicone molding compound (SMC) resin.

Next, another example of the light emitting device package according to an embodiment of the present invention will be described with reference to FIG. 21.

In describing the light emitting device package according to the embodiment of with reference to FIG. 21, the description of the contents overlapping with the contents described with reference to FIGS. 1 to 20 may be omitted.

The light emitting device package shown in FIG. 21 differs from the light emitting device package described with reference to FIGS. 18 to 20 in a formation position of the first upper recess R3 and the second upper recess R4.

Figure 21:
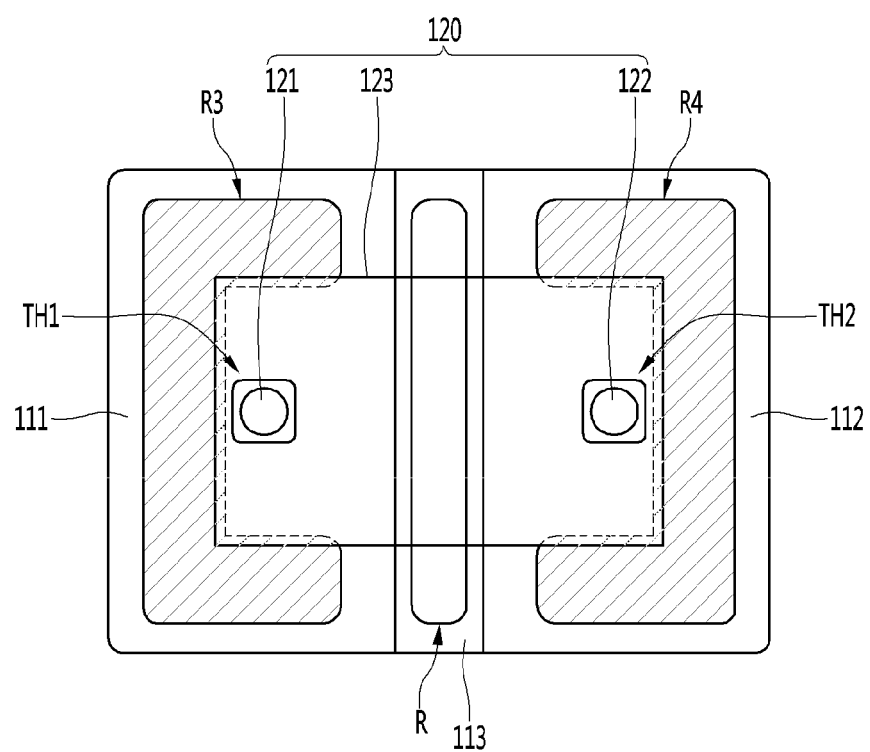
FIG. 21 is a view illustrating another example of a light emitting device package according to an embodiment of the present invention.

In the light emitting device package according to an embodiment, as shown in FIG. 21, when viewed from the upper direction thereof, a part of a region of the first upper recess R3 may be overlapped with the semiconductor structure 123 in a vertical direction. As an example, a side surface region of the first upper recess R3 adjacent to the first pad electrode 121 may be provided to be extended under the semiconductor structure 123.

In addition, in the light emitting device package according to an embodiment, as shown in FIG. 21, when viewed from the upper direction thereof, a part of a region of the second upper recess R4 may be overlapped with the semiconductor structure 123 in a vertical direction. As an example, a side surface region of the second upper recess R4 adjacent to the second pad electrode 122 may be provided to be extended under the semiconductor structure 123.

Accordingly, the resin portion 135 filled at the first upper recess R3 and the second upper recess R4 may effectively seal a periphery of the first pad electrode 121 and the second pad electrode 122.

In addition, the first upper recess R3 and the second upper recess R4 may provide sufficient space in which the resin portion 135 may be provided under the light emitting device 120. The first upper recess R3 and the second upper recess R4 may provide a proper space in which a kind of underfilling process may be performed under the light emitting device 120.

As an example, the resin portion 135 may comprise at least one of an epoxy-based material, a silicone-based material, and a hybrid material comprising an epoxy-based material and a silicone-based material. In addition, the resin portion 135 may be a reflective part that reflects light emitted from the light emitting device 120, as an example, a resin containing a reflective material such as TiO$_2$. The resin portion 135 may comprise white silicone.

The resin portion 135 may be disposed under the light emitting device 120 to perform a sealing function. In addition, the resin portion 135 may improve adhesion force between the light emitting device 120 and the first frame 111. In addition, the resin portion 135 may improve adhesion force between the light emitting device 120 and the second frame 112.

The resin portion 135 may seal around the first pad electrode 121 and the second pad electrode 122. The resin portion 135 may prevent the first conductive layer 321 and the second conductive layer 322 from being moved from the first opening TH1 region and the second opening TH2 region, and diffusing and moving toward the light emitting device 120.

In addition, when the resin portion 135 comprises a material having a reflective property such as white silicone, the resin portion 135 may reflect light emitted from the light emitting device 120 toward an upper direction of the package body 110, thereby improving the light extraction efficiency of the light emitting device package 100.

In addition, according to an embodiment, a sum of areas of the first and second pad electrodes 121 and 122 may be provided at 10% or less based on an area of an upper surface of the substrate 124. According to the light emitting device package according to the embodiment, the sum of the areas of the first and second pad electrodes 121 and 122 may be set at 10% or less based on the area of the upper surface of the substrate 124 in order to secure a light emitting area emitted from the light emitting device and increase light extraction efficiency.

In addition, according to an embodiment, the sum of the areas of the first and second pad electrodes 121 and 122 may be provided at 0.7% or more based on the area of the upper surface of the substrate 124. According to the light emitting device package according to an embodiment, the sum of the areas of the first and second pad electrodes 121 and 122 may be set at 0.7% or more based on the area of the upper surface of the substrate 124 in order to provide a stable bonding force to the light emitting device to be mounted.

According to the embodiment, an area where the adhesive 130 is overlapped with the light emitting device 120 based on the first direction may be provided to be larger than that of a region where the first and second openings TH1 and TH2 are overlapped with the first and second pad electrodes 121 and 122.

As described above, as the area of the first and second pad electrodes 121 and 122 is provided to be small, an amount of light transmitted to the lower surface of the light emitting device 120 may be increased. In addition, the adhesive 130 having a good reflection characteristic may be provided under the light emitting device 120. Therefore, the light emitted in a downwards direction of the light emitting device 120 is reflected at the adhesive 130, and is effectively emitted toward an upper direction of the light emitting device package 100, so that the light extraction efficiency may be improved.

In the light emitting device package 100 according to the embodiment, power may be connected to the first pad electrode 121 through the region of the first opening TH1, and power may be connected to the second pad electrode 122 through the region of the second opening TH2.

Accordingly, the light emitting device 120 may be driven by the driving power supplied through the first pad electrode 121 and the second pad electrode 122. In addition, the light emitted from the light emitting device 120 may be provided in the upper direction of the package body 110.

Meanwhile, the light emitting device package 100 according to an embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided in the light emitting device package, so that stability of electrical connection and physical coupling may be weakened.

However, according to the light emitting device package and a manufacturing method of the light emitting device package according to an embodiment, the first pad electrode and the second pad electrode of the light emitting device according to the embodiment may be provided with driving power by the conductive layers disposed in the openings. In addition, the melting point of the conductive layers disposed in the openings may be selected so as to have a higher value than that of the general bonding material.

Therefore, since the light emitting device package 100 according to the embodiment does not cause a re-melting phenomenon even when the light emitting device package 100 is bonded to the main substrate by a reflow process, the electrical connection and the physical bonding force may not be deteriorated.

In addition, according to the light emitting device package 100 and the manufacturing method of the light emitting device package according to an embodiment, the package body 110 does not need to be exposed to a high temperature in the manufacturing process of the light emitting device package. Therefore, according to an embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphthalamide (PPA) resin, polycyclohexylenedimethylene terephthalate (PCT) resin, epoxy molding compound (EMC) resin, and silicone molding compound (SMC) resin.

Next, another example of a light emitting device package according to an embodiment of the present invention will be described with reference to FIG. 22.

In describing the light emitting device package according to the embodiment with reference to FIG. 22, the description of the contents overlapping with the contents described with reference to FIGS. 1 to 21 may be omitted.

Figure 22:
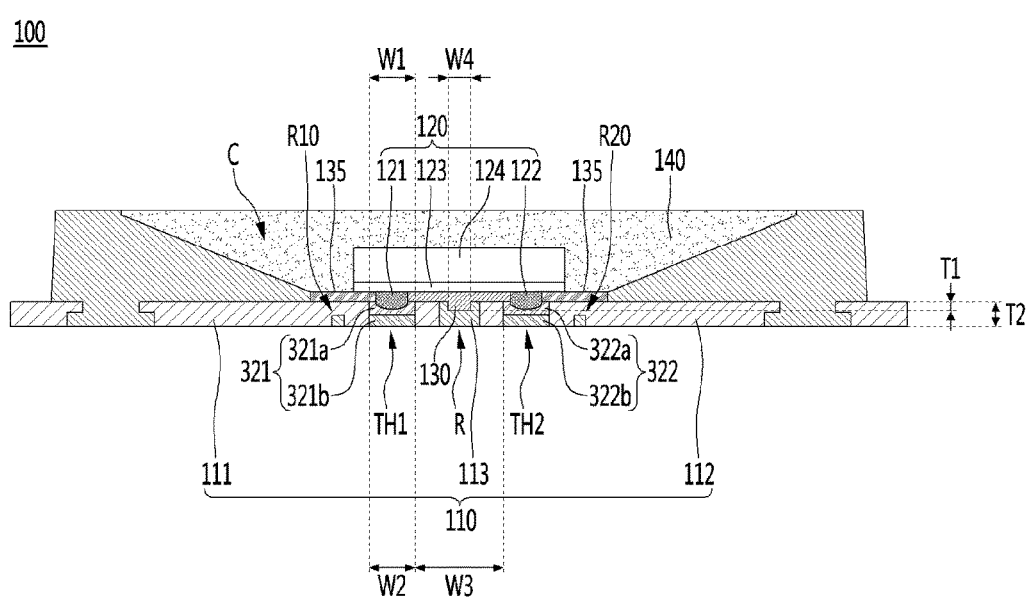
FIG. 22 is a view illustrating still another example of a light emitting device package according to an embodiment of the present invention.

The light emitting device package according to an embodiment may comprise a package body 110 and a light emitting device 120, as shown in FIG. 22.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112. The body 113 may perform a function as a kind of electrode separation line.

The first frame 111 and the second frame 112 may be provided as an insulating frame. The first frame 111 and the second frame 112 may stably provide a structural strength of the package body 110.

In addition, the first frame 111 and the second frame 112 may be provided as a conductive frame. The first frame 111 and the second frame 112 may stably provide the structural strength of the package body 110 and may be electrically connected to the light emitting device 120.

A difference between the case of forming the first frame 111 and the second frame 112 as the insulating frame and the case of forming the first frame 111 and the second frame 112 as the conductive frame will be described later.

According to the embodiment, the light emitting device 120 may comprise a first pad electrode 121, a second pad electrode 122, a semiconductor structure 123, and a substrate 124.

The light emitting device 120 may comprise the semiconductor structure 123 disposed under the substrate 124, as shown in FIG. 22. The first pad electrode 121 and the second pad electrode 122 may be disposed between the semiconductor structure 123 and the body 113.

The first pad electrode 121 may be disposed on a lower surface of the light emitting device 120. The second pad electrode 122 may be disposed on the lower surface of the light emitting device 120. The first pad electrode 121 and the second pad electrode 122 may be disposed to be spaced apart from each other on the lower surface of the light emitting device 120.

The first pad electrode 121 may be disposed on the first frame 111. The second pad electrode 122 may be disposed on the second frame 112.

Meanwhile, the light emitting device package 100 according to the embodiment may comprise a first opening TH1 and a second opening TH2, as shown in FIG. 22. The first frame 111 may comprise the first opening TH1. The second frame 112 may comprise the second opening TH2.

The first opening TH1 may be provided at the first frame 111. The first opening TH1 may be provided by passing through the first frame 111. The first opening TH1 may be provided by passing through an upper surface and a lower surface of the first frame 111 in a first direction.

The first opening TH1 may be disposed under the first pad electrode 121 of the light emitting device 120. The first opening TH1 may be provided to be overlapped with the first pad electrode 121 of the light emitting device 120. The first opening TH1 may be provided to be overlapped with the first pad electrode 121 of the light emitting device 120 in the first direction from the upper surface of the first frame 111 toward the lower surface thereof.

The second opening TH2 may be provided at the second frame 112. The second opening TH2 may be provided by passing through the second frame 112. The second opening TH2 may be provided by passing through an upper surface and a lower surface of the second frame 112 in a first direction.

The second opening TH2 may be disposed under the second pad electrode 122 of the light emitting device 120. The second opening TH2 may be provided to be overlapped with the second pad electrode 122 of the light emitting device 120. The second opening TH2 may be provided to be overlapped with the second pad electrode 122 of the light emitting device 120 in the first direction from the upper surface of the second frame 112 toward the lower surface thereof.

The first opening TH1 and the second opening TH2 may be disposed to be spaced apart from each other. The first opening TH1 and the second opening TH2 may be disposed to be spaced apart from each other under the lower surface of the light emitting device 120.

According to the embodiment, a width W1 of an upper region of the first opening TH1 may be greater than that of the first pad electrode 121. In addition, a width of an upper region of the second opening TH2 may be greater than that of the second pad electrode 122.

According to the embodiment, a lower portion of the first pad electrode 121 may be disposed in the upper region of the first opening TH1. A bottom surface of the first pad electrode 121 may be disposed lower than the upper surface of the first frame 111.

In addition, a lower portion of the second pad electrode 122 may be disposed in the upper region of the second opening TH2. A bottom surface of the second pad electrode 122 may be disposed lower than the upper surface of the second frame 112.

In addition, the light emitting device package 100 according to the embodiment may comprise an adhesive 130, as shown in FIG. 22.

The adhesive 130 may be disposed between the body 113 and the light emitting device 120. The adhesive 130 may be disposed between an upper surface of the body 113 and a lower surface of the light emitting device 120.

In addition, the light emitting device package 100 according to the embodiment may comprise a recess R, as shown in FIG. 22.

The recess R may be provided at the body 113. The recess R may be provided between the first opening TH1 and the second opening TH2. The recess R may be provided to concave from the upper surface of the body 113 toward the lower surface thereof. The recess R may be disposed under the light emitting device 120. The recess R may be provided to be overlapped with the light emitting device 120 in the first direction.

As an example, the adhesive 130 may be disposed in the recess R. The adhesive 130 may be disposed between the light emitting device 120 and the body 113. The adhesive 130 may be disposed between the first pad electrode 121 and the second pad electrode 122. As an example, the adhesive 130 may be disposed in contact with a side surface of the first pad electrode 121 and a side surface of the second pad electrode 122.

The adhesive 130 may provide a stable fixing force between the light emitting device 120 and the package body 110. The adhesive 130 may provide a stable fixing force between the light emitting device 120 and the body 113. The adhesive 130 may be disposed, as an example, in direct contact with the upper surface of the body 113. In addition, the adhesive 130 may be disposed in direct contact with the lower surface of the light emitting device 120.

As an example, the adhesive 130 may comprise at least one of an epoxy-based material, a silicone-based material, and a hybrid material comprising an epoxy-based material and a silicone-based material. As an example, the adhesive 130 may comprise a white silicone. The adhesive 130 may be referred to as a first resin as another representation.

The adhesive 130 may provide a stable fixing force between the body 113 and the light emitting device 120. When light is emitted to the lower surface of the light emitting device 120, the adhesive 130 may provide a light diffusion function between the light emitting device 120 and the body 113. When the light is emitted from the light emitting device 120 to the lower surface of the light emitting device 120, the adhesive 130 may improve the light extraction efficiency of the light emitting device package 100 by providing the light diffusion function.

The recess R may provide a proper space in which a kind of under-filling process may be performed under the light emitting device 120. The recess R may be provided at a first depth or more so that the adhesive 130 may be sufficiently provided between the lower surface of the light emitting device 120 and the upper surface of the body 113. In addition, the recesses R may be provided at a second depth or less to provide a stable strength of the body 113.

In addition, according to an embodiment, a sum of areas of the first and second pad electrodes 121 and 122 may be provided at 10% or less based on an area of an upper surface of the substrate 124. According to the light emitting device package according to the embodiment, the sum of the areas of the first and second pad electrodes 121 and 122 may be set at 10% or less based on the area of the upper surface of the substrate 124 in order to secure a light emitting area emitted from the light emitting device and increase light extraction efficiency.

In addition, according to an embodiment, the sum of the areas of the first and second pad electrodes 121 and 122 may be provided at 0.7% or more based on the area of the upper surface of the substrate 124. According to the light emitting device package according to an embodiment, the sum of the areas of the first and second pad electrodes 121 and 122 may be set at 0.7% or more based on the area of the upper surface of the substrate 124 in order to provide a stable bonding force to the light emitting device to be mounted.

According to the embodiment, an area where the adhesive 130 is overlapped with the light emitting device 120 based on the first direction may be provided to be larger than that of a region where the first and second openings TH1 and TH2 are overlapped with the first and second pad electrodes 121 and 122.

As described above, as the area of the first and second pad electrodes 121 and 122 is provided to be small, an amount of light transmitted to the lower surface of the light emitting device 120 may be increased. In addition, the adhesive 130 having a good reflection characteristic may be provided under the light emitting device 120. Therefore, the light emitted in a downwards direction of the light emitting device 120 is reflected at the adhesive 130, and is effectively emitted toward an upper direction of the light emitting device package 100, so that the light extraction efficiency may be improved.

In addition, the light emitting device package 100 according to an embodiment may comprise a first conductive layer 321 and a second conductive layer 322, as shown in FIG. 22. The first conductive layer 321 may be disposed to be spaced apart from the second conductive layer 322.

The first conductive layer 321 may be provided at the first opening TH1. The first conductive layer 321 may be disposed under the first pad electrode 121. A width of the first conductive layer 321 may be provided to be greater than that of the first pad electrode 121.

The first pad electrode 121 may have a width of a second direction perpendicular to the first direction in which the first opening TH1 is formed. The width of the first pad electrode 121 may be provided to be smaller than that of the second direction of the first opening TH1.

The first conductive layer 321 may be disposed in direct contact with the lower surface of the first pad electrode 121. The first conductive layer 321 may be electrically connected to the first pad electrode 121. The first conductive layer 321 may be disposed to be surrounded by the first frame 111.

In the upper region of the first opening TH1, an upper portion of the first conductive layer 321 may be disposed at the periphery of a lower portion of the first pad electrode 121. The upper surface of the first conductive layer 321 may be disposed to be higher than the lower surface of the first pad electrode 121.

The second conductive layer 322 may be provided at the second opening TH2. The second conductive layer 322 may be disposed under the second pad electrode 122. A width of the second conductive layer 322 may be provided to be greater than that of the second pad electrode 122.

The second pad electrode 122 may have a width of a second direction perpendicular to the first direction in which the second opening TH2 is formed. The width of the second pad electrode 122 may be provided to be smaller than that of the second direction of the second opening TH2.

The second conductive layer 322 may be disposed in direct contact with the lower surface of the second pad electrode 122. The second conductive layer 322 may be electrically connected to the second pad electrode 122. The second conductive layer 322 may be disposed to be surrounded by the second frame 112.

In the upper region of the second opening TH2, an upper portion of the second conductive layer 322 may be disposed at the periphery of a lower portion of the second pad electrode 122. The upper surface of the second conductive layer 322 may be disposed to be higher than the lower surface of the second pad electrode 122.

The first conductive layer 321 and the second conductive layer 322 may comprise one material selected from the group consisting of Ag, Au, Pt, Sn, Cu or an alloy thereof. However, the present invention is not limited thereto, and a material capable of securing a conductive function may be used in the first conductive layer 321 and the second conductive layer 322.

As an example, the first conductive layer 321 and the second conductive layer 322 may be formed by using a conductive paste. The conductive paste may comprise a solder paste, a silver paste, or the like.

Meanwhile, the first conductive layer 321 and the second conductive layer 322, according to an embodiment, as shown in FIG. 22, may be provided with multi layers, or and may comprise multi layers or a single layer composed of multiple layers or alloys composed of different materials. As an example, the first and second conductive layers 321 and 322 may comprise a SAC (Sn—Ag—Cu) material.

As an example, the first conductive layer 321 may comprise a first upper conductive layer 321*a* and a first lower conductive layer 321*b*. The first upper conductive layer 321*a* may be provided at an upper region of the first opening TH1. The first lower conductive layer 321*b* may be provided at a lower region of the first opening TH1.

In addition, the second conductive layer 322 may comprise a second upper conductive layer 322*a* and a second lower conductive layer 322*b*. The second upper conductive layer 322*a* may be provided at an upper region of the second opening TH2. The second lower conductive layer 322*b* may be provided at a lower region of the second opening TH2.

According to an embodiment, the first upper conductive layer 321*a* and the first lower conductive layer 321*b* may comprise different materials. The first upper conductive layer 321*a* and the first lower conductive layer 321*b* may have different melting points. As an example, the melting point of the first upper conductive layer 321*a* may be selected to be higher than that of the first lower conductive layer 321*b*.

For example, a conductive paste forming the first upper conductive layer 321*a* and a conductive paste forming the first lower conductive layer 321*b* may be provided differently. According to an embodiment, the first upper conductive layer 321*a* may be formed by using a silver paste, for example, and the first lower conductive layer 321*b* may be formed by using a solder paste.

According to an embodiment, when the first upper conductive layer 321*a* is formed with the silver paste, a degree to which the silver paste provided at the first opening TH1 is diffused and permeated between the first pad electrode 121 and the first frame 111 was detected as weak or absent.

Therefore, when the first upper conductive layer 321*a* is formed with silver paste, it is possible to prevent the light emitting device 120 from being short-circuited or deteriorated.

In addition, when the first upper conductive layer 321*a* is formed with the silver paste and the first lower conductive layer 321*b* is formed with the solder paste, as compared with the case in which the entire first conductive layer 321 is formed with the silver paste, a manufacturing cost may be reduced.

Similarly, the conductive paste forming the second upper conductive layer 322*a* and the conductive paste forming the second lower conductive layer 322*b* may be provided differently. According to an embodiment, the second upper conductive layer 322*a* may be formed by using a silver paste, for example, and the second lower conductive layer 322*b* may be formed by using a solder paste.

According to an embodiment, when the second upper conductive layer 322*a* is formed with the silver paste, a degree to which the silver paste provided at the second opening TH2 is diffused and permeated between the second pad electrode 122 and the second frame 112 was detected as weak or absent.

Therefore, when the second upper conductive layer 322*a* is formed with silver paste, it is possible to prevent the light emitting device 120 from being short-circuited or deteriorated.

In addition, when the second upper conductive layer 322*a* is formed with the silver paste and the second lower conductive layer 322*b* is formed with the solder paste, as compared with the case in which the entire second conductive layer 322 is formed with the silver paste, a manufacturing cost may be reduced.

Meanwhile, as shown in FIG. 22, the light emitting device package 100 according to the embodiment may comprise a first lower recess R10 and a second lower recess R20. The first lower recess R10 and the second lower recess R20 may be disposed to be spaced apart from each other.

The first lower recess R10 may be provided at the lower surface of the first frame 111. The first lower recess R10 may be provided to concave from the lower surface of the first frame 111 toward the upper surface thereof. The first lower recess R10 may be disposed to be spaced apart from the first opening TH1.

The first lower recess R10 may be provided with a width of several micrometers to several tens of micrometers. A resin portion may be provided at the first lower recess R10. The resin portion filled at the first lower recess R10 may be provided with, as an example, the same material as the body 113.

As an example, the resin portion filled at the first lower recess R10 may be provided in a process in which the first frame 111, the second frame 112, and the body 113 are formed through an injection process or the like.

The resin portion filled at the first lower recess R10 may be disposed around a lower surface region of the first frame 111 in which the first opening TH1 is provided. The lower surface region of the first frame 111 in which the first opening TH1 is provided may be disposed to be separated from the lower surface forming the first frame 111 therearound in a shape of an island.

As an example, as shown in FIG. 2, the lower surface region of the first frame 111 in which the first opening TH1 is provided may be isolated from the first frame 111 therearound by a resin portion filled at the first lower recess R10 and the body 113.

Therefore, it is possible to prevent the first conductive layer 321 provided in the first opening TH1 from being moved from the first opening TH1 and diffused over the resin portion filled at the first lower recess R10 or the body 113.

Accordingly, it is possible to prevent the first conductive layer 321 from overflowing or extending an outside of a region in which the resin portion or the body 113 is provided, so that the first conductive layer 321 may be stably disposed in a region in which the first opening TH1 is provided. In addition, the first conductive layer 321 may be stably connected to the lower surface of the first pad electrode 121 in the first opening TH1.

In addition, the second lower recess R20 may be provided at the lower surface of the second frame 112. The second lower recess R20 may be provided to concave from the lower surface of the second frame 112 toward the upper surface thereof. The second lower recess R20 may be disposed to be spaced apart from the second opening TH2.

The second lower recess R20 may be provided with a width of several micrometers to several tens of micrometers.

A resin portion may be provided at the second lower recess R20. The resin portion filled at the second lower recess R20 may be provided with, as an example, the same material as the body 113.

As an example, the resin portion filled at the second lower recess R20 may be provided in a process in which the first frame 111, the second frame 112, and the body 113 are formed through an injection process or the like.

The resin portion filled at the second lower recess R20 may be disposed around a lower surface region of the second frame 112 in which the second opening TH2 is provided. The lower surface region of the second frame 112 in which the second opening TH2 is provided may be disposed to be separated from the lower surface forming the second frame 112 therearound in a shape of an island.

As an example, as shown in FIG. 2, the lower surface region of the second frame 112 in which the second opening TH2 is provided may be isolated from the second frame 112 therearound by a resin portion filled at the second lower recess R20 and the body 113.

Therefore, it is possible to prevent the second conductive layer 322 provided in the second opening TH2 from being moved from the second opening TH2 and diffused over the resin portion filled at the second lower recess R20 or the body 113.

Accordingly, it is possible to prevent the second conductive layer 322 from overflowing or extending an outside of a region in which the resin portion or the body 113 is provided, so that the second conductive layer 322 may be stably disposed in a region in which the second opening TH2 is provided. In addition, the second conductive layer 322 may be stably connected to the lower surface of the second pad electrode 122 in the second opening TH2.

In addition, the light emitting device package 100 according to the embodiment may comprise a resin portion 135, as shown in FIG. 22.

The resin portion 135 may be disposed between the first frame 111 and the light emitting device 120. The resin portion 135 may be disposed between the second frame 112 and the light emitting device 120. The resin portion 135 may be provided at the bottom surface of the cavity C provided in the package body 110.

The resin portion 135 may be disposed on the side surface of the first pad electrode 121. The resin portion 135 may be disposed on the side surface of the second pad electrode 122. The resin portion 135 may be disposed under the semiconductor structure 123.

As an example, the resin portion 135 may comprise at least one of an epoxy-based material, a silicone-based material, and a hybrid material comprising an epoxy-based material and a silicone-based material. In addition, the resin portion 135 may be a reflective part that reflects light emitted from the light emitting device 120, as an example, a resin containing a reflective material such as $TiO_2$. The resin portion 135 may comprise white silicone.

The resin portion 135 may be disposed under the light emitting device 120 to perform a sealing function. In addition, the resin portion 135 may improve adhesion force between the light emitting device 120 and the first frame 111. In addition, the resin portion 135 may improve adhesion force between the light emitting device 120 and the second frame 112.

The resin portion 135 may seal around the first pad electrode 121 and the second pad electrode 122. The resin portion 135 may prevent the first conductive layer 321 and the second conductive layer 322 from being moved from the first opening TH1 region and the second opening TH2 region, and diffusing and moving toward the light emitting device 120.

In addition, when the resin portion 135 comprises a material having a reflective property such as white silicone, the resin portion 135 may reflect light emitted from the light emitting device 120 toward an upper direction of the package body 110, thereby improving the light extraction efficiency of the light emitting device package 100.

In addition, the light emitting device package 100 according to the embodiment may comprise a molding part 140, as shown in FIG. 22.

The molding part 140 may be provided on the light emitting device 120. The molding part 140 may be disposed on the first frame 111 and the second frame 112. The molding part 140 may be disposed at the cavity C provided by the package body 110. The molding part 140 may disposed on the resin portion 135.

In addition, according to another example of the light emitting device package according to the embodiment of the present invention, the resin portion 135 may not be provided separately, and the adhesive 130 may be provided at the periphery of the first and second pad electrodes 121 and 122.

At this point, the adhesive 130 may be referred to as a first resin, and the first and second pad electrodes 121 and 122 may be referred to as first and second bonding parts, respectively.

Meanwhile, the adhesive 130 may be disposed at the upper region of the first and second openings TH1 and TH2. A part of the adhesive 130 may be moved to the first and second openings TH1 and TH2 in a process in which the light emitting device 120 is provided on the package body 110. A part of the adhesive 130 may be disposed at a side surface region of the first and second pad electrodes 121 and 122 in the first and second openings TH1 and TH2. A part of the adhesive 130 may be disposed on the first and second conductive layers 321 and 322 in the first and second openings TH1 and TH2.

The adhesive 130 may seal the upper region of the first and second openings TH1 and TH2, and prevent moisture or foreign substance from flowing from outside into a region in which the light emitting device 120 is disposed through the first and second openings TH1 and TH2.

In addition, when a space for providing the adhesive 130 between the light emitting device 120 and the package body 110 is sufficiently secured, the recess R may not be provided on the upper surface of the package body 110.

Meanwhile, according to the light emitting device package 100 according to the embodiment described above, the first frame 111 may comprise a lower recess provided at a lower surface and an upper recess provided at an upper surface. As an example, the first frame 111 may comprise at least one lower recess provided at a lower surface. In addition, the first frame 111 may comprise at least one upper recess provided at an upper surface. In addition, the first frame 111 may comprise at least one upper recess provided at the upper surface and at least one lower recess provided at the lower surface. In addition, the first frame 111 may be provided with a structure in which recesses are not formed at the upper surface and the lower surface.

Similarly, the second frame 112 may comprise at least one lower recess provided at a lower surface. In addition, the second frame 112 may comprise at least one upper recess provided at an upper surface. In addition, the second frame 112 may comprise at least one upper recess provided at the upper surface and at least one lower recess provided at the lower surface. In addition, the second frame 112 may be provided with a structure in which recesses are not formed at the upper surface and the lower surface.

In the light emitting device package 100 according to the embodiment, power may be connected to the first pad electrode 121 through the region of the first opening TH1, and power may be connected to the second pad electrode 122 through the region of the second opening TH2.

Accordingly, the light emitting device 120 may be driven by the driving power supplied through the first pad electrode 121 and the second pad electrode 122. In addition, the light emitted from the light emitting device 120 may be provided in the upper direction of the package body 110.

Meanwhile, the light emitting device package 100 according to an embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided in the light emitting device package, so that stability of electrical connection and physical coupling may be weakened.

However, according to the light emitting device package and a manufacturing method of the light emitting device package according to an embodiment, the first pad electrode and the second pad electrode of the light emitting device according to the embodiment may be provided with driving power by the conductive layers disposed in the openings. In addition, the melting point of the conductive layers disposed in the openings may be selected so as to have a higher value than that of the general bonding material.

Therefore, since the light emitting device package 100 according to the embodiment does not cause a re-melting phenomenon even when the light emitting device package 100 is bonded to the main substrate by a reflow process, the electrical connection and the physical bonding force may not be deteriorated.

In addition, according to the light emitting device package 100 and the manufacturing method of the light emitting device package according to an embodiment, the package body 110 does not need to be exposed to a high temperature in the manufacturing process of the light emitting device package. Therefore, according to an embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphthalamide (PPA) resin, polycyclohexylenedimethylene terephthalate (PCT) resin, epoxy molding compound (EMC) resin, and silicone molding compound (SMC) resin.

Meanwhile, the light emitting device package 100 according to the embodiment described above referring to FIGS. 1 to 22 may be supplied and mounted on a submount, a circuit board, or the like.

Then, another example of the light emitting device package according to an embodiment of the present invention will be described with reference to FIG. 23.

Figure 23:
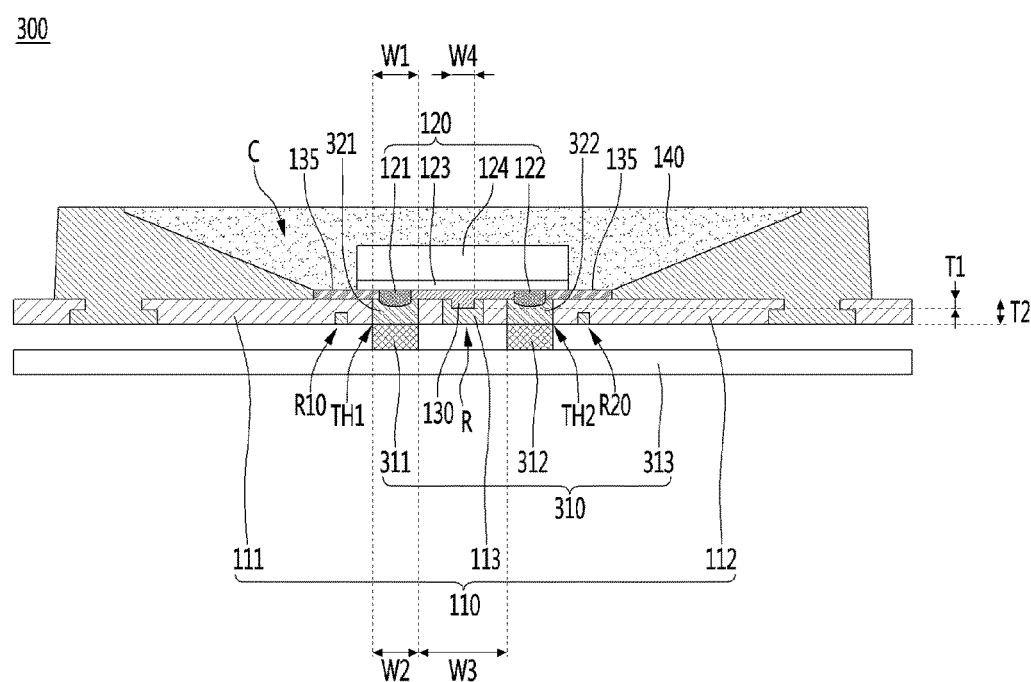
FIG. 23 is a view illustrating still another example of a light emitting device package according to an embodiment of the present invention.

The light emitting device package 300 according to an embodiment of the present invention shown in FIG. 23 is an example in which the light emitting device package 100 described with reference to FIGS. 1 to 22 is mounted on a circuit board 310 and supplied.

In describing the manufacturing method of the light emitting device package 300 according to an embodiment of the present invention with reference to FIG. 23, the description overlapping with the contents described with reference to FIGS. 1 to 22 may be omitted.

The light emitting device package 300 according to an embodiment may comprise a circuit board 310, a package body 110, and a light emitting device 120, as shown in FIG. 23.

The circuit board 310 may comprise a first pad 311, a second pad 312, and a substrate 313. The substrate 313 may be provided with a power supply circuit configured to control driving of the light emitting device 120.

The package body 110 may be disposed on the circuit board 310. The first pad 311 and the first pad electrode 121 may be electrically connected to each other. The second pad 312 and the second pad electrode 122 may be electrically connected to each other.

The first pad 311 and the second pad 312 may comprise a conductive material. For example, the first pad 311 and the second pad 312 may comprise one material selected from the group consisting of Ti, Cu, Ni, Au, Cr, Ta, Pt, Sn, Ag, P, Fe, Sn, Zn, and Al or an alloy thereof. The first pad 311 and the second pad 312 may be provided as a single layer or multiple layers.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112. The body 113 may perform a function as a kind of electrode separation line.

The first frame 111 and the second frame 112 may be provided as an insulating frame. The first frame 111 and the second frame 112 may stably provide a structural strength of the package body 110.

In addition, the first frame 111 and the second frame 112 may be provided as a conductive frame. The first frame 111 and the second frame 112 may stably provide the structural strength of the package body 110 and may be electrically connected to the light emitting device 120.

The package body 110 may comprise a first opening TH1 and a second opening TH2 passing through the first direction from the upper surface to the lower surface thereof. The first frame 111 may comprise the first opening TH1. The second frame 112 may comprise the second opening TH2.

The first opening TH1 may be provided at the first frame 111. The first opening TH1 may be provided by passing through the first frame 111. The first opening TH1 may be provided by passing through an upper surface and a lower surface of the first frame 111 in a first direction.

The first opening TH1 may be disposed under the first pad electrode 121 of the light emitting device 120. The first opening TH1 may be provided to be overlapped with the first pad electrode 121 of the light emitting device 120. The first opening TH1 may be provided to be overlapped with the first pad electrode 121 of the light emitting device 120 in the first direction from the upper surface of the first frame 111 toward the lower surface thereof.

The second opening TH2 may be provided at the second frame 112. The second opening TH2 may be provided by passing through the second frame 112. The second opening TH2 may be provided by passing through an upper surface and a lower surface of the second frame 112 in a first direction.

The second opening TH2 may be disposed under the second pad electrode 122 of the light emitting device 120. The second opening TH2 may be provided to be overlapped with the second pad electrode 122 of the light emitting device 120. The second opening TH2 may be provided to be overlapped with the second pad electrode 122 of the light emitting device 120 in the first direction from the upper surface of the second frame 112 toward the lower surface thereof.

The first opening TH1 and the second opening TH2 may be disposed to be spaced apart from each other. The first opening TH1 and the second opening TH2 may be disposed to be spaced apart from each other under the lower surface of the light emitting device 120.

According to the embodiment, a width W1 of an upper region of the first opening TH1 may be greater than that of the first pad electrode 121. In addition, a width of an upper region of the second opening TH2 may be greater than that of the second pad electrode 122.

According to the embodiment, a lower portion of the first pad electrode 121 may be disposed in the upper region of the first opening TH1. A bottom surface of the first pad electrode 121 may be disposed lower than the upper surface of the first frame 111.

In addition, a lower portion of the second pad electrode 122 may be disposed in the upper region of the second opening TH2. A bottom surface of the second pad electrode 122 may be disposed lower than the upper surface of the second frame 112.

The light emitting device package 300 according to the embodiment may comprise an adhesive 130, as shown in FIG. 23.

The adhesive 130 may be disposed between the body 113 and the light emitting device 120. The adhesive 130 may be disposed between an upper surface of the body 113 and a lower surface of the light emitting device 120.

In addition, the light emitting device package 300 according to the embodiment may comprise a recess R, as shown in FIG. 23.

The recess R may be provided at the body 113. The recess R may be provided between the first opening TH1 and the second opening TH2. The recess R may be provided to concave from the upper surface of the body 113 toward the lower surface thereof. The recess R may be disposed under the light emitting device 120. The recess R may be provided to be overlapped with the light emitting device 120 in the first direction.

As an example, the adhesive 130 may be disposed in the recess R. The adhesive 130 may be disposed between the light emitting device 120 and the body 113. The adhesive 130 may be disposed between the first pad electrode 121 and the second pad electrode 122. As an example, the adhesive 130 may be disposed in contact with a side surface of the first pad electrode 121 and a side surface of the second pad electrode 122.

The adhesive 130 may provide a stable fixing force between the light emitting device 120 and the package body 110. The adhesive 130 may provide a stable fixing force between the light emitting device 120 and the body 113. The adhesive 130 may be disposed, as an example, in direct contact with the upper surface of the body 113. In addition, the adhesive 130 may be disposed in direct contact with the lower surface of the light emitting device 120.

As an example, the adhesive 130 may comprise at least one of an epoxy-based material, a silicone-based material, and a hybrid material comprising an epoxy-based material and a silicone-based material. As an example, the adhesive 130 may comprise a white silicone. The adhesive 130 may be referred to as a first resin as another representation.

The adhesive 130 may provide a stable fixing force between the body 113 and the light emitting device 120. When light is emitted to the lower surface of the light emitting device 120, the adhesive 130 may provide a light diffusion function between the light emitting device 120 and the body 113. When the light is emitted from the light emitting device 120 to the lower surface of the light emitting device 120, the adhesive 130 may improve the light extraction efficiency of the light emitting device package 100 by providing the light diffusion function.

In addition, according to an embodiment, a sum of areas of the first and second pad electrodes 121 and 122 may be provided at 10% or less based on an area of an upper surface of the substrate 124. According to the light emitting device package according to the embodiment, the sum of the areas of the first and second pad electrodes 121 and 122 may be set at 10% or less based on the area of the upper surface of the substrate 124 in order to secure a light emitting area emitted from the light emitting device and increase light extraction efficiency.

In addition, according to an embodiment, the sum of the areas of the first and second pad electrodes 121 and 122 may be provided at 0.7% or more based on the area of the upper surface of the substrate 124. According to the light emitting device package according to an embodiment, the sum of the areas of the first and second pad electrodes 121 and 122 may be set at 0.7% or more based on the area of the upper surface of the substrate 124 in order to provide a stable bonding force to the light emitting device to be mounted.

According to the embodiment, an area where the adhesive 130 is overlapped with the light emitting device 120 based on the first direction may be provided to be larger than that of a region where the first and second openings TH1 and TH2 are overlapped with the first and second pad electrodes 121 and 122.

As described above, as the area of the first and second pad electrodes 121 and 122 is provided to be small, an amount of light transmitted to the lower surface of the light emitting device 120 may be increased. In addition, the adhesive 130 having a good reflection characteristic may be provided under the light emitting device 120. Therefore, the light emitted in a downwards direction of the light emitting device 120 is reflected at the adhesive 130, and is effectively emitted toward an upper direction of the light emitting device package 100, so that the light extraction efficiency may be improved.

In addition, the light emitting device package 300 according to the embodiment may comprise a first conductive layer 321 and a second conductive layer 322, as shown in FIG. 23. The first conductive layer 321 may be disposed to be spaced apart from the second conductive layer 322.

The first conductive layer 321 may be provided at the first opening TH1. The first conductive layer 321 may be disposed under the first pad electrode 121. A width of the first conductive layer 321 may be provided to be greater than that of the first pad electrode 121.

The first pad electrode 121 may have a width of a second direction perpendicular to the first direction in which the first opening TH1 is formed. The width of the first pad electrode 121 may be provided to be smaller than that of the second direction of the first opening TH1.

The first conductive layer 321 may be disposed in direct contact with the lower surface of the first pad electrode 121. The first conductive layer 321 may be electrically connected to the first pad electrode 121. The first conductive layer 321 may be disposed to be surrounded by the first frame 111.

In the upper region of the first opening TH1, an upper portion of the first conductive layer 321 may be disposed at the periphery of a lower portion of the first pad electrode 121. The upper surface of the first conductive layer 321 may be disposed to be higher than the lower surface of the first pad electrode 121.

The second conductive layer 322 may be provided at the second opening TH2. The second conductive layer 322 may be disposed under the second pad electrode 122. A width of the second conductive layer 322 may be provided to be greater than that of the second pad electrode 122.

The second pad electrode 122 may have a width of a second direction perpendicular to the first direction in which the second opening TH2 is formed. The width of the second pad electrode 122 may be provided to be smaller than that of the second direction of the second opening TH2.

The second conductive layer 322 may be disposed in direct contact with the lower surface of the second pad electrode 122. The second conductive layer 322 may be electrically connected to the second pad electrode 122. The second conductive layer 322 may be disposed to be surrounded by the second frame 112.

In the upper region of the second opening TH2, an upper portion of the second conductive layer 322 may be disposed at the periphery of a lower portion of the second pad electrode 122. The upper surface of the second conductive layer 322 may be disposed to be higher than the lower surface of the second pad electrode 122.

The first conductive layer 321 and the second conductive layer 322 may comprise one material selected from the group consisting of Ag, Au, Pt, Sn, Cu or an alloy thereof. However, the present invention is not limited thereto, and a material capable of securing a conductive function may be used in the first conductive layer 321 and the second conductive layer 322.

As an example, the first conductive layer 321 and the second conductive layer 322 may be formed by using a conductive paste. The conductive paste may comprise a solder paste, a silver paste, or the like, and may be composed of multiple layers or a single layer composed of multiple layers or alloys composed of different materials. As an example, the first and second conductive layers 321 and 322 may comprise a SAC (Sn—Ag—Cu) material.

According to an embodiment, the first pad 311 of the circuit board 310 and the first conductive layer 321 may be electrically connected. In addition, the second pad 312 of the circuit board 310 and the second conductive layer 322 may be electrically connected.

Meanwhile, according to the embodiment, a separate bonding layer may be additionally provided between the first pad 311 and the first conductive layer 321. In addition, a separate bonding layer may be additionally provided between the second pad 312 and the second conductive layer 322.

Further, according to another embodiment, the first conductive layer 321 and the second conductive layer 322 may be mounted on the circuit board 310 by eutectic bonding.

The light emitting device package 300 according to an embodiment described with reference to FIG. 23 is configured such that the power supplied from the circuit board 310 is supplied through the first conductive layer 321 and the second conductive layer 322 to the first pad electrode 121 and the second pad electrode 122, respectively. At this point, the first pad 311 and the first conductive layer 321 of the circuit board 310 are in direct contact with each other and the second pad 312 and the second conductive layer 322 of the circuit board 310 are directly contacted.

Therefore, according to the light emitting device package 300 according to the embodiment shown in FIG. 23, the first frame 111 and the second frame 112 may be formed with an insulating frame. In addition, according to the light emitting device package 300 according to the embodiment shown in FIG. 23, the first frame 111 and the second frame 112 may be formed with a conductive frame.

As described above, according to the light emitting device package and a manufacturing method of the light emitting device package according to the embodiment, the first pad electrode and the second pad electrode of the light emitting device according to the embodiment may be provided with driving power by the conductive layers disposed in the openings. In addition, the melting point of the conductive layers disposed in the openings may be selected so as to have a higher value than that of the general bonding material.

Therefore, since the light emitting device package 100 according to the embodiment does not cause a re-melting phenomenon even when the light emitting device package 100 is bonded to the main substrate by a reflow process, the electrical connection and the physical bonding force may not be deteriorated.

In addition, according to the light emitting device package 100 and the manufacturing method of the light emitting device package according to an embodiment, the package body 110 does not need to be exposed to a high temperature in the manufacturing process of the light emitting device package. Therefore, according to an embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphthalamide (PPA) resin, polycyclohexylenedimethylene terephthalate (PCT) resin, epoxy molding compound (EMC) resin, and silicone molding compound (SMC) resin.

Figure 24:
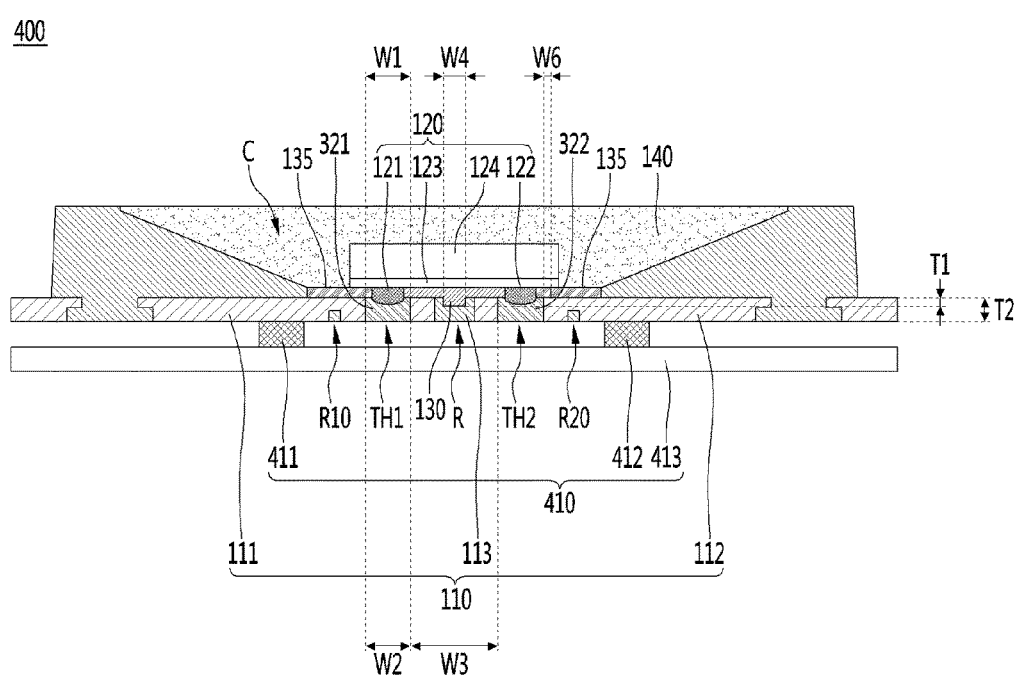
FIG. 24 is a view illustrating still another example of a light emitting device package according to an embodiment of the present invention.

Meanwhile, the light emitting device package 400 according to an embodiment of the present invention shown in FIG. 24 is an example in which the light emitting device package 100 described with reference to FIGS. 1 to 22 is mounted on a circuit board 410 and supplied.

In describing the manufacturing method of the light emitting device package 400 according to an embodiment of the present invention with reference to FIG. 24, the description overlapping with the contents described with reference to FIGS. 1 to 23 may be omitted.

The light emitting device package 400 according to an embodiment may comprise a circuit board 410, a package body 110, and a light emitting device 120, as shown in FIG. 24.

The circuit board 410 may comprise a first pad 411, a second pad 412, and a substrate 413. The substrate 413 may be provided with a power supply circuit configured to control driving of the light emitting device 120.

The package body 110 may be disposed on the circuit board 310. The first pad 311 and the first pad electrode 121 may be electrically connected to each other. The second pad 312 and the second pad electrode 122 may be electrically connected to each other.

The first pad 311 and the second pad 312 may comprise a conductive material. For example, the first pad 311 and the second pad 312 may comprise one material selected from the group consisting of Ti, Cu, Ni, Au, Cr, Ta, Pt, Sn, Ag, P, Fe, Sn, Zn, and Al or an alloy thereof. The first pad 311 and the second pad 312 may be provided as a single layer or multiple layers.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112. The body 113 may perform a function as a kind of electrode separation line.

The first frame 111 and the second frame 112 may be provided as a conductive frame. The first frame 111 and the second frame 112 may stably provide the structural strength of the package body 110 and may be electrically connected to the light emitting device 120.

The package body 110 may comprise a first opening TH1 and a second opening TH2 passing through the first direction from the upper surface to the lower surface thereof. The first frame 111 may comprise the first opening TH1. The second frame 112 may comprise the second opening TH2.

The first opening TH1 may be provided at the first frame 111. The first opening TH1 may be provided by passing through the first frame 111. The first opening TH1 may be provided by passing through an upper surface and a lower surface of the first frame 111 in a first direction.

The first opening TH1 may be disposed under the first pad electrode 121 of the light emitting device 120. The first opening TH1 may be provided to be overlapped with the first pad electrode 121 of the light emitting device 120. The first opening TH1 may be provided to be overlapped with the first pad electrode 121 of the light emitting device 120 in the first direction from the upper surface of the first frame 111 toward the lower surface thereof.

The second opening TH2 may be provided at the second frame 112. The second opening TH2 may be provided by passing through the second frame 112. The second opening TH2 may be provided by passing through an upper surface and a lower surface of the second frame 112 in a first direction.

The second opening TH2 may be disposed under the second pad electrode 122 of the light emitting device 120. The second opening TH2 may be provided to be overlapped with the second pad electrode 122 of the light emitting device 120. The second opening TH2 may be provided to be overlapped with the second pad electrode 122 of the light emitting device 120 in the first direction from the upper surface of the second frame 112 toward the lower surface thereof.

The first opening TH1 and the second opening TH2 may be disposed to be spaced apart from each other. The first opening TH1 and the second opening TH2 may be disposed to be spaced apart from each other under the lower surface of the light emitting device 120.

According to the embodiment, a width W1 of an upper region of the first opening TH1 may be greater than that of the first pad electrode 121. In addition, a width of an upper region of the second opening TH2 may be greater than that of the second pad electrode 122.

According to the embodiment, a lower portion of the first pad electrode 121 may be disposed in the upper region of the first opening TH1. A bottom surface of the first pad electrode 121 may be disposed lower than the upper surface of the first frame 111.

In addition, a lower portion of the second pad electrode 122 may be disposed in the upper region of the second opening TH2. A bottom surface of the second pad electrode 122 may be disposed lower than the upper surface of the second frame 112.

The light emitting device package 400 according to the embodiment may comprise an adhesive 130, as shown in FIG. 24.

The adhesive 130 may be disposed between the body 113 and the light emitting device 120. The adhesive 130 may be disposed between an upper surface of the body 113 and a lower surface of the light emitting device 120.

In addition, the light emitting device package 400 according to the embodiment may comprise a recess R, as shown in FIG. 24.

The recess R may be provided at the body 113. The recess R may be provided between the first opening TH1 and the second opening TH2. The recess R may be provided to concave from the upper surface of the body 113 toward the lower surface thereof. The recess R may be disposed under the light emitting device 120. The recess R may be provided to be overlapped with the light emitting device 120 in the first direction.

As an example, the adhesive 130 may be disposed in the recess R. The adhesive 130 may be disposed between the light emitting device 120 and the body 113. The adhesive 130 may be disposed between the first pad electrode 121 and the second pad electrode 122. As an example, the adhesive 130 may be disposed in contact with a side surface of the first pad electrode 121 and a side surface of the second pad electrode 122.

The adhesive 130 may provide a stable fixing force between the light emitting device 120 and the package body 110. The adhesive 130 may provide a stable fixing force between the light emitting device 120 and the body 113. The adhesive 130 may be disposed, as an example, in direct contact with the upper surface of the body 113. In addition, the adhesive 130 may be disposed in direct contact with the lower surface of the light emitting device 120.

As an example, the adhesive 130 may comprise at least one of an epoxy-based material, a silicone-based material, and a hybrid material comprising an epoxy-based material and a silicone-based material. As an example, the adhesive 130 may comprise a white silicone. The adhesive 130 may be referred to as a first resin as another representation.

The adhesive 130 may provide a stable fixing force between the body 113 and the light emitting device 120. When light is emitted to the lower surface of the light emitting device 120, the adhesive 130 may provide a light diffusion function between the light emitting device 120 and the body 113. When the light is emitted from the light emitting device 120 to the lower surface of the light emitting device 120, the adhesive 130 may improve the light extraction efficiency of the light emitting device package 100 by providing the light diffusion function.

In addition, according to an embodiment, a sum of areas of the first and second pad electrodes 121 and 122 may be provided at 10% or less based on an area of an upper surface of the substrate 124. According to the light emitting device package according to the embodiment, the sum of the areas of the first and second pad electrodes 121 and 122 may be set at 10% or less based on the area of the upper surface of the substrate 124 in order to secure a light emitting area emitted from the light emitting device and increase light extraction efficiency.

In addition, according to an embodiment, the sum of the areas of the first and second pad electrodes 121 and 122 may be provided at 0.7% or more based on the area of the upper surface of the substrate 124. According to the light emitting device package according to an embodiment, the sum of the areas of the first and second pad electrodes 121 and 122 may be set at 0.7% or more based on the area of the upper surface of the substrate 124 in order to provide a stable bonding force to the light emitting device to be mounted.

According to the embodiment, an area where the adhesive 130 is overlapped with the light emitting device 120 based on the first direction may be provided to be larger than that of a region where the first and second openings TH1 and TH2 are overlapped with the first and second pad electrodes 121 and 122.

As described above, as the area of the first and second pad electrodes 121 and 122 is provided to be small, an amount of light transmitted to the lower surface of the light emitting device 120 may be increased. In addition, the adhesive 130 having a good reflection characteristic may be provided under the light emitting device 120. Therefore, the light emitted in a downwards direction of the light emitting device 120 is reflected at the adhesive 130, and is effectively emitted toward an upper direction of the light emitting device package 100, so that the light extraction efficiency may be improved.

In addition, the light emitting device package 400 according to the embodiment may comprise a first conductive layer 321 and a second conductive layer 322, as shown in FIG. 24. The first conductive layer 321 may be disposed to be spaced apart from the second conductive layer 322.

The first conductive layer 321 may be provided at the first opening TH1. The first conductive layer 321 may be disposed under the first pad electrode 121. A width of the first conductive layer 321 may be provided to be greater than that of the first pad electrode 121.

The first pad electrode 121 may have a width of a second direction perpendicular to the first direction in which the first opening TH1 is formed. The width of the first pad electrode 121 may be provided to be smaller than that of the second direction of the first opening TH1.

The first conductive layer 321 may be disposed in direct contact with the lower surface of the first pad electrode 121. The first conductive layer 321 may be electrically connected to the first pad electrode 121. The first conductive layer 321 may be disposed to be surrounded by the first frame 111.

In the upper region of the first opening TH1, an upper portion of the first conductive layer 321 may be disposed at the periphery of a lower portion of the first pad electrode 121. The upper surface of the first conductive layer 321 may be disposed to be higher than the lower surface of the first pad electrode 121.

The second conductive layer 322 may be provided at the second opening TH2. The second conductive layer 322 may be disposed under the second pad electrode 122. A width of the second conductive layer 322 may be provided to be greater than that of the second pad electrode 122.

The second pad electrode 122 may have a width of a second direction perpendicular to the first direction in which the second opening TH2 is formed. The width of the second pad electrode 122 may be provided to be smaller than that of the second direction of the second opening TH2.

The second conductive layer 322 may be disposed in direct contact with the lower surface of the second pad electrode 122. The second conductive layer 322 may be electrically connected to the second pad electrode 122. The second conductive layer 322 may be disposed to be surrounded by the second frame 112.

In the upper region of the second opening TH2, an upper portion of the second conductive layer 322 may be disposed at the periphery of a lower portion of the second pad electrode 122. The upper surface of the second conductive layer 322 may be disposed to be higher than the lower surface of the second pad electrode 122.

The first conductive layer 321 and the second conductive layer 322 may comprise one material selected from the group consisting of Ag, Au, Pt, Sn, Cu or an alloy thereof. However, the present invention is not limited thereto, and a material capable of securing a conductive function may be used in the first conductive layer 321 and the second conductive layer 322.

As an example, the first conductive layer 321 and the second conductive layer 322 may be formed by using a conductive paste. The conductive paste may comprise a solder paste, a silver paste, or the like, and may be composed of multiple layers or a single layer composed of multiple layers or alloys composed of different materials. As an example, the first and second conductive layers 321 and 322 may comprise a SAC (Sn—Ag—Cu) material.

According to an embodiment, the first pad 411 of the circuit board 410 and the first conductive layer 321 may be electrically connected. In addition, the second pad 412 of the circuit board 410 and the second conductive layer 322 may be electrically connected.

The first pad 411 may be electrically connected to the first frame 111. Further, the second pad 412 may be electrically connected to the second frame 112.

Meanwhile, according to the embodiment, a separate bonding layer may be additionally provided between the first pad 411 and the first frame 111. In addition, a separate bonding layer may be additionally provided between the second pad 412 and the second frame 112.

The light emitting device package 400 according to an embodiment described with reference to FIG. 24 is configured such that the power supplied from the circuit board 410 is supplied through the first conductive layer 321 and the second conductive layer 322 to the first pad electrode 121 and the second pad electrode 122, respectively. At this point, the first pad 411 and the first frame 111 of the circuit board 410 are in direct contact with each other and the second pad 412 and the second frame 112 of the circuit board 410 are directly contacted.

As described above, according to the light emitting device package and a manufacturing method of the light emitting device package according to the embodiment, the first pad electrode and the second pad electrode of the light emitting device according to the embodiment may be provided with driving power by the conductive layers disposed in the openings. In addition, the melting point of the conductive layers disposed in the openings may be selected so as to have a higher value than that of the general bonding material.

Therefore, since the light emitting device package 100 according to the embodiment does not cause a re-melting phenomenon even when the light emitting device package 100 is bonded to the main substrate by a reflow process, the electrical connection and the physical bonding force may not be deteriorated.

In addition, according to the light emitting device package 100 and the manufacturing method of the light emitting device package according to an embodiment, the package body 110 does not need to be exposed to a high temperature in the manufacturing process of the light emitting device package. Therefore, according to an embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphthalamide (PPA) resin, polycyclohexylenedimethylene terephthalate (PCT) resin, epoxy molding compound (EMC) resin, and silicone molding compound (SMC) resin.

Meanwhile, in the case of the light emitting device package according to the embodiment described above, the light emitting device package is explained based on the case in which one opening is provided under each pad electrode.

However, according to a light emitting device package according to another embodiment, a plurality of openings may be provided under each pad electrode. In addition, the plurality of openings may be provided as openings having different widths.

Figure 25:
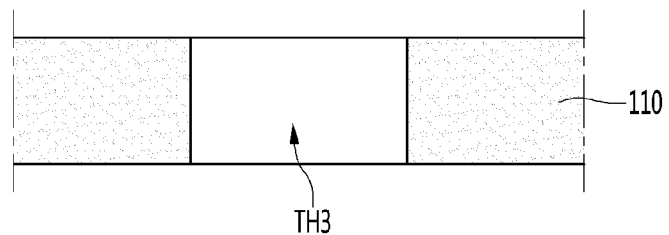
FIGS. 25 to 27 are views explaining a modified example of an opening applied to a light emitting device package according to an embodiment of the present invention.
Figure 26:
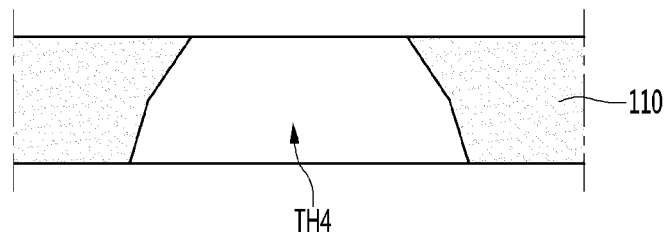
Figure 27:
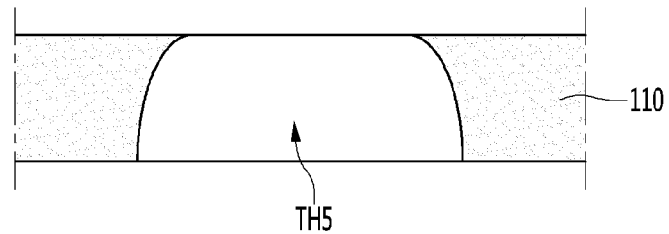

Further, a shape of the opening according to an embodiment may be provided in various shapes as shown in FIGS. 25 to 27.

For example, as shown in FIG. 25, the opening TH3 according to an embodiment may be provided with the same width from an upper region to a lower region thereof.

Furthermore, as shown in FIG. 26, the opening TH4 according to an embodiment may be provided in a shape of multi stepped structure. As an example, the opening TH4 may be provided in a shape having a different inclination angle of two stepped structure. In addition, the opening TH4 may be provided in a shape having a different inclination angle of two or more stepped structures.

Further, as shown in FIG. 27, the opening TH5 may be provided in a shape in which a width changes from an upper region to a lower region. As an example, the opening TH5 may be provided in a shape having a curvature from the upper region to the lower region.

In addition, according to the light emitting device package according to the embodiment described above, the package body 110 comprises only the support member in which an upper surface is flat, and may not be provided with a reflective part disposed to be inclined.

As another representation, according to the light emitting device package according to the embodiment, the package body 110 may be provided with a structure in which the cavity C is provided. Further, the package body 110 may be provided with a structure in which an upper surface is flat without providing the cavity C.

Furthermore, according to the light emitting device package according to the embodiment described above, although the first and second openings TH1 and TH2 are provided at the first and second frames 111 and 112 of the package body 110, the first and second openings TH1 and TH2 may be provided in the body 113 of the package body 110.

When the first and second openings TH1 and TH2 are provided in the body 113 of the package body 110 as described above, a length of the upper surface of the body 113 according to the major axis direction of the light emitting device 120 may be provided to be greater than a length between the first pad electrode 121 and the second pad electrode 122 of the light emitting device 120.

In addition, when the first and second openings TH1 and TH2 are provided in the body 113 of the package body 110, the light emitting device package according to the embodiment may not comprise the first and second frames 111 and 112.

Next, another example of a light emitting device package according to an embodiment of the present invention will be described with reference to FIG. 28.

In describing the light emitting device package according to the embodiment with reference to FIG. 28, the description of the contents overlapping with the contents described with reference to FIGS. 1 to 27 may be omitted.

Figure 28:
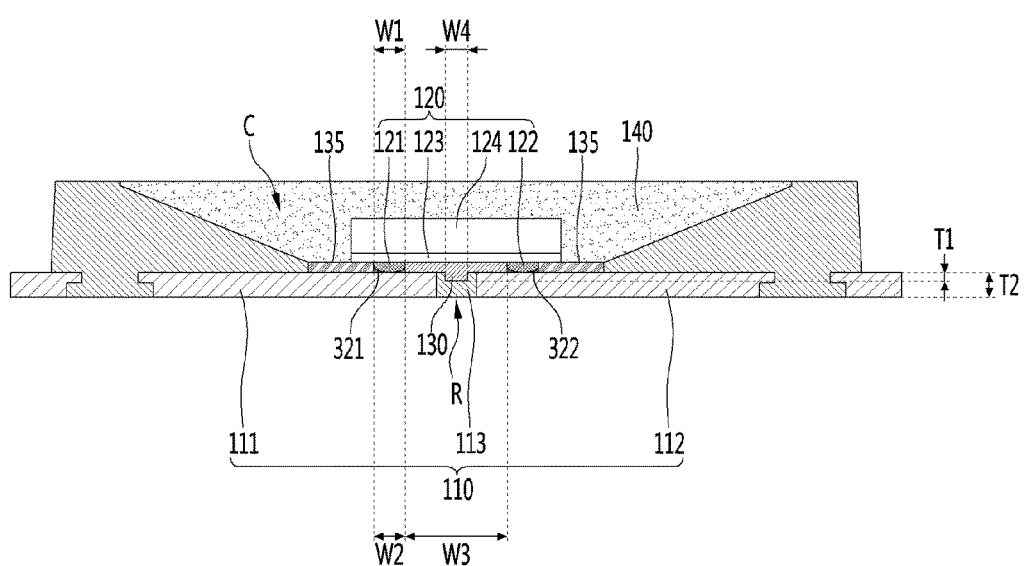
FIG. 28 is a view illustrating still another example of a light emitting device package according to an embodiment of the present invention.

The light emitting device package according to an embodiment may comprise a package body 110 and a light emitting device 120, as shown in FIG. 28.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112. The body 113 may perform a function as a kind of electrode separation line.

For example, the body 113 may be formed of at least one selected from the group consisting of polyphthalamide (PPA), polychloro tri phenyl (PCT), liquid crystal polymer (LCP), polyamide 9T (PA9T), silicone, epoxy molding compound (EMC), silicone molding compound (SMC), ceramic, photo sensitive glass (PSG), sapphire ($Al_2O_3$), and the like. In addition, the body 113 may comprise a high refractive index filler such as $TiO_2$ and $SiO_2$.

According to the embodiment, the light emitting device 120 may comprise a first pad electrode 121, a second pad electrode 122, a semiconductor structure 123, and a substrate 124.

The light emitting device 120 may comprise the semiconductor structure 123 disposed under the substrate 124, as shown in FIG. 28. The first pad electrode 121 and the second pad electrode 122 may be disposed between the semiconductor structure 123 and the body 113.

The light emitting device 120 may be disposed on the package body 110. The light emitting device 120 may be disposed on the first frame 111 and the second frame 112. The light emitting device 120 may be disposed in the cavity C provided by the package body 110.

The first pad electrode 121 may be disposed on a lower surface of the light emitting device 120. The second pad electrode 122 may be disposed on the lower surface of the light emitting device 120. The first pad electrode 121 and the second pad electrode 122 may be disposed to be spaced apart from each other on the lower surface of the light emitting device 120.

The first pad electrode 121 may be disposed on the first frame 111. The second pad electrode 122 may be disposed on the second frame 112.

The first pad electrode 121 may be disposed between the semiconductor structure 123 and the first frame 111. The second pad electrode 122 may be disposed between the semiconductor structure 123 and the second frame 112.

In addition, the light emitting device package according to the embodiment may comprise an adhesive 130.

The adhesive 130 may be disposed between the body 113 and the light emitting device 120. The adhesive 130 may be disposed between an upper surface of the body 113 and a lower surface of the light emitting device 120.

The light emitting device package according to the embodiment may comprise a recess R, as shown in FIG. 28.

The recess R may be provided at the body 113. The recess R may be provided to concave from the upper surface of the body 113 toward the lower surface thereof. The recess R may be disposed under the light emitting device 120. The recess R may be provided to be overlapped with the light emitting device 120 in the first direction.

As an example, the adhesive 130 may be disposed in the recess R. The adhesive 130 may be disposed between the light emitting device 120 and the body 113. The adhesive 130 may be disposed between the first pad electrode 121 and the second pad electrode 122. As an example, the adhesive 130 may be disposed in contact with a side surface of the first pad electrode 121 and a side surface of the second pad electrode 122.

The adhesive 130 may provide a stable fixing force between the light emitting device 120 and the package body 110. The adhesive 130 may provide a stable fixing force between the light emitting device 120 and the body 113. The adhesive 130 may be disposed, as an example, in direct contact with the upper surface of the body 113. In addition, the adhesive 130 may be disposed in direct contact with the lower surface of the light emitting device 120.

As an example, the adhesive 130 may comprise at least one of an epoxy-based material, a silicone-based material, and a hybrid material comprising an epoxy-based material and a silicone-based material. As an example, the adhesive 130 may comprise a white silicone. The adhesive 130 may be referred to as a first resin as another representation.

The adhesive 130 may provide a stable fixing force between the body 113 and the light emitting device 120. When light is emitted to the lower surface of the light emitting device 120, the adhesive 130 may provide a light diffusion function between the light emitting device 120 and the body 113. When the light is emitted from the light emitting device 120 to the lower surface of the light emitting device 120, the adhesive 130 may improve the light extraction efficiency of the light emitting device package 100 by providing the light diffusion function.

The recess R may provide a proper space in which a kind of under-filling process may be performed under the light emitting device 120. The recess R may be provided at a first depth or more so that the adhesive 130 may be sufficiently provided between the lower surface of the light emitting device 120 and the upper surface of the body 113. In addition, the recesses R may be provided at a second depth or less to provide a stable strength of the body 113.

In addition, according to an embodiment, a sum of areas of the first and second pad electrodes 121 and 122 may be provided at 10% or less based on an area of an upper surface of the substrate 124. According to the light emitting device package according to the embodiment, the sum of the areas of the first and second pad electrodes 121 and 122 may be set at 10% or less based on the area of the upper surface of the substrate 124 in order to secure a light emitting area emitted from the light emitting device and increase light extraction efficiency.

In addition, according to an embodiment, the sum of the areas of the first and second pad electrodes 121 and 122 may be provided at 0.7% or more based on the area of the upper surface of the substrate 124. According to the light emitting device package according to an embodiment, the sum of the areas of the first and second pad electrodes 121 and 122 may be set at 0.7% or more based on the area of the upper surface of the substrate 124 in order to provide a stable bonding force to the light emitting device to be mounted.

As described above, as the area of the first and second pad electrodes 121 and 122 is provided to be small, an amount of light transmitted to the lower surface of the light emitting device 120 may be increased. In addition, the adhesive 130 having a good reflection characteristic may be provided under the light emitting device 120. Therefore, the light emitted in a downwards direction of the light emitting device 120 is reflected at the adhesive 130, and is effectively emitted toward an upper direction of the light emitting device package 100, so that the light extraction efficiency may be improved.

In addition, the light emitting device package according to an embodiment may comprise a first conductive layer 321 and a second conductive layer 322. The first conductive layer 321 may be disposed to be spaced apart from the second conductive layer 322.

The first conductive layer 321 may be provided on the first frame 111. The first conductive layer 321 may be disposed under the first pad electrode 121.

The first conductive layer 321 may be disposed in direct contact with the lower surface of the first pad electrode 121. The first conductive layer 321 may be electrically connected to the first pad electrode 121. The first conductive layer 321 may provide with a function of fixing the first pad electrode 121 and the first frame 111 to each other.

The second conductive layer 322 may be provided on the second frame 112. The second conductive layer 322 may be disposed under the second pad electrode 122.

The second conductive layer 322 may be disposed in direct contact with the lower surface of the second pad electrode 122. The second conductive layer 322 may be electrically connected to the second pad electrode 122. The second conductive layer 322 may provide with a function of fixing the second pad electrode 122 and the second frame 112 to each other.

The first conductive layer 321 and the second conductive layer 322 may comprise one material selected from the group consisting of Ag, Au, Pt, Sn, Cu or an alloy thereof. However, the present invention is not limited thereto, and a material capable of securing a conductive function may be used in the first conductive layer 321 and the second conductive layer 322.

As an example, the first conductive layer 321 and the second conductive layer 322 may be formed by using a conductive paste. The conductive paste may comprise a solder paste, a silver paste, or the like, and may be composed of multiple layers or a single layer composed of multiple layers or alloys composed of different materials. As an example, the first and second conductive layers 321 and 322 may comprise a SAC (Sn—Ag—Cu) material.

In addition, the light emitting device package according to an embodiment may comprise a resin portion 135, as shown in FIG. 28.

The resin portion 135 may be disposed at a side surface of the first pad electrode 121. The resin portion 135 may be disposed at a side surface of the second pad electrode 122. The resin portion 135 may be disposed under the semiconductor structure 123.

As an example, the resin portion 135 may comprise at least one of an epoxy-based material, a silicone-based material, and a hybrid material comprising an epoxy-based material and a silicone-based material. In addition, the resin portion 135 may comprise a reflective material such as $TiO_2$, and/or a white silicone comprising a silicone.

The resin portion 135 may be disposed under the light emitting device 120 to perform a sealing function. In addition, the resin portion 135 may improve adhesion force between the light emitting device 120 and the first frame 111. In addition, the resin portion 135 may improve adhesion force between the light emitting device 120 and the second frame 112.

The resin portion 135 may seal around the first pad electrode 121 and the second pad electrode 122. The resin portion 135 may prevent the first conductive layer 321 and the second conductive layer 322 from being moved from regions under the first and second pad electrodes 321 and 322, and diffusing and moving toward the light emitting device 120.

In addition, when the resin portion 135 comprises a material having a reflective property such as white silicone, the resin portion 135 may reflect light emitted from the light emitting device 120 toward an upper direction of the package body 110, thereby improving the light extraction efficiency of the light emitting device package 100.

In addition, the light emitting device package according to the embodiment may comprise a molding part 140.

The molding part 140 may be provided on the light emitting device 120. The molding part 140 may be disposed on the first frame 111 and the second frame 112. The molding part 140 may be disposed at the cavity C provided by the package body 110. The molding part 140 may disposed on the resin portion 135.

In addition, according to another example of the light emitting device package according to the embodiment of the present invention, the resin portion 135 may not be provided separately, and the adhesive 130 may be provided at the periphery of the first and second pad electrodes 121 and 122.

At this point, the adhesive 130 may be referred to as a first resin, and the first and second pad electrodes 121 and 122 may be referred to as first and second bonding parts, respectively.

In addition, when a space for providing the adhesive 130 between the light emitting device 120 and the package body 110 is sufficiently secured, the recess R may not be provided on the upper surface of the package body 110.

In the light emitting device package 100 according to the embodiment, power may be connected to the first pad electrode 121 through the first conductive layer 321, and power may be connected to the second pad electrode 122 through the second conductive layer 322.

Accordingly, the light emitting device 120 may be driven by the driving power supplied through the first pad electrode 121 and the second pad electrode 122. In addition, the light emitted from the light emitting device 120 may be provided in the upper direction of the package body 110.

Meanwhile, the light emitting device package 100 according to an embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided in the light emitting device package, so that stability of electrical connection and physical coupling may be weakened.

However, according to the light emitting device package and a manufacturing method of the light emitting device package according to an embodiment, the first pad electrode and the second pad electrode of the light emitting device according to the embodiment may be provided with driving power by the conductive layers disposed on the frames. In addition, the melting point of the conductive layers disposed on the frames may be selected so as to have a higher value than that of the general bonding material.

Therefore, since the light emitting device package 100 according to the embodiment does not cause a re-melting phenomenon even when the light emitting device package 100 is bonded to the main substrate by a reflow process, the electrical connection and the physical bonding force may not be deteriorated.

In addition, according to the light emitting device package 100 and the manufacturing method of the light emitting device package according to an embodiment, the package body 110 does not need to be exposed to a high temperature in the manufacturing process of the light emitting device package. Therefore, according to an embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphthalamide (PPA) resin, polycyclohexylenedimethylene terephthalate (PCT) resin, epoxy molding compound (EMC) resin, and silicone molding compound (SMC) resin.

Next, another example of the light emitting device package according to an embodiment of the present invention will be described with reference to FIG. 29.

In describing the light emitting device package according to the embodiment of with reference to FIG. 29, the description of the contents overlapping with the contents described with reference to FIGS. 1 to 28 may be omitted.

Figure 29:
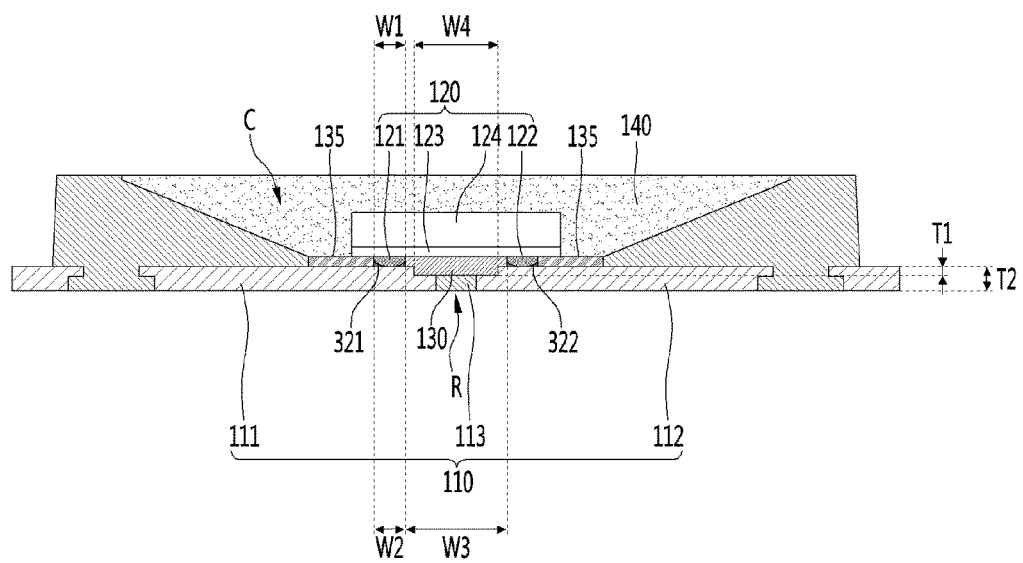
FIG. 29 is a view illustrating still another example of a light emitting device package according to an embodiment of the present invention.

The light emitting device package according to the embodiment may comprise a package body 110 and a light emitting device 120, as shown in FIG. 29.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112. The body 113 may perform a function as a kind of electrode separation line.

For example, the body 113 may be formed of at least one selected from the group consisting of polyphthalamide (PPA), polychloro tri phenyl (PCT), liquid crystal polymer (LCP), polyamide 9T (PA9T), silicone, epoxy molding compound (EMC), silicone molding compound (SMC), ceramic, photo sensitive glass (PSG), sapphire ($Al_2O_3$), and the like. In addition, the body 113 may comprise a high refractive index filler such as $TiO_2$ and $SiO_2$.

According to the embodiment, the light emitting device 120 may comprise a first pad electrode 121, a second pad electrode 122, a semiconductor structure 123, and a substrate 124.

The light emitting device 120 may comprise the semiconductor structure 123 disposed under the substrate 124, as shown in FIG. 29. The first pad electrode 121 and the second pad electrode 122 may be disposed between the semiconductor structure 123 and the body 113.

The light emitting device 120 may be disposed on the package body 110. The light emitting device 120 may be disposed on the first frame 111 and the second frame 112. The light emitting device 120 may be disposed in the cavity C provided by the package body 110.

The first pad electrode 121 may be disposed on a lower surface of the light emitting device 120. The second pad electrode 122 may be disposed on the lower surface of the light emitting device 120. The first pad electrode 121 and the second pad electrode 122 may be disposed to be spaced apart from each other on the lower surface of the light emitting device 120.

The first pad electrode 121 may be disposed on the first frame 111. The second pad electrode 122 may be disposed on the second frame 112.

The first pad electrode 121 may be disposed between the semiconductor structure 123 and the first frame 111. The second pad electrode 122 may be disposed between the semiconductor structure 123 and the second frame 112.

In addition, the light emitting device package according to the embodiment may comprise an adhesive 130.

The adhesive 130 may be disposed between the body 113 and the light emitting device 120. The adhesive 130 may be disposed between an upper surface of the body 113 and a lower surface of the light emitting device 120.

The light emitting device package according to the embodiment may comprise a recess R, as shown in FIG. 29.

The recess R may be provided at the package body 110. The recess R may be provided to concave from the upper surface of the package body 110 toward the lower surface thereof. The recess R may be disposed under the light emitting device 120. The recess R may be provided to be overlapped with the light emitting device 120 in the first direction.

The recess R may be provided by the upper surface of the first frame 111, the upper surface of the body 113, and the upper surface of the second frame 112. As an example, the upper surface of the body 113 may be provided in a flat shape, the upper surface of the first frame 111 is provided in a stepped shape with a different height, and the upper surface of the second frame 112 may be provided in a stepped step shape with a different height.

As an example, the adhesive 130 may be disposed in the recess R. The adhesive 130 may be disposed between the light emitting device 120 and the package body 110. The adhesive 130 may be disposed between the first pad electrode 121 and the second pad electrode 122. The adhesive 130 may be disposed in contact with a side surface of the first pad electrode 121 and a side surface of the second pad electrode 122. The adhesive 130 may be provided between a stepped step shaped region of the first frame 111 and a stepped step-shaped region of the second frame 112.

As described above, according to an embodiment, the recess R may be widely provided to be extended from a part of the upper surface of the first frame 111 to a part of the upper surface of the second frame 112.

Accordingly, the adhesive 130 may provide a stable fixing force between the light emitting device 120 and the package body 110. The adhesive 130 may provide a stable fixing force between the light emitting device 120 and the body 113. The adhesive 130 may provide a stable fixing force between the light emitting device 120 and the first frame 111. The adhesive 130 may provide a stable fixing force between the light emitting device 120 and the second frame 112.

The adhesive 130 may be disposed in direct contact with the upper surface of the body 113. The adhesive 130 may be disposed in direct contact with the upper surface of the first frame 111. The adhesive 130 may be disposed in direct contact with the upper surface of the second frame 112. In addition, the adhesive 130 may be disposed in direct contact with the lower surface of the light emitting device 120.

As an example, the adhesive 130 may comprise at least one of an epoxy-based material, a silicone-based material, and a hybrid material comprising an epoxy-based material and a silicone-based material. As an example, the adhesive 130 may comprise a white silicone. The adhesive 130 may be referred to as a first resin as another representation.

The adhesive 130 may provide a stable fixing force between the body 113 and the light emitting device 120. When light is emitted to the lower surface of the light emitting device 120, the adhesive 130 may provide a light diffusion function between the light emitting device 120 and the body 113. When the light is emitted from the light emitting device 120 to the lower surface of the light emitting device 120, the adhesive 130 may improve the light extraction efficiency of the light emitting device package 100 by providing the light diffusion function.

The recess R may provide a proper space in which a kind of under-filling process may be performed under the light emitting device 120. The recess R may be provided at a first depth or more so that the adhesive 130 may be sufficiently provided between the lower surface of the light emitting device 120 and the upper surface of the body 113. In addition, the recesses R may be provided at a second depth or less to provide a stable strength of the body 113.

In addition, according to an embodiment, a sum of areas of the first and second pad electrodes 121 and 122 may be provided at 10% or less based on an area of an upper surface of the substrate 124. According to the light emitting device package according to the embodiment, the sum of the areas of the first and second pad electrodes 121 and 122 may be set at 10% or less based on the area of the upper surface of the substrate 124 in order to secure a light emitting area emitted from the light emitting device and increase light extraction efficiency.

In addition, according to an embodiment, the sum of the areas of the first and second pad electrodes 121 and 122 may be provided at 0.7% or more based on the area of the upper surface of the substrate 124. According to the light emitting device package according to an embodiment, the sum of the areas of the first and second pad electrodes 121 and 122 may be set at 0.7% or more based on the area of the upper surface of the substrate 124 in order to provide a stable bonding force to the light emitting device to be mounted.

As described above, as the area of the first and second pad electrodes 121 and 122 is provided to be small, an amount of light transmitted to the lower surface of the light emitting device 120 may be increased. In addition, the adhesive 130 having a good reflection characteristic may be provided to wide and thick under the light emitting device 120. Therefore, the light emitted in a downwards direction of the light emitting device 120 is reflected at the adhesive 130, and is effectively emitted toward an upper direction of the light emitting device package 100, so that the light extraction efficiency may be improved.

In addition, the light emitting device package according to an embodiment may comprise a first conductive layer 321 and a second conductive layer 322. The first conductive layer 321 may be disposed to be spaced apart from the second conductive layer 322.

The first conductive layer 321 may be provided on the first frame 111, the first conductive layer 321 may be disposed under the first pad electrode 121.

The first conductive layer 321 may be disposed in direct contact with the lower surface of the first pad electrode 121. The first conductive layer 321 may be electrically connected to the first pad electrode 121. The first conductive layer 321 may provide with a function of fixing the first pad electrode 121 and the first frame 111 to each other.

The second conductive layer 322 may be provided on the second frame 112. The second conductive layer 322 may be disposed under the second pad electrode 122.

The second conductive layer 322 may be disposed in direct contact with the lower surface of the second pad electrode 122. The second conductive layer 322 may be electrically connected to the second pad electrode 122. The second conductive layer 322 may provide with a function of fixing the second pad electrode 122 and the second frame 112 to each other.

The first conductive layer 321 and the second conductive layer 322 may comprise one material selected from the group consisting of Ag, Au, Pt, Sn, Cu or an alloy thereof. However, the present invention is not limited thereto, and a material capable of securing a conductive function may be used in the first conductive layer 321 and the second conductive layer 322.

As an example, the first conductive layer 321 and the second conductive layer 322 may be formed by using a conductive paste. The conductive paste may comprise a solder paste, a silver paste, or the like, and may be composed of multiple layers or a single layer composed of multiple layers or alloys composed of different materials. As an example, the first and second conductive layers 321 and 322 may comprise a SAC (Sn—Ag—Cu) material.

In addition, the light emitting device package according to an embodiment may comprise a resin portion 135, as shown in FIG. 29.

The resin portion 135 may be disposed at a side surface of the first pad electrode 121. The resin portion 135 may be disposed at a side surface of the second pad electrode 122. The resin portion 135 may be disposed under the semiconductor structure 123.

As an example, the resin portion 135 may comprise at least one of an epoxy-based material, a silicone-based material, and a hybrid material comprising an epoxy-based material and a silicone-based material. In addition, the resin portion 135 may comprise a reflective material such as $TiO_2$, and/or a white silicone comprising a silicone.

The resin portion 135 may be disposed under the light emitting device 120 to perform a sealing function. In addition, the resin portion 135 may improve adhesion force between the light emitting device 120 and the first frame 111. In addition, the resin portion 135 may improve adhesion force between the light emitting device 120 and the second frame 112.

The resin portion 135 may seal around the first pad electrode 121 and the second pad electrode 122. The resin portion 135 may prevent the first conductive layer 321 and the second conductive layer 322 from being moved from regions under the first and second pad electrodes 321 and 322, and diffusing and moving toward the light emitting device 120.

In addition, when the resin portion 135 comprises a material having a reflective property such as white silicone, the resin portion 135 may reflect light emitted from the light emitting device 120 toward an upper direction of the package body 110, thereby improving the light extraction efficiency of the light emitting device package 100.

In addition, the light emitting device package according to the embodiment may comprise a molding part 140.

The molding part 140 may be provided on the light emitting device 120. The molding part 140 may be disposed on the first frame 111 and the second frame 112. The molding part 140 may be disposed at the cavity C provided by the package body 110. The molding part 140 may disposed on the resin portion 135.

In addition, according to another example of the light emitting device package according to the embodiment of the present invention, the resin portion 135 may not be provided separately, and the adhesive 130 may be provided at the periphery of the first and second pad electrodes 121 and 122.

At this point, the adhesive 130 may be referred to as a first resin, and the first and second pad electrodes 121 and 122 may be referred to as first and second bonding parts, respectively.

In addition, when a space for providing the adhesive 130 between the light emitting device 120 and the package body 110 is sufficiently secured, the recess R may not be provided on the upper surface of the package body 110.

In the light emitting device package according to the embodiment, power may be connected to the first pad electrode 121 through the first conductive layer 321, and power may be connected to the second pad electrode 122 through the second conductive layer 322.

Accordingly, the light emitting device 120 may be driven by the driving power supplied through the first pad electrode 121 and the second pad electrode 122. In addition, the light emitted from the light emitting device 120 may be provided in the upper direction of the package body 110.

Meanwhile, the light emitting device package according to an embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided in the light emitting device package, so that stability of electrical connection and physical coupling may be weakened.

However, according to the light emitting device package and a manufacturing method of the light emitting device package according to an embodiment, the first pad electrode and the second pad electrode of the light emitting device according to the embodiment may be provided with driving power by the conductive layers disposed on the frames. In addition, the melting point of the conductive layers disposed on the frames may be selected so as to have a higher value than that of the general bonding material.

Therefore, since the light emitting device package 100 according to the embodiment does not cause a re-melting phenomenon even when the light emitting device package 100 is bonded to the main substrate by a reflow process, the electrical connection and the physical bonding force may not be deteriorated.

In addition, according to the light emitting device package 100 and the manufacturing method of the light emitting device package according to an embodiment, the package body 110 does not need to be exposed to a high temperature in the manufacturing process of the light emitting device package. Therefore, according to an embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphthalamide (PPA) resin, polycyclohexylenedimethylene terephthalate (PCT) resin, epoxy molding compound (EMC) resin, and silicone molding compound (SMC) resin.

Next, another example of the light emitting device package according to an embodiment of the present invention will be described with reference to FIG. 30.

In describing the light emitting device package according to the embodiment of with reference to FIG. 30, the description of the contents overlapping with the contents described with reference to FIGS. 1 to 29 may be omitted.

Figure 30:
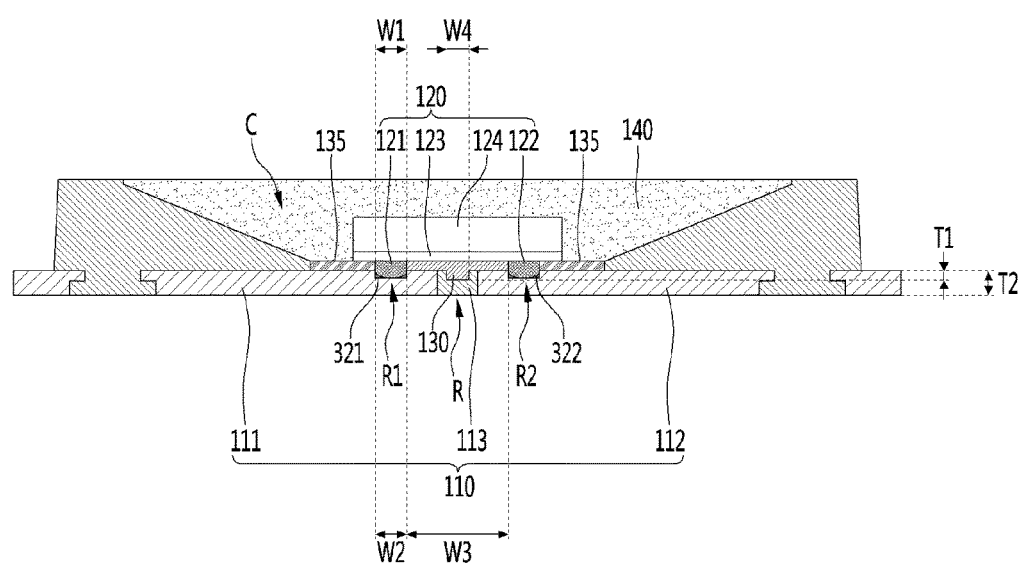
FIG. 30 is a view illustrating still another example of a light emitting device package according to an embodiment of the present invention.

The light emitting device package according to the embodiment may comprise a package body 110 and a light emitting device 120, as shown in FIG. 30.

The light emitting device package according to an embodiment shown in FIG. 30 may further comprise a first recess R1 and a second recess R2 as compared with the light emitting device package described with reference to FIG. 28.

The first recess R1 may be provided at an upper surface of the first frame 111. The first recess R1 may be provided to concave from the upper surface of the first frame 111 toward a lower surface thereof. The first recess R1 may be disposed to be spaced apart from the recess R.

The second recess R2 may be provided at an upper surface of the second frame 112. The second recess R2 may be provided to concave from the upper surface of the second frame 112 toward a lower surface thereof. The second upper recess R4 may be disposed to be spaced apart from the recess R.

According to an embodiment, the first conductive layer 321 may be provided at the first recess R1. In addition, the first pad electrode 121 may be provided at a region of the first recess R1. Further, the second conductive layer 322 may be provided at the second recess R2. In addition, the second pad electrode 122 may be provided at a region of the second recess R2. The first and second recesses R1 and R2 may provide a sufficient space in which the first and second conductive layers 321 and 322 may be provided.

As an example, the first conductive layer 321 and the second conductive layer 322 may be formed by using a conductive paste. The conductive paste may comprise a solder paste, a silver paste, or the like, and may be composed of multiple layers or a single layer composed of multiple layers or alloys composed of different materials. As an example, the first and second conductive layers 321 and 322 may comprise a SAC (Sn—Ag—Cu) material.

In addition, the light emitting device package according to an embodiment may comprise a resin portion 135, as shown in FIG. 30.

The resin portion 135 may be disposed at a side surface of the first pad electrode 121. The resin portion 135 may be disposed at a side surface of the second pad electrode 122. The resin portion 135 may be disposed under the semiconductor structure 123.

As an example, the resin portion 135 may comprise at least one of an epoxy-based material, a silicone-based material, and a hybrid material comprising an epoxy-based material and a silicone-based material. In addition, the resin portion 135 may comprise a reflective material such as TiO$_2$, and/or a white silicone comprising a silicone.

The resin portion 135 may be disposed under the light emitting device 120 to perform a sealing function. In addition, the resin portion 135 may improve adhesion force between the light emitting device 120 and the first frame 111. In addition, the resin portion 135 may improve adhesion force between the light emitting device 120 and the second frame 112.

The resin portion 135 may seal around the first pad electrode 121 and the second pad electrode 122. The resin portion 135 may prevent the first conductive layer 321 and the second conductive layer 322 from being moved from regions of the first and second recesses R1 and R2, and diffusing and moving toward the light emitting device 120.

In addition, when the resin portion 135 comprises a material having a reflective property such as white silicone, the resin portion 135 may reflect light emitted from the light emitting device 120 toward an upper direction of the package body 110, thereby improving the light extraction efficiency of the light emitting device package 100.

In addition, according to an embodiment, a sum of areas of the first and second pad electrodes 121 and 122 may be provided at 10% or less based on an area of an upper surface of the substrate 124. According to the light emitting device package according to the embodiment, the sum of the areas of the first and second pad electrodes 121 and 122 may be set at 10% or less based on the area of the upper surface of the substrate 124 in order to secure a light emitting area emitted from the light emitting device and increase light extraction efficiency.

In addition, according to an embodiment, the sum of the areas of the first and second pad electrodes 121 and 122 may be provided at 0.7% or more based on the area of the upper surface of the substrate 124. According to the light emitting device package according to an embodiment, the sum of the areas of the first and second pad electrodes 121 and 122 may be set at 0.7% or more based on the area of the upper surface of the substrate 124 in order to provide a stable bonding force to the light emitting device to be mounted.

As described above, as the area of the first and second pad electrodes 121 and 122 is provided to be small, an amount of light transmitted to the lower surface of the light emitting device 120 may be increased. In addition, the adhesive 130 having a good reflection characteristic may be provided under the light emitting device 120. Therefore, the light emitted in a downwards direction of the light emitting device 120 is reflected at the adhesive 130, and is effectively emitted toward an upper direction of the light emitting device package 100, so that the light extraction efficiency may be improved.

In addition, the light emitting device package according to the embodiment may comprise a molding part 140.

The molding part 140 may be provided on the light emitting device 120. The molding part 140 may be disposed on the first frame 111 and the second frame 112. The molding part 140 may be disposed at the cavity C provided by the package body 110. The molding part 140 may disposed on the resin portion 135.

In addition, according to another example of the light emitting device package according to the embodiment of the present invention, the resin portion 135 may not be provided separately, and the adhesive 130 may be provided at the periphery of the first and second pad electrodes 121 and 122.

At this point, the adhesive 130 may be referred to as a first resin, and the first and second pad electrodes 121 and 122 may be referred to as first and second bonding parts, respectively.

In addition, when a space for providing the adhesive 130 between the light emitting device 120 and the package body 110 is sufficiently secured, the recess R may not be provided on the upper surface of the package body 110.

In the light emitting device package according to the embodiment, power may be connected to the first pad electrode 121 through the first conductive layer 321, and power may be connected to the second pad electrode 122 through the second conductive layer 322.

Accordingly, the light emitting device 120 may be driven by the driving power supplied through the first pad electrode 121 and the second pad electrode 122. In addition, the light emitted from the light emitting device 120 may be provided in the upper direction of the package body 110.

Meanwhile, the light emitting device package according to an embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided in the light emitting device package, so that stability of electrical connection and physical coupling may be weakened.

However, according to the light emitting device package and a manufacturing method of the light emitting device package according to an embodiment, the first pad electrode and the second pad electrode of the light emitting device according to the embodiment may be provided with driving power by the conductive layers disposed on the frames. In addition, the melting point of the conductive layers disposed on the frames may be selected so as to have a higher value than that of the general bonding material.

Therefore, since the light emitting device package 100 according to the embodiment does not cause a re-melting phenomenon even when the light emitting device package 100 is bonded to the main substrate by a reflow process, the electrical connection and the physical bonding force may not be deteriorated.

In addition, according to the light emitting device package 100 and the manufacturing method of the light emitting device package according to an embodiment, the package body 110 does not need to be exposed to a high temperature in the manufacturing process of the light emitting device package. Therefore, according to an embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphthalamide (PPA) resin, polycyclohexylenedimethylene terephthalate (PCT) resin, epoxy molding compound (EMC) resin, and silicone molding compound (SMC) resin.

Next, another example of the light emitting device package according to an embodiment of the present invention will be described with reference to FIG. 31.

In describing the light emitting device package according to the embodiment of with reference to FIG. 31, the description of the contents overlapping with the contents described with reference to FIGS. 1 to 30 may be omitted.

Figure 31:
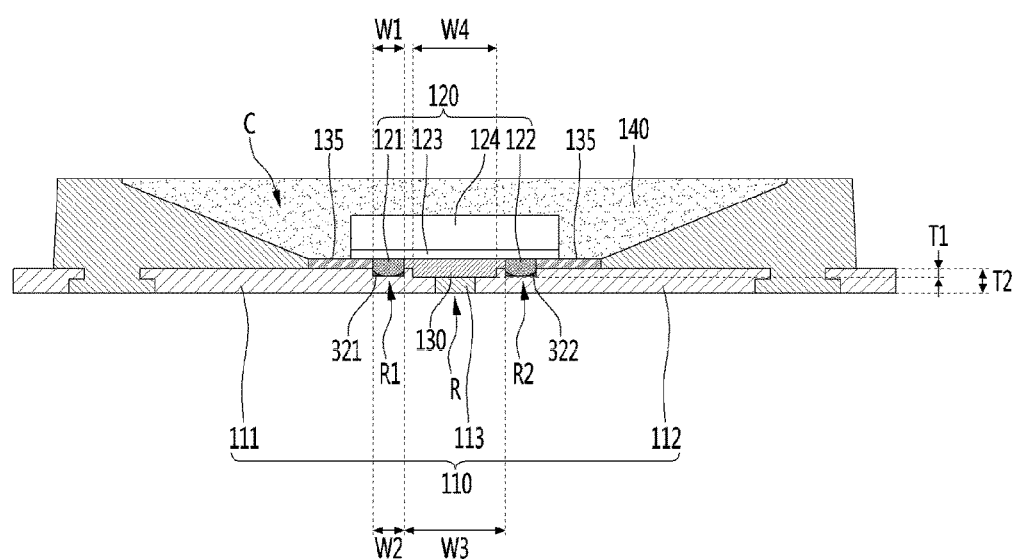
FIG. 31 is a view illustrating still another example of a light emitting device package according to an embodiment of the present invention.

The light emitting device package according to the embodiment may comprise a package body 110 and a light emitting device 120, as shown in FIG. 31.

The light emitting device package according to an embodiment shown in FIG. 31 may further comprise a first recess R1 and a second recess R2 as compared with the light emitting device package described with reference to FIG. 29.

The first recess R1 may be provided at an upper surface of the first frame 111. The first recess R1 may be provided to concave from the upper surface of the first frame 111 toward a lower surface thereof. The first recess R1 may be disposed to be spaced apart from the recess R.

The second recess R2 may be provided at an upper surface of the second frame 112. The second recess R2 may be provided to concave from the upper surface of the second frame 112 toward a lower surface thereof. The second upper recess R4 may be disposed to be spaced apart from the recess R.

According to an embodiment, the first conductive layer 321 may be provided at the first recess R1. In addition, the first pad electrode 121 may be provided at a region of the first recess R1. Further, the second conductive layer 322 may be provided at the second recess R2. In addition, the second pad electrode 122 may be provided at a region of the second recess R2. The first and second recesses R1 and R2 may provide a sufficient space in which the first and second conductive layers 321 and 322 may be provided.

As an example, the first conductive layer 321 and the second conductive layer 322 may be formed by using a conductive paste. The conductive paste may comprise a solder paste, a silver paste, or the like, and may be composed of multiple layers or a single layer composed of multiple layers or alloys composed of different materials. As an example, the first and second conductive layers 321 and 322 may comprise a SAC (Sn—Ag—Cu) material.

In addition, the light emitting device package according to an embodiment may comprise a resin portion 135, as shown in FIG. 31.

The resin portion 135 may be disposed at a side surface of the first pad electrode 121. The resin portion 135 may be disposed at a side surface of the second pad electrode 122. The resin portion 135 may be disposed under the semiconductor structure 123.

As an example, the resin portion 135 may comprise at least one of an epoxy-based material, a silicone-based material, and a hybrid material comprising an epoxy-based material and a silicone-based material. In addition, the resin portion 135 may comprise a reflective material such as $TiO_2$, and/or a white silicone comprising a silicone.

The resin portion 135 may be disposed under the light emitting device 120 to perform a sealing function. In addition, the resin portion 135 may improve adhesion force between the light emitting device 120 and the first frame 111. In addition, the resin portion 135 may improve adhesion force between the light emitting device 120 and the second frame 112.

The resin portion 135 may seal around the first pad electrode 121 and the second pad electrode 122. The resin portion 135 may prevent the first conductive layer 321 and the second conductive layer 322 from being moved from regions of the first and second recesses R1 and R2, and diffusing and moving toward the light emitting device 120.

In addition, when the resin portion 135 comprises a material having a reflective property such as white silicone, the resin portion 135 may reflect light emitted from the light emitting device 120 toward an upper direction of the package body 110, thereby improving the light extraction efficiency of the light emitting device package 100.

In addition, according to an embodiment, a sum of areas of the first and second pad electrodes 121 and 122 may be provided at 10% or less based on an area of an upper surface of the substrate 124. According to the light emitting device package according to the embodiment, the sum of the areas of the first and second pad electrodes 121 and 122 may be set at 10% or less based on the area of the upper surface of the substrate 124 in order to secure a light emitting area emitted from the light emitting device and increase light extraction efficiency.

In addition, according to an embodiment, the sum of the areas of the first and second pad electrodes 121 and 122 may be provided at 0.7% or more based on the area of the upper surface of the substrate 124. According to the light emitting device package according to an embodiment, the sum of the areas of the first and second pad electrodes 121 and 122 may be set at 0.7% or more based on the area of the upper surface of the substrate 124 in order to provide a stable bonding force to the light emitting device to be mounted.

As described above, as the area of the first and second pad electrodes 121 and 122 is provided to be small, an amount of light transmitted to the lower surface of the light emitting device 120 may be increased. In addition, the adhesive 130 having a good reflection characteristic may be provided under the light emitting device 120. Therefore, the light emitted in a downwards direction of the light emitting device 120 is reflected at the adhesive 130, and is effectively emitted toward an upper direction of the light emitting device package 100, so that the light extraction efficiency may be improved.

In addition, the light emitting device package according to the embodiment may comprise a molding part 140.

The molding part 140 may be provided on the light emitting device 120. The molding part 140 may be disposed on the first frame 111 and the second frame 112. The molding part 140 may be disposed at the cavity C provided by the package body 110. The molding part 140 may disposed on the resin portion 135.

In addition, according to another example of the light emitting device package according to the embodiment of the present invention, the resin portion 135 may not be provided separately, and the adhesive 130 may be provided at the periphery of the first and second pad electrodes 121 and 122.

At this point, the adhesive 130 may be referred to as a first resin, and the first and second pad electrodes 121 and 122 may be referred to as first and second bonding parts, respectively.

In addition, when a space for providing the adhesive 130 between the light emitting device 120 and the package body 110 is sufficiently secured, the recess R may not be provided on the upper surface of the package body 110.

In the light emitting device package according to the embodiment, power may be connected to the first pad electrode 121 through the first conductive layer 321, and power may be connected to the second pad electrode 122 through the second conductive layer 322.

Accordingly, the light emitting device 120 may be driven by the driving power supplied through the first pad electrode 121 and the second pad electrode 122. In addition, the light emitted from the light emitting device 120 may be provided in the upper direction of the package body 110.

Meanwhile, the light emitting device package according to an embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided in the light emitting device package, so that stability of electrical connection and physical coupling may be weakened.

However, according to the light emitting device package and a manufacturing method of the light emitting device package according to an embodiment, the first pad electrode and the second pad electrode of the light emitting device according to the embodiment may be provided with driving power by the conductive layers disposed on the frames. In addition, the melting point of the conductive layers disposed on the frames may be selected so as to have a higher value than that of the general bonding material.

Therefore, since the light emitting device package according to the embodiment does not cause a re-melting phenomenon even when the light emitting device package 100 is bonded to the main substrate by a reflow process, the electrical connection and the physical bonding force may not be deteriorated.

In addition, according to the light emitting device package and the manufacturing method of the light emitting device package according to an embodiment, the package body 110 does not need to be exposed to a high temperature in the manufacturing process of the light emitting device package. Therefore, according to an embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphthalamide (PPA) resin, polycyclohexylenedimethylene terephthalate (PCT) resin, epoxy molding compound (EMC) resin, and silicone molding compound (SMC) resin.

Next, another example of the light emitting device package according to an embodiment of the present invention will be described with reference to FIG. 32.

In describing the light emitting device package according to the embodiment of with reference to FIG. 32, the description of the contents overlapping with the contents described with reference to FIGS. 1 to 31 may be omitted.

Figure 32:
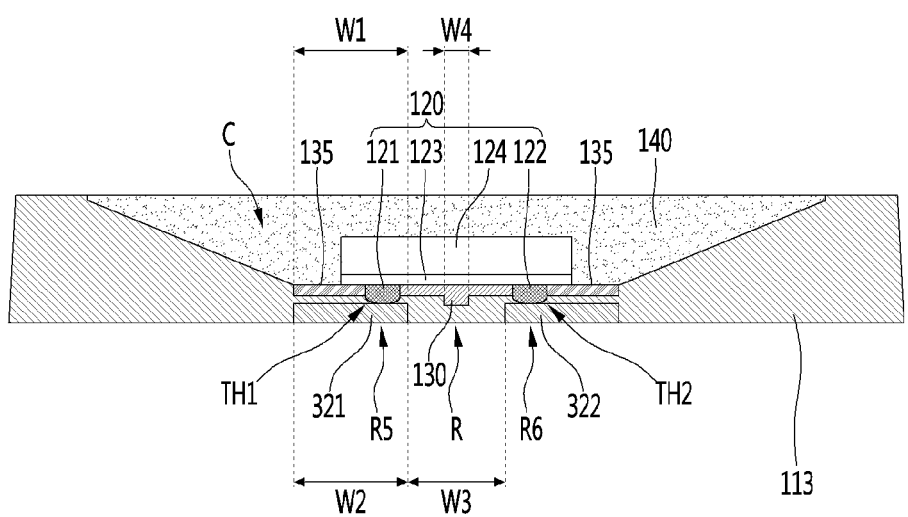
FIG. 32 is a view illustrating still another example of a light emitting device package according to an embodiment of the present invention.

The light emitting device package according to an embodiment may comprise a body 113 and a light emitting device 120, as shown in FIG. 32.

According to the embodiment, the body 113 may be provided with a recess R, a first opening TH1, and a second opening TH2. The recess R may be provided on an upper surface of the body 113. The body 113 may comprise the first opening TH1 and the second opening TH2, as shown in FIG. 32.

In addition, according to the embodiment, the light emitting device 120 may comprise a first pad electrode 121, a second pad electrode 122, a semiconductor structure 123, and a substrate 124.

The light emitting device 120 may comprise the semiconductor structure 123 disposed under the substrate 124, as shown in FIG. 32. The first pad electrode 121 and the second pad electrode 122 may be disposed between the semiconductor structure 123 and the body 113.

The light emitting device 120 may be disposed on the body 113. The light emitting device 120 may be disposed in the cavity C provided by the body 113.

The first pad electrode 121 may be disposed on a lower surface of the light emitting device 120. The second pad electrode 122 may be disposed on the lower surface of the light emitting device 120. The first pad electrode 121 and the second pad electrode 122 may be disposed to be spaced apart from each other on the lower surface of the light emitting device 120.

The first opening TH1 may be provided at the body 113. The first opening TH1 may be provided by passing through the body 113. The first opening TH1 may be provided by passing through an upper surface and a lower surface of the body 113 in a first direction.

The first opening TH1 may be disposed under the first pad electrode 121 of the light emitting device 120. The first opening TH1 may be provided to be overlapped with the first pad electrode 121 of the light emitting device 120. The first opening TH1 may be provided to be overlapped with the first pad electrode 121 of the light emitting device 120 in the first direction from the upper surface of the body 113 toward the lower surface thereof.

The second opening TH2 may be provided at the body 113. The second opening TH2 may be provided by passing through the body 113. The second opening TH2 may be provided by passing through an upper surface and a lower surface of the body 113 in a first direction.

The second opening TH2 may be disposed under the second pad electrode 122 of the light emitting device 120. The second opening TH2 may be provided to be overlapped with the second pad electrode 122 of the light emitting device 120. The second opening TH2 may be provided to be overlapped with the second pad electrode 122 of the light emitting device 120 in the first direction from the upper surface of the body 113 toward the lower surface thereof.

The first opening TH1 and the second opening TH2 may be disposed to be spaced apart from each other. The first opening TH1 and the second opening TH2 may be disposed to be spaced apart from each other under the lower surface of the light emitting device 120.

According to the embodiment, a width of an upper region of the first opening TH1 may be greater than that of the first pad electrode 121. In addition, a width of an upper region of the second opening TH2 may be greater than that of the second pad electrode 122.

According to the embodiment, a lower portion of the first pad electrode 121 may be disposed in the first opening TH1. A bottom surface of the first pad electrode 121 may be disposed lower than the upper surface of the body 113.

In addition, a lower portion of the second pad electrode 122 may be disposed in the second opening TH2. A bottom surface of the second pad electrode 122 may be disposed lower than the upper surface of the body 113.

In addition, the light emitting device package according to the embodiment may comprise an adhesive 130.

The adhesive 130 may be disposed between the body 113 and the light emitting device 120. The adhesive 130 may be disposed between an upper surface of the body 113 and a lower surface of the light emitting device 120.

The light emitting device package according to the embodiment may comprise a recess R, as shown in FIG. 32.

The recess R may be provided at the body 113. The recess R may be provided between the first opening TH1 and the second opening TH2. The recess R may be provided to concave from the upper surface of the body 113 toward the lower surface thereof. The recess R may be disposed under the light emitting device 120. The recess R may be provided to be overlapped with the light emitting device 120 in the first direction.

As an example, the adhesive 130 may be disposed in the recess R. The adhesive 130 may be disposed between the light emitting device 120 and the body 113. The adhesive 130 may be disposed between the first pad electrode 121 and the second pad electrode 122. As an example, the adhesive 130 may be disposed in contact with a side surface of the first pad electrode 121 and a side surface of the second pad electrode 122.

The adhesive 130 may provide a stable fixing force between the light emitting device 120 and the body 113. The adhesive 130 may be disposed, as an example, in direct contact with the upper surface of the body 113. In addition, the adhesive 130 may be disposed in direct contact with the lower surface of the light emitting device 120.

As an example, the adhesive 130 may comprise at least one of an epoxy-based material, a silicone-based material, and a hybrid material comprising an epoxy-based material and a silicone-based material. As an example, the adhesive 130 may comprise a white silicone. The adhesive 130 may be referred to as a first resin as another representation.

The adhesive 130 may provide a stable fixing force between the body 113 and the light emitting device 120. When light is emitted to the lower surface of the light emitting device 120, the adhesive 130 may provide a light diffusion function between the light emitting device 120 and the body 113. When the light is emitted from the light emitting device 120 to the lower surface of the light emitting device 120, the adhesive 130 may improve the light extraction efficiency of the light emitting device package 100 by providing the light diffusion function.

The recess R may provide a proper space in which a kind of under-filling process may be performed under the light emitting device 120. The recess R may be provided at a first depth or more so that the adhesive 130 may be sufficiently provided between the lower surface of the light emitting device 120 and the upper surface of the body 113. In addition, the recesses R may be provided at a second depth or less to provide a stable strength of the body 113.

For example, the body 113 may be formed of at least one selected from the group consisting of polyphthalamide (PPA), polychloro tri phenyl (PCT), liquid crystal polymer (LCP), polyamide 9T (PA9T), silicone, epoxy molding compound (EMC), silicone molding compound (SMC), ceramic, photo sensitive glass (PSG), sapphire ($Al_2O_3$), and the like. In addition, the body 113 may comprise a high refractive index filler such as $TiO_2$ and $SiO_2$.

In addition, according to an embodiment, a sum of areas of the first and second pad electrodes 121 and 122 may be provided at 10% or less based on an area of an upper surface of the substrate 124. According to the light emitting device package according to the embodiment, the sum of the areas of the first and second pad electrodes 121 and 122 may be set at 10% or less based on the area of the upper surface of the substrate 124 in order to secure a light emitting area emitted from the light emitting device and increase light extraction efficiency.

In addition, according to an embodiment, the sum of the areas of the first and second pad electrodes 121 and 122 may be provided at 0.7% or more based on the area of the upper surface of the substrate 124. According to the light emitting device package according to an embodiment, the sum of the areas of the first and second pad electrodes 121 and 122 may be set at 0.7% or more based on the area of the upper surface of the substrate 124 in order to provide a stable bonding force to the light emitting device to be mounted.

According to the embodiment, an area where the adhesive 130 is overlapped with the light emitting device 120 based on the first direction may be provided to be larger than that of a region where the first and second openings TH1 and TH2 are overlapped with the first and second pad electrodes 121 and 122.

As described above, as the area of the first and second pad electrodes 121 and 122 is provided to be small, an amount of light transmitted to the lower surface of the light emitting device 120 may be increased. In addition, the adhesive 130 having a good reflection characteristic may be provided under the light emitting device 120. Therefore, the light emitted in a downwards direction of the light emitting device 120 is reflected at the adhesive 130, and is effectively emitted toward an upper direction of the light emitting device package, so that the light extraction efficiency may be improved.

In addition, the light emitting device package according to an embodiment may comprise a first conductive layer 321 and a second conductive layer 322. The first conductive layer 321 may be disposed to be spaced apart from the second conductive layer 322.

The first conductive layer 321 may be disposed at the first lower recess R5 provided at the lower surface of the body 113. The first conductive layer 321 may be disposed under the body 113. A width of the first conductive layer 321 may be provided to be greater than that of the first pad electrode 121.

The first pad electrode 121 may have a width of a second direction perpendicular to the first direction in which the first opening TH1 is formed. The width of the first pad electrode 121 may be provided to be smaller than that of the second direction of the first opening TH1.

The first conductive layer 321 may be disposed in direct contact with the lower surface of the first pad electrode 121. The first conductive layer 321 may be electrically connected to the first pad electrode 121. The first conductive layer 321 may be disposed to be surrounded by the body 113 in the first lower recess R5.

The second conductive layer 322 may be disposed at the second lower recess R6 provided at the lower surface of the body 113. The second conductive layer 322 may be disposed under the body 113. A width of the second conductive layer 322 may be provided to be greater than that of the second pad electrode 122.

The second pad electrode 122 may have a width of a second direction perpendicular to the first direction in which the second opening TH2 is formed. The width of the second pad electrode 122 may be provided to be smaller than that of the second direction of the second opening TH2.

The second conductive layer 322 may be disposed in direct contact with the lower surface of the second pad electrode 122. The second conductive layer 322 may be electrically connected to the second pad electrode 122. The second conductive layer 322 may be disposed to be surrounded by the body 113 in the second lower recess R6.

A first region of the upper surface of the first conductive layer 321 may be disposed under the first opening TH1. The first region of the upper surface of the first conductive layer 321 may be disposed to be overlapped with the first opening TH1 in a vertical direction.

Further, a second region of the upper surface of the first conductive layer 321 may be disposed under the lower surface of the body 113. The second region of the upper surface of the first conductive layer 321 may be disposed to be overlapped with the lower surface of the body 113 in a vertical direction.

A first region of the upper surface of the second conductive layer 322 may be disposed under the second opening TH2. The first region of the upper surface of the second conductive layer 322 may be disposed to be overlapped with the second opening TH2 in a vertical direction.

Furthermore, a second region of the upper surface of the second conductive layer 322 may be disposed under the lower surface of the body 113. The second region of the upper surface of the second conductive layer 322 may be disposed to be overlapped with the lower surface of the body 113 in a vertical direction.

The first conductive layer 321 and the second conductive layer 322 may comprise one material selected from the group consisting of Ag, Au, Pt, Sn, Cu, etc., or an alloy thereof. However, the present invention is not limited thereto, and a material capable of securing a conductive function may be used for the first conductive layer 321 and the second conductive layer 322.

The first conductive layer 321 and the second conductive layer 322 may be formed of a metal material having a good heat dissipation property or an alloy thereof. As the first conductive layer 321 and the second conductive layer 322 may be formed of a material having a good heat emission characteristic, the heat generated from the light emitting device 120 may be effectively discharged to outside. Accordingly, reliability of the light emitting device package according to an embodiment may be improved.

As an example, the first conductive layer 321 and the second conductive layer 322 may be formed by using a conductive paste. The conductive paste may comprise a solder paste, a silver paste, or the like, and may be composed of multiple layers or a single layer composed of multiple layers or alloys composed of different materials. As an example, the first and second conductive layers 321 and 322 may comprise a SAC (Sn—Ag—Cu) material.

In addition, the light emitting device package according to the embodiment may comprise a resin portion 135, as shown in FIG. 32.

The resin portion 135 may be disposed at a side surface of the first pad electrode 121. The resin portion 135 may be disposed at a side surface of the second pad electrode 122. The resin portion 135 may be disposed under the semiconductor structure 123.

As an example, the resin portion 135 may comprise at least one of an epoxy-based material, a silicone-based material, and a hybrid material comprising an epoxy-based material and a silicone-based material. In addition, the resin portion 135 may comprise a reflective material such as $TiO_2$, and/or a white silicone comprising a silicone.

The resin portion 135 may be disposed under the light emitting device 120 to perform a sealing function. In addition, the resin portion 135 may improve adhesion force between the light emitting device 120 and the body 113.

The resin portion 135 may seal around the first pad electrode 121 and the second pad electrode 122. The resin portion 135 may prevent the first conductive layer 321 and the second conductive layer 322 from being moved from regions of the first and second openings TH1 and TH2, and diffusing and moving toward the light emitting device 120.

In addition, when the resin portion 135 comprises a material having a reflective property such as white silicone, the resin portion 135 may reflect light emitted from the light emitting device 120 toward an upper direction of the package body 110, thereby improving the light extraction efficiency of the light emitting device package 100.

In addition, the light emitting device package according to the embodiment may comprise a molding part 140.

The molding part 140 may be provided on the light emitting device 120. The molding part 140 may be disposed on the body 113. The molding part 140 may be disposed at the cavity C provided by the body 113. The molding part 140 may disposed on the resin portion 135.

In addition, according to another example of the light emitting device package according to the embodiment of the present invention, the resin portion 135 may not be provided separately, and the adhesive 130 may be provided at the periphery of the first and second pad electrodes 121 and 122.

At this point, the adhesive 130 may be referred to as a first resin, and the first and second pad electrodes 121 and 122 may be referred to as first and second bonding parts, respectively.

Meanwhile, the adhesive 130 may be disposed at the upper region of the first and second openings TH1 and TH2. A part of the adhesive 130 may be moved to the first and second openings TH1 and TH2 in a process in which the light emitting device 120 is provided on the package body 110. A part of the adhesive 130 may be disposed at a side surface region of the first and second pad electrodes 121 and 122 in the first and second openings TH1 and TH2. A part of the adhesive 130 may be disposed on the first and second conductive layers 321 and 322 in the first and second openings TH1 and TH2.

The adhesive 130 may seal the upper region of the first and second openings TH1 and TH2, and prevent moisture or foreign substance from flowing from outside into a region in which the light emitting device 120 is disposed through the first and second openings TH1 and TH2.

In addition, when a space for providing the adhesive 130 between the light emitting device 120 and the package body 110 is sufficiently secured, the recess R may not be provided on the upper surface of the package body 110.

In addition, according to another embodiment, the first and second conductive layers 321 and 322 may be disposed to be extended to an end portion of the side wall of the body 113. The first and second conductive layers 321 and 322 may be disposed to be adhered to the lower surface of the body 113 by an adhesive resin or the like. The side surfaces of the first conductive layer 321 and the first side surface of the body 113 may be provided at the same plane. Further, the side surfaces of the second conductive layer 322 and the second side surface of the body 113 may be provided at the same plane.

In the light emitting device package 100 according to the embodiment, power may be connected to the first pad electrode 121 through the region of the first opening TH1, and power may be connected to the second pad electrode 122 through the region of the second opening TH2.

Accordingly, the light emitting device 120 may be driven by the driving power supplied through the first pad electrode 121 and the second pad electrode 122. In addition, the light emitted from the light emitting device 120 may be provided in the upper direction of the package body 110.

Furthermore, according to another embodiment, the adhesive 130, the resin portion 135, and the body 113 may comprise the same material.

In addition, according to the embodiment of the present invention, physical properties of the adhesive 130 and the resin portion 135 may be selected in consideration of coefficient of thermal expansion (CTE) matching between the body 113, the adhesive 130, the resin portion 135, and the light emitting device 120, and thus cracks or delamination of the light emitting device package due to thermal shock may be improved.

Meanwhile, the light emitting device package according to an embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided in the light emitting device package, so that stability of electrical connection and physical coupling may be weakened.

However, according to the light emitting device package and a manufacturing method of the light emitting device package according to an embodiment, the first pad electrode and the second pad electrode of the light emitting device according to the embodiment may be provided with driving power by the conductive layers disposed under the openings. In addition, the melting point of the conductive layers disposed under the openings may be selected so as to have a higher value than that of the general bonding material.

Therefore, since the light emitting device package according to the embodiment does not cause a re-melting phenomenon even when the light emitting device package 100 is bonded to the main substrate by a reflow process, the electrical connection and the physical bonding force may not be deteriorated.

In addition, according to the light emitting device package and the manufacturing method of the light emitting device package according to an embodiment, the body 113 does not need to be exposed to a high temperature in the manufacturing process of the light emitting device package. Therefore, according to an embodiment, it is possible to prevent the body 113 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphthalamide (PPA) resin, polycyclohexylenedimethylene terephthalate (PCT) resin, epoxy molding compound (EMC) resin, and silicone molding compound (SMC) resin.

Meanwhile, a flip chip light emitting device may be provided in the light emitting device package described above, as an example.

As an example, the flip chip light emitting device may be provided as a transmissive type flip chip light emitting device that emits light in six surface directions, or may be provided as a reflective type flip chip light emitting device that emits light in five surface directions.

The reflective type flip chip light emitting device in which light is emitted in the five surface directions may have a structure in which a reflective layer is disposed in a direction close to the package body 110. For example, the reflective type flip chip light emitting device may comprise an insulating reflective layer (for example, a distributed bragg reflector, an omni directional reflector, etc.) and/or a conductive type reflective layer (for example, Ag, Al, Ni, Au, etc.).

Further, the flip chip light emitting device may comprise a first electrode electrically connected to a first conductive type semiconductor layer, and a second electrode electrically connected to a second conductive type semiconductor layer, and may be provided as a general horizontal light emitting device in which light is emitted between the first electrode and the second electrode.

Furthermore, the flip chip light emitting device in which light is emitted in the six surface directions may be provided as a transmissive type flip chip light emitting device comprising a reflective region in which a reflective layer is disposed between the first and second electrode pads and a transmissive region in which light is emitted.

Here, the transmissive type flip chip light emitting device means a device that emits light to six surfaces of an upper surface, four side surfaces, and a lower surface. In addition, the reflective type flip chip light emitting device means a device that emits light to the upper surface and the four side surfaces.

Then, an example of a flip chip light emitting device applied to a light emitting device package according to an embodiment of the present invention will be described with reference to the accompanying drawings.

Figure 33:
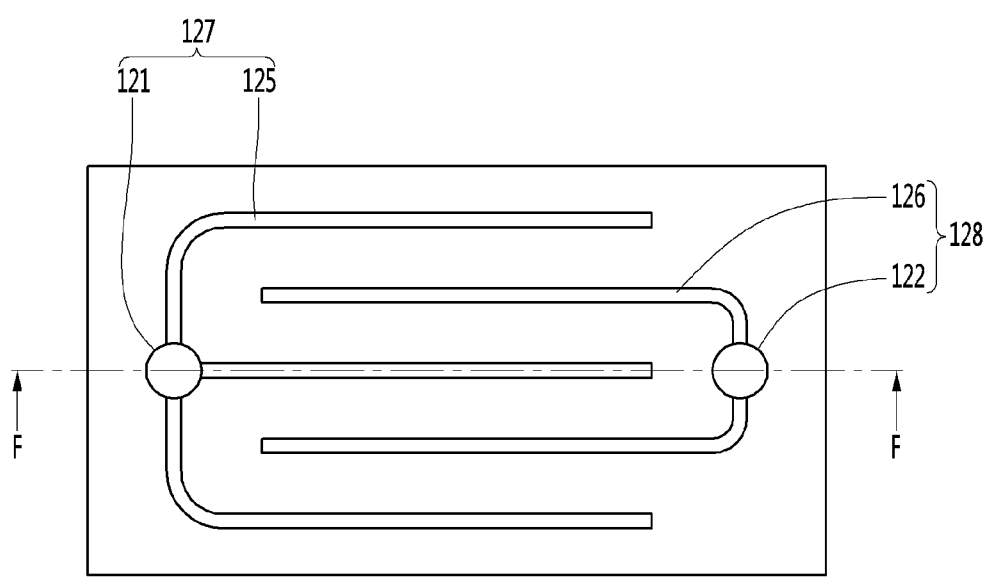
FIG. 33 is a plan view explaining an electrode arrangement of a light emitting device applied to a light emitting device package according to an embodiment of the present invention.

First, referring to FIGS. 33 and 34, a light emitting device according to an embodiment of the present invention will be described. FIG. 33 is a plan view explaining an electrode arrangement of a light emitting device applied to a light emitting device package according to an embodiment of the present invention, and FIG. 34 is a cross-sectional view taken along line F-F of the light emitting device shown in FIG. 33.

Meanwhile, for purpose of understanding, as shown in FIG. 33, only the relative arrangement relationship of the first electrode 127 and the second electrode 128 is conceptually shown. The first electrode 127 may comprise a first pad electrode 121 and a first branched electrode 125. The second electrode 128 may comprise a second pad electrode 122 and a second branched electrode 126.

Figure 34:
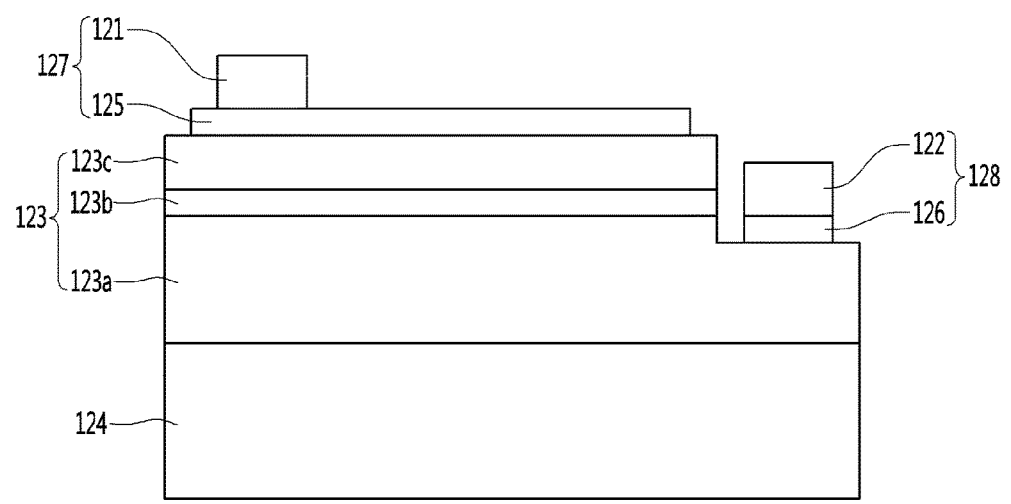
FIG. 34 is a cross-sectional view taken along line F-F of the light emitting device shown in FIG. 33.

The light emitting device according to an embodiment may comprise a semiconductor structure 123 disposed on the substrate 124, as shown in FIGS. 33 and 34.

The substrate 124 may be selected from the group consisting of a sapphire substrate ($Al_2O_3$), SiC, GaAs, GaN, ZnO, Si, GaP, InP, and Ge. For example, the substrate 124 may be provided as a patterned sapphire substrate (PSS) in which a concavo-convex pattern is formed on the upper surface.

The semiconductor structure 123 may comprise a first conductive type semiconductor layer 123a, an active layer 123b, and a second conductive type semiconductor layer 123c. The active layer 123b may be disposed between the first conductive type semiconductor layer 123a and the second conductive type semiconductor layer 123c. As an example, the active layer 123b may be disposed on the first conductive type semiconductor layer 123a, and the second conductive type semiconductor layer 123c may be disposed on the active layer 123b.

According to an embodiment, the first conductive type semiconductor layer 123a may be provided as an n-type semiconductor layer, and the second conductive type semiconductor layer 123c may be provided as a p-type semiconductor layer. Of course, according to another embodiment, the first conductive type semiconductor layer 123a may be provided as a p-type semiconductor layer, and the second conductive type semiconductor layer 123c may be provided as an n-type semiconductor layer.

The light emitting device according to an embodiment may comprise a first electrode 127 and a second electrode 128, as shown in FIGS. 33 and 34.

The first electrode 127 may comprise a first pad electrode 121 and a first branched electrode 125. The first electrode 127 may be electrically connected to the second conductive type semiconductor layer 123c. The first branched electrode 125 may be branched from the first pad electrode 121. The first branched electrode 125 may comprise a plurality of branch electrodes branched from the first pad electrode 121.

The second electrode 128 may comprise a second pad electrode 122 and a second branched electrode 126. The second electrode 128 may be electrically connected to the first conductive type semiconductor layer 123a. The second branched electrode 126 may be branched from the second pad electrode 122. The second branched electrode 126 may comprise a plurality of branch electrodes branched from the second pad electrode 122.

The first branched electrode 125 and the second branched electrode 126 may be disposed to stagger each other in a finger shape. A power source supplied through the first pad electrode 121 and the second pad electrode 122 by the first branched electrode 125 and the second branched electrode 126 may be diffused and provided at the entire semiconductor structure 123.

The first electrode 127 and the second electrode 128 may be formed as a single-layer structure or a multi-layer structure. For example, the first electrode 127 and the second electrode 128 may be an ohmic electrode. For example, the first electrode 127 and the second electrode 128 may be formed of at least one material of ZnO, IrOx, RuOx, NiO, RuOx/ITO, Ni/IrOx/Au, and Ni/IrOx/Au/ITO, Ag, Ni, Cr, Ti, Al, Rh, Pd, Ir, Ru, Mg, Zn, Pt, Au, and Hf, or an alloy of two or more thereof.

Meanwhile, a protective layer may be further provided at the semiconductor structure 123. The protective layer may be provided at the upper surface of the semiconductor structure 123. In addition, the protective layer may be provided at the side surface of the semiconductor structure 123. The protective layer may be provided so that the first pad electrode 121 and the second pad electrode 122 are exposed. In addition, the protective layer may be selectively provided at the periphery and the lower surface of the substrate 124.

As an example, the protective layer may be provided as an insulating material. For example, the protective layer may be formed of at least one material selected from the group consisting of SixOy, SiOxNy, SixNy, and AlxOy.

In the light emitting device according to an embodiment, light generated in the active layer 123b may be emitted in six surface directions of the light emitting device. The light generated in the active layer 123b may be emitted in six surface directions through an upper surface, a low surface, and four side surfaces of the light emitting device.

The light emitted to the upper surface of the light emitting device may be incident at the recessed region described with reference to FIGS. 1 to 32.

For reference, the arrangement directions of the light emitting device described with reference to FIGS. 1 to 32 and the arrangement directions of the light emitting device shown in FIGS. 33 and 34 are shown opposite to each other.

As described with reference to FIGS. 1 to 32, light emitted between the first pad electrode 121 and the second pad electrode 122 may be incident to the adhesive 130 disposed at the recess region. The light emitted in the downward direction of the light emitting device may be optically diffused by the adhesive 130 and the light extraction efficiency may be improved.

In addition, according to an embodiment, a sum of areas of the first and second pad electrodes 121 and 122 may be provided at 10% or less based on an area of an upper surface of the substrate 124. According to the light emitting device package according to the embodiment, the sum of the areas of the first and second pad electrodes 121 and 122 may set at 10% or less based on the area of the upper surface of the substrate 124 in order to secure a light emitting area emitted from the light emitting device and increase light extraction efficiency.

In addition, according to an embodiment, the sum of the areas of the first and second pad electrodes 121 and 122 may be provided at 0.7% or more based on the area of the upper surface of the substrate 124. According to the light emitting device package according to an embodiment, the sum of the areas of the first and second pad electrodes 121 and 122 may be set at 0.7% or more based on the area of the upper surface of the substrate 124 in order to provide a stable bonding force to the light emitting device to be mounted.

For example, a width of the first pad electrode 121 according to the major axis direction of the light emitting device may be several tens of micrometers. The width of the first pad electrode 121 may be, for example, 70 to 90 micrometers. In addition, an area of the first pad electrode 121 may be several thousands of square micrometers.

In addition, a width of the second pad electrode 122 according to the major axis direction of the light emitting device may be several tens of micrometers. The width of the second pad electrode 122 may be, for example, 70 to 90 micrometers. In addition, an area of the second pad electrode 122 may be several thousands of square micrometers.

As described above, as the area of the first and second pad electrodes 121 and 122 is provided to be small, an amount of light transmitted to the lower surface of the light emitting device 120 may be increased. In addition, the adhesive 130 having a good reflection characteristic may be provided under the light emitting device 120. Therefore, the light emitted in a downwards direction of the light emitting device 120 is reflected at the adhesive 130, and is effectively emitted toward an upper direction of the light emitting device package 100, so that the light extraction efficiency may be improved.

Meanwhile, the light emitting device package according to the embodiment described above is described based on a case which the first and second pad electrodes 121 and 122 are in direct contact with the first and second conductive layers 321 and 322.

However, according to another example of the light emitting device package according to the embodiment, another conductive component may be further disposed between the first and second pad electrodes 121 and 122 and the first and second conductive layers 321 and 322.

Next, another example of a light emitting device package according to an embodiment of the present invention will be described with reference to FIG. 35.

In describing the light emitting device package according to the embodiment with reference to FIG. 35, the description of the contents overlapping with the contents described with reference to FIGS. 1 to 34 may be omitted.

Figure 35:
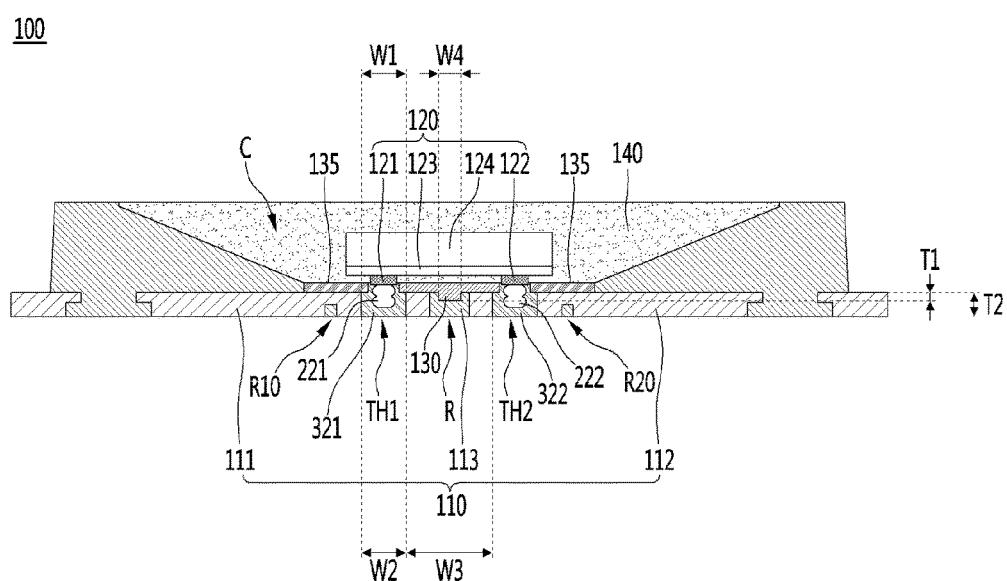
FIG. 35 is a diagram illustrating still another example of a light emitting device package according to an embodiment of the present invention.

The light emitting device package 200 according to the embodiment may comprise a package body 110 and a light emitting device 120, as shown in FIG. 35.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112. The body 113 may perform a function as a kind of electrode separation line. The body 113 may also be referred to as an insulating member.

The body 113 may be disposed on the first frame 111. In addition, the body 113 may be disposed on the second frame 112.

The body 113 may provide an inclined surface disposed on the first frame 111 and the second frame 112. A cavity C may be provided on the first frame 111 and the second frame 112 by the inclined surface of the body 113.

According to the embodiment, the package body 110 may be provided in a structure with the cavity C, or may be provided a structure with a flat upper surface without the cavity C.

For example, the body 113 may be formed of at least one selected from the group consisting of polyphthalamide (PPA), polychloro tri phenyl (PCT), liquid crystal polymer (LCP), polyamide 9T (PA9T), silicone, epoxy molding compound (EMC), silicone molding compound (SMC), ceramic, photo sensitive glass (PSG), sapphire ($Al_2O_3$), and the like. In addition, the body 113 may comprise a high refractive index filler such as $TiO_2$ and $SiO_2$.

According to the embodiment, the light emitting device 120 may comprise a first pad electrode 121, a second pad electrode 122, a semiconductor structure 123, and a substrate 124.

The light emitting device 120 may comprise the semiconductor structure 123 disposed under the substrate 124, as shown in FIG. 35. The first pad electrode 121 and the second pad electrode 122 may be disposed between the semiconductor structure 123 and the body 113.

The semiconductor structure 123 may comprise a first conductive type semiconductor layer, a second conductive type semiconductor layer, and an active layer disposed between the first conductive type semiconductor layer and the second conductive type semiconductor layer. The first pad electrode 121 may be electrically connected to the first conductive type semiconductor layer. In addition, the second pad electrode 122 may be electrically connected to the second conductive type semiconductor layer.

The light emitting device 120 may be disposed on the package body 110. The light emitting device 120 may be disposed on the first frame 111 and the second frame 112. The light emitting device 120 may be disposed in the cavity C provided by the package body 110.

The first pad electrode 121 may be disposed on a lower surface of the light emitting device 120. The second pad electrode 122 may be disposed on the lower surface of the light emitting device 120. The first pad electrode 121 and the second pad electrode 122 may be disposed to be spaced apart from each other on the lower surface of the light emitting device 120.

The first pad electrode 121 may be disposed on the first frame 111. The second pad electrode 122 may be disposed on the second frame 112.

The first pad electrode 121 may be disposed between the semiconductor structure 123 and the first frame 111. The second pad electrode 122 may be disposed between the semiconductor structure 123 and the second frame 112.

Meanwhile, the light emitting device package 200 according to the embodiment may comprise a first opening TH1 and a second opening TH2, as shown in FIG. 35. The first frame 111 may comprise the first opening TH1. The second frame 112 may comprise the second opening TH2.

The first opening TH1 may be provided at the first frame 111. The first opening TH1 may be provided by passing through the first frame 111. The first opening TH1 may be provided by passing through an upper surface and a lower surface of the first frame 111 in a first direction.

The first opening TH1 may be disposed under the first pad electrode 121 of the light emitting device 120. The first opening TH1 may be provided to be overlapped with the first pad electrode 121 of the light emitting device 120. The first opening TH1 may be provided to be overlapped with the first pad electrode 121 of the light emitting device 120 in the first direction from the upper surface of the first frame 111 toward the lower surface thereof.

The second opening TH2 may be provided at the second frame 112. The second opening TH2 may be provided by passing through the second frame 112. The second opening TH2 may be provided by passing through an upper surface and a lower surface of the second frame 112 in a first direction.

The second opening TH2 may be disposed under the second pad electrode 122 of the light emitting device 120. The second opening TH2 may be provided to be overlapped with the second pad electrode 122 of the light emitting device 120. The second opening TH2 may be provided to be overlapped with the second pad electrode 122 of the light emitting device 120 in the first direction from the upper surface of the second frame 112 toward the lower surface thereof.

The first opening TH1 and the second opening TH2 may be disposed to be spaced apart from each other. The first opening TH1 and the second opening TH2 may be disposed to be spaced apart from each other under the lower surface of the light emitting device 120.

According to the embodiment, a width W1 of an upper region of the first opening TH1 may be greater than that of the first pad electrode 121. In addition, a width of an upper region of the second opening TH2 may be greater than that of the second pad electrode 122.

A light emitting device package 200 according to an embodiment, as shown in FIG. 35, may comprise a first conductor 221 and a second conductor 222. In addition, the light emitting device package 200 according to the embodiment may comprise a first conductive layer 321 and a second conductive layer 322. The first conductive layer 321 may be disposed to be spaced apart from the second conductive layer 322.

The first conductor 221 may be disposed under the first pad electrode 121. The first conductor 221 may be electrically connected to the first pad electrode 121. The first conductor 221 may be disposed to be overlapped with the first pad electrode 121 in the first direction.

The first conductor 221 may be provided at the first opening TH1. The first conductor 221 may be disposed between the first pad electrode 121 and the first conductive layer 321. The first conductor 221 may be electrically connected to the first pad electrode 121 and the first conductive layer 321.

A lower surface of the first conductor 221 may be disposed lower than an upper surface of the first opening TH1. The lower surface of the first conductor 221 may be disposed lower than an upper surface of the first conductive layer 321.

The first conductor 221 may be disposed on the first opening TH1. In addition, the first conductor 221 may be disposed to extend from the first pad electrode 121 to an inside of the first opening TH1.

In addition, the second conductor 222 may be disposed under the second pad electrode 122. The second conductor 222 may be electrically connected to the second pad electrode 122. The second conductor 222 may be disposed to be overlapped with the second pad electrode 122 in the first direction.

The second conductor 222 may be provided at the second opening TH2. The second conductor 222 may be disposed between the second pad electrode 122 and the second conductive layer 322. The second conductor 222 may be electrically connected to the second pad electrode 122 and the second conductive layer 322.

A lower surface of the second conductor 222 may be disposed lower than an upper surface of the second opening TH2. The lower surface of the second conductor 222 may be disposed lower than an upper surface of the second conductive layer 322.

The second conductor 222 may be disposed on the second opening TH2. In addition, the second conductor 222 may be disposed to extend from the second pad electrode 122 to an inside of the second opening TH2.

According to the embodiment, the first conductive layer 321 may be disposed on a lower surface and a side surface of the first conductor 221, the first conductive layer 321 may be disposed in direct contact with a lower surface and a side surface of the first conductor 221.

The first conductive layer 321 may be provided at the first opening TH1. The first conductive layer 321 may be disposed under the first pad electrode 121. The width of the first conductive layer 321 may be larger than that of the first pad electrode 121.

As described above, according to the light emitting device package 200 according to the embodiment, an electrical connection between the first conductive layer 321 and the first pad electrode 121 may be more stably provided by the first conductor 221.

In addition, according to the embodiment, the second conductive layer 322 may be disposed on a lower surface and a side surface of the second conductor 222, the second conductive layer 322 may be disposed in direct contact with a lower surface and a side surface of the second conductor 222.

The second conductive layer 322 may be provided at the second opening TH2. The second conductive layer 322 may be disposed under the second pad electrode 122. The width of the second conductive layer 322 may be larger than that of the second pad electrode 122

As described above, according to the light emitting device package 200 according to the embodiment, an electrical connection between the second conductive layer 322 and the second pad electrode 122 may be more stably provided by the second conductor 222.

For example, the first and second conductors 221 and 222 may be stably bonded to the first and second pad electrodes 121 and 122 via separate bonding materials, respectively. In addition, side surfaces and lower surfaces of the first and second conductors 221 and 222 may be in contact with the first and second conductive layers 321 and 322, respectively. Accordingly, an area where the first and second conductive layers 321 and 322 are respectively in contact with the first and second conductors 221 and 222 may be further increased as compared with a case where the first and second conductive layers 321 and 322 are directly contacted to the lower surfaces of the first and second pad electrodes 121 and 122, respectively. Accordingly, a power may be stably provided from the first and second conductive layers 321 and 322 to the first and second pad electrodes 121 and 122 via the first and second conductors 221, 222.

The first conductive layer 321 and the second conductive layer 322 may comprise one material selected from the group consisting of Ag, Au, Pt, Sn, Cu or an alloy thereof. However, the present invention is not limited thereto, and a material capable of securing a conductive function may be used in the first conductive layer 321 and the second conductive layer 322.

As an example, the first conductive layer 321 and the second conductive layer 322 may be formed by using a conductive paste. The conductive paste may comprise a solder paste, a silver paste, or the like, and may be composed of multiple layers or a single layer composed of multiple layers or alloys composed of different materials. As an example, the first and second conductive layers 321 and 322 may comprise a SAC (Sn—Ag—Cu) material.

In addition, the first and second conductors 221, 222 may comprise at least one material selected from the group consisting of Ag, Au, Pt, Sn, Cu, etc. or an alloy thereof. However, the present invention is not limited thereto, and a material capable of securing a conductive function may be used for the first and second conductors 221 and 222.

In addition, the light emitting device package according to the embodiment may comprise an adhesive 130.

The adhesive 130 may be disposed between the body 113 and the light emitting device 120. The adhesive 130 may be disposed between an upper surface of the body 113 and a lower surface of the light emitting device 120.

In addition, the light emitting device package 100 according to the embodiment may comprise a recess R, as shown in FIG. 35.

The recess R may be provided at the body 113. The recess R may be provided between the first opening TH1 and the second opening TH2. The recess R may be provided to concave from the upper surface of the body 113 toward the lower surface thereof. The recess R may be disposed under the light emitting device 120. The recess R may be provided to be overlapped with the light emitting device 120 in the first direction.

As an example, the adhesive 130 may be disposed in the recess R. The adhesive 130 may be disposed between the light emitting device 120 and the body 113. The adhesive 130 may be disposed between the first pad electrode 121 and the second pad electrode 122. As an example, the adhesive 130 may be disposed in contact with a side surface of the first pad electrode 121 and a side surface of the second pad electrode 122.

The adhesive 130 may provide a stable fixing force between the light emitting device 120 and the package body 110. The adhesive 130 may provide a stable fixing force between the light emitting device 120 and the body 113. The adhesive 130 may be disposed, as an example, in direct contact with the upper surface of the body 113. In addition, the adhesive 130 may be disposed in direct contact with the lower surface of the light emitting device 120.

As an example, the adhesive 130 may comprise at least one of an epoxy-based material, a silicone-based material, and a hybrid material comprising an epoxy-based material and a silicone-based material. As an example, the adhesive 130 may comprise a white silicone. The adhesive 130 may be referred to as a first resin as another representation.

The adhesive 130 may provide a stable fixing force between the body 113 and the light emitting device 120. When light is emitted to the lower surface of the light emitting device 120, the adhesive 130 may provide a light diffusion function between the light emitting device 120 and the body 113. When the light is emitted from the light emitting device 120 to the lower surface of the light emitting device 120, the adhesive 130 may improve the light extraction efficiency of the light emitting device package 100 by providing the light diffusion function. In addition, the adhesive 130 may reflect the light emitted from the light emitting device 120. When the adhesive 130 comprises the reflection function, the adhesive 130 may be formed of a material comprising $TiO_2$, Silicone, and the like.

According to an embodiment, a depth T1 of the recess R may be provided to be smaller than a depth T2 of the first opening TH1 or a depth T2 of the second opening TH2.

The depth T1 of the recess R may be determined in consideration of adhesion force of the adhesive 130. In addition, the depth T1 of the recess R may be determined by considering stable strength of the body 113 and/or not to occur a crack in the light emitting device package 100 due to heat emitted from the light emitting device 120.

The recess R may provide a proper space in which a kind of under-filling process may be performed under the light emitting device 120. Here, the under-filling process may be a process of mounting the light emitting device 120 on the package body 110 and then disposing the adhesive 130 under the light emitting device 120, and may be a process of disposing the adhesive 130 in the recess R and then disposing the light emitting device 120 in order to mount by the adhesive 130 in the process of mounting the light emitting device 120 on to the package body 110.

The depth T1 and the width W4 of the recess R may affect a forming position and fixing force of the adhesive 130. The depth T1 and the width W4 of the recess R may be determined so that a fixing force may be sufficiently provided by the adhesive 130 disposed between the body 113 and the light emitting device 120.

As an example, the depth T1 of the recess R may be provided at several tens of micrometers. The depth T1 of the recess R may be provided at 40 to 60 micrometers.

In addition, the width W4 of the recess R may be provided at several tens of micrometers to several hundreds of micrometers. Here, the width W4 of the recess R may be provided in the major axis direction of the light emitting device 120.

The width W4 of the recess R may be narrower than a distance between the first pad electrode 121 and the second pad electrode 122. The width W4 of the recess R may be provided by several hundreds of micrometers larger than a width or a diameter of the first and second pad electrode 121 and 122. The width W4 of the recess R may be provided at 300 to 400 micrometers.

The depth T2 of the first opening TH1 may be provided to correspond to a thickness of the first frame 111. The depth T2 of the first opening TH1 may be provided at a thickness capable of maintaining a stable strength of the first frame 111.

The depth T2 of the second opening TH2 may be provided to correspond to a thickness of the second frame 112. The depth T2 of the second opening TH2 may be provided at a thickness capable of maintaining a stable strength of the second frame 112.

The depth T2 of the first opening TH1 and the depth T2 of the second opening TH2 may be provided to correspond to a thickness of the body 113. The depth T2 of the first opening TH1 and the depth T2 of the second opening TH2 may be provided at a thickness capable of maintaining a stable strength of the body 113.

As an example, the depth T2 of the first opening TH1 may be provided at several hundreds of micrometers. The depth T2 of the first opening TH1 may be provided at 180 to 220 micrometers. As an example, the depth T2 of the first opening TH1 may be provided at 200 micrometers.

As an example, a thickness of T2−T1 may be selected to be at least 100 micrometers or more. This is in consideration of a thickness of an injection process capable of providing crack free of the body 113.

According to an embodiment, a ratio of the thickness T2 to the thickness T1, T2/T1, may be provided at 2 to 10. As an example, when a thickness of T2 is provided at 200 micrometers, the thickness of T1 may be provided at 20 to 100 micrometers.

In addition, according to an embodiment, a sum of areas of the first and second pad electrodes 121 and 122 may be provided at 10% or less based on an area of an upper surface of the substrate 124. According to the light emitting device package according to the embodiment, the sum of the areas of the first and second pad electrodes 121 and 122 may be set at 10% or less based on the area of the upper surface of the substrate 124 in order to secure a light emitting area emitted from the light emitting device and increase light extraction efficiency.

In addition, according to the embodiment, the sum of the areas of the first and second pad electrodes 121 and 122 may be provided at 0.7% or more based on the area of the upper surface of the substrate 124. According to the light emitting device package according to the embodiment, the sum of the areas of the first and second pad electrodes 121 and 122 may be set at 0.7% or more based on the area of the upper surface of the substrate 124 in order to provide a stable bonding force to the light emitting device to be mounted.

According to the light emitting device package according to the embodiment, the sum of the areas of the first and second pad electrodes 121 and 122 may be set at 0.7% or more based on the area of the upper surface of the substrate 124 so that the first conductor 221 and the second conductor 222 can be stably arranged.

According to the embodiment, an area where the adhesive 130 is overlapped with the light emitting device 120 based on the first direction may be provided to be larger than that of a region where the first and second openings TH1 and TH2 are overlapped with the first and second pad electrodes 121 and 122.

As described above, as the area of the first and second pad electrodes 121 and 122 is provided to be small, an amount of light transmitted to the lower surface of the light emitting device 120 may be increased. In addition, the adhesive 130 having a good reflection characteristic may be provided under the light emitting device 120. Therefore, the light emitted in a downwards direction of the light emitting device 120 is reflected at the adhesive 130, and is effectively emitted toward an upper direction of the light emitting device package 100, so that the light extraction efficiency may be improved.

In addition, the light emitting device package 200 according to the embodiment may comprise a molding part 140, as shown in FIG. 35.

The molding part 140 may be provided on the light emitting device 120. The molding part 140 may be disposed on the first frame 111 and the second frame 112. The molding part 140 may be disposed at the cavity C provided by the package body 110.

The molding part 140 may comprise an insulating material. In addition, the molding part 140 may comprise wavelength converting means configured to be incident light emitted from the light emitting device 120 and provide wavelength converted light. As an example, the molding part 140 may comprise at least one selected from the group consisting of a phosphor, a quantum dot, and the like.

In addition, as shown in FIG. 35, the light emitting device package 200 according to the embodiment may comprise a first lower recess R10 and a second lower recess R20. The first lower recess R10 and the second lower recess R20 may be disposed to be spaced apart from each other.

The first lower recess R10 may be provided at the lower surface of the first frame 111. The first lower recess R10 may be provided to concave from the lower surface of the first frame 111 toward the upper surface thereof. The first lower recess R10 may be disposed to be spaced apart from the first opening TH1.

The first lower recess R10 may be provided with a width of several micrometers to several tens of micrometers. A resin portion may be provided at the first lower recess R10. The resin portion filled at the first lower recess R10 may be provided with, as an example, the same material as the body 113.

However, the present invention is not limited thereto, and the resin portion may be provided with a material selected from materials having poor adhesion force and wettability with the first and second conductive layers 321 and 322. Alternatively, the resin portion may be provided and selected from a material having low surface tension with respect to the first and second conductive layers 321 and 322.

As an example, the resin portion filled at the first lower recess R10 may be provided in a process in which the first frame 111, the second frame 112, and the body 113 are formed through an injection process or the like.

The resin portion filled at the first lower recess R10 may be disposed around a lower surface region of the first frame 111 in which the first opening TH1 is provided. The lower surface region of the first frame 111 in which the first opening TH1 is provided may be disposed to be separated from the lower surface forming the first frame 111 therearound in a shape of an island.

Therefore, when the resin portion is disposed of a material having poor adhesion force and wettability with the first and second conductive layers 321 and 322 or a material having low surface tension between the resin portion and the first and second conductive layers 321 and 322, it is possible to prevent the first conductive layer 321 provided in the first opening TH1 from being moved from the first opening TH1 and diffused over the resin portion filled at the first lower recess R10 or the body 113.

This is based on facts that an adhesion relationship between the first conductive layer 321 and the resin portion and the body 113, or the wettability, the surface tension, and the like between the resin portion and the first and second conductive layers 321 and 322 are not good. That is, the material forming the first conductive layer 321 may be selected to have a good adhesion property with the first frame 111. In addition, a material forming the first conductive layer 321 may be selected to have a poor adhesion property with the resin portion and the body 113.

Since the first conductive layer 321 does not overflow from the first opening TH1 toward a region in which the resin portion or the body 113 is provided, it is possible to prevent the first conductive layer 321 from overflowing or extending an outside of the region in which the resin portion or the body 113 is provided, so that the first conductive layer 321 may be stably disposed in a region in which the first opening TH1 is provided. Therefore, when the first conductive layer 321 is disposed in the first opening TH1, it is possible to prevent the first conductive layer 321 from being extended to an outside of the first lower recess R10 in which the resin portion or the body 113 are provided. In addition, the first conductive layer 321 may be stably connected to the lower surface of the first pad electrode 121 in the first opening TH1.

Therefore, when the light emitting device package is mounted on a circuit board, it is possible to prevent a problem that the first conductive layer 321 and the second conductive layer 322 come into contact with each other and are short-circuited, and it is very easy to control an amount of the first and second conductive layers 321 and 322 in the process of disposing the first and second conductive layers 321 and 322.

In addition, the first conductive layer 321 may be disposed to be extended from the first opening TH1 to the first lower recess R10. Therefore, the first conductive layer 321 and/or the resin portion may be disposed in the first lower recess R10.

In addition, the second lower recess R20 may be provided at the lower surface of the second frame 112. The second lower recess R20 may be provided to concave from the lower surface of the second frame 112 toward the upper surface thereof. The second lower recess R20 may be disposed to be spaced apart from the second opening TH2.

The second lower recess R20 may be provided with a width of several micrometers to several tens of micrometers. A resin portion may be provided at the second lower recess R20. The resin portion filled at the second lower recess R20 may be provided with, as an example, the same material as the body 113.

However, the present invention is not limited thereto, and the resin portion may be provided with a material selected from materials having poor adhesion force and wettability with the first and second conductive layers 321 and 322. Alternatively, the resin portion may be provided and selected from a material having a low surface tension with respect to the first and second conductive layers 321 and 322.

As an example, the resin portion filled at the second lower recess R20 may be provided in a process in which the first frame 111, the second frame 112, and the body 113 are formed through an injection process or the like.

The resin portion filled at the second lower recess R20 may be disposed around a lower surface region of the second frame 112 in which the second opening TH2 is provided. The lower surface region of the second frame 112 in which the second opening TH2 is provided may be disposed to be separated from the lower surface forming the second frame 112 therearound in a shape of an island.

Therefore, when the resin portion is disposed of a material having poor adhesion force and wettability with the first and second conductive layers 321 and 322 or a material having low surface tension between the resin portion and the first and second conductive layers 321 and 322, it is possible to prevent the first and second conductive layer 322 in which the second opening TH2 is provided from being moved from the second opening TH2 and diffused over the resin portion filled at the second lower recess R20 or the body 113.

This is based on facts that an adhesion relationship between the second conductive layer 322 and the resin portion and the body 113, or the wettability, the surface tension, and the like between the resin portion and the first and second conductive layers 321 and 322 are not good. That is, the material forming the second conductive layer 322 may be selected to have a good adhesion property with the second frame 112. In addition, a material forming the second conductive layer 322 may be selected to have a poor adhesion property with the resin portion and the body 113.

Since the second conductive layer 322 does not overflow from the second opening TH2 toward a region in which the resin portion or the body 113 is provided, it is possible to prevent the second conductive layer 322 from overflowing or extending an outside of a region in which the resin portion or the body 113 is provided, so that the second conductive layer 322 may be stably disposed in a region in which the second opening TH2 is provided. Therefore, when the second conductive layer 322 is disposed in the second opening TH2, it is possible to prevent the second conductive layer 322 from being extended to an outside of the second lower recess R20 in which the resin portion or the body 113 are provided. In addition, the second conductive layer 322 may be stably connected to the lower surface of the second pad electrode 122 in the second opening TH2.

Therefore, when the light emitting device package is mounted on a circuit board, it is possible to prevent a problem that the first conductive layer 321 and the second conductive layer 322 come into contact with each other and are short-circuited, and it is very easy to control an amount of the first and second conductive layers 321 and 322 in the process of disposing the first and second conductive layers 321 and 322.

In addition, the second conductive layer 322 may be disposed to be extended from the second opening TH2 to the second lower recess R20. Therefore, the second conductive layer 322 and/or the resin portion may be disposed in the second lower recess R20.

In addition, the light emitting device package 200 according to the embodiment may comprise a resin portion 135, as shown in FIG. 35.

The resin portion 135 may be disposed between the first frame 111 and the light emitting device 120. The resin portion 135 may be disposed between the second frame 112 and the light emitting device 120. The resin portion 135 may be provided at the bottom surface of the cavity C provided in the package body 110.

The resin portion 135 may be disposed on the side surface of the first pad electrode 121. The resin portion 135 may be disposed on the side surface of the second pad electrode 122. The resin portion 135 may be disposed under the semiconductor structure 123.

As an example, the resin portion 135 may comprise at least one of an epoxy-based material, a silicone-based material, and a hybrid material comprising an epoxy-based material and a silicone-based material. In addition, the resin portion 135 may be a reflective part that reflects light emitted from the light emitting device 120, as an example, a resin containing a reflective material such as $TiO_2$, or may comprise white silicone.

The resin portion 135 may be disposed under the light emitting device 120 to perform a sealing function. In addition, the resin portion 135 may improve adhesion force between the light emitting device 120 and the first frame 111. In addition, the resin portion 135 may improve adhesion force between the light emitting device 120 and the second frame 112.

The resin portion 135 may seal around the first pad electrode 121 and the second pad electrode 122. The resin portion 135 may prevent the first conductive layer 321 and the second conductive layer 322 from being moved from the first opening TH1 region and the second opening TH2 region, and diffusing and moving in direction of an outer side surface of the light emitting device 120. When the first and second conductive layers 321 and 322 are diffused and moved in the outer side surface direction of the light emitting device 120, the first and second conductive layers 321 and 322 may be in contact with the active layer of the light emitting device 120, thereby causing a failure due to a short-circuit. Therefore, when the resin portion 135 is disposed, it is possible to prevent a short-circuit t due to the first and second conductive layers 321 and 322 and the active layer, thereby improving reliability of the light emitting device package according to the embodiment.

In addition, according to an embodiment, a protective layer may be provided on the lower surface and the periphery of the light emitting device 120. In such a case, since an insulating protective layer is provided on the surface of the active layer, even when the first and second conductive layers 321 and 322 are diffused and moved in an outer side surface direction of the light emitting device 120, it is possible to prevent the first and second conductive layers 321 and 322 from being electrically connected to the active layer of the light emitting device 120.

Meanwhile, in the case in which an insulating protective layer is disposed on the lower surface and the periphery of the light emitting device 120, an insulating protective layer may not be disposed at the periphery of the substrate 124 of the light emitting device 120. At this point, when the substrate 124 is provided with a conductive material, when the first and second conductive layers 321 and 322 come into contact with the substrate 124, a failure due to a short-circuit may occur. Therefore, when the resin portion 135 is disposed, it is possible to prevent a short-circuit due to the first and second conductive layers 321 and 322 and the substrate 124, thereby improving reliability of the light emitting device package according to the embodiment.

In addition, when the resin portion 135 comprises a material having a reflective property such as white silicone, the resin portion 135 may reflect light emitted from the light emitting device 120 toward an upper direction of the package body 110, thereby improving the light extraction efficiency of the light emitting device package 200.

Meanwhile, according to another example of the light emitting device package according to the embodiment of the present invention, the resin portion 135 may not be provided separately, and the molding part 140 may be disposed so as to be in direct contact with the first frame 111 and the second frame 112.

In addition, according to another example of the light emitting device package according to the embodiment of the present invention, the resin portion 135 may not be provided separately, and the adhesive 130 may be provided at the periphery of the first and second pad electrodes 121 and 122.

At this point, the adhesive 130 may be referred to as a first resin, and the first and second pad electrodes 121 and 122 may be referred to as first and second bonding parts, respectively.

Meanwhile, the adhesive 130 may be disposed at the upper region of the first and second openings TH1 and TH2. A part of the adhesive 130 may be moved to the first and second openings TH1 and TH2 in a process in which the light emitting device 120 is provided on the package body 110. A part of the adhesive 130 may be disposed at a side surface region of the first and second pad electrodes 121 and 122 in the first and second openings TH1 and TH2. A part of the adhesive 130 may be disposed on the first and second conductive layers 321 and 322 in the first and second openings TH1 and TH2. In addition, a part of the adhesive 130 may be disposed at side surfaces of the first and second conductors 221 and 222 in the first and second openings TH1 and TH2.

The adhesive 130 may seal the upper region of the first and second openings TH1 and TH2, and prevent moisture or foreign substance from flowing from outside into a region in which the light emitting device 120 is disposed through the first and second openings TH1 and TH2.

In addition, when a space for providing the adhesive 130 between the light emitting device 120 and the package body 110 is sufficiently secured, the recess R may not be provided on the upper surface of the package body 110.

In the light emitting device package 200 according to the embodiment, power may be connected to the first pad electrode 121 through the region of the first opening TH1, and power may be connected to the second pad electrode 122 through the region of the second opening TH2.

Accordingly, the light emitting device 120 may be driven by the driving power supplied through the first pad electrode 121 and the second pad electrode 122. In addition, the light emitted from the light emitting device 120 may be provided in the upper direction of the package body 110.

Meanwhile, the light emitting device package 200 according to an embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided in the light emitting device package, so that stability of electrical connection and physical coupling may be weakened.

However, according to the light emitting device package and a manufacturing method of the light emitting device package according to an embodiment, the first pad electrode and the second pad electrode of the light emitting device according to the embodiment may be provided with driving power by the conductive layers disposed in the openings. In addition, the melting point of the conductive layers disposed in the openings may be selected so as to have a higher value than that of the general bonding material.

Therefore, since the light emitting device package 200 according to the embodiment does not cause a re-melting phenomenon even when the light emitting device package is bonded to the main substrate by a reflow process, the electrical connection and the physical bonding force may not be deteriorated.

In addition, according to the light emitting device package 200 and the manufacturing method of the light emitting device package according to an embodiment, the package body 110 does not need to be exposed to a high temperature in the manufacturing process of the light emitting device package. Therefore, according to an embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphthalamide (PPA) resin, polycyclohexylenedimethylene terephthalate (PCT) resin, epoxy molding compound (EMC) resin, and silicone molding compound (SMC) resin.

In addition, according to an embodiment, a sum of areas of the first and second pad electrodes 121 and 122 may be provided at 10% or less based on an area of an upper surface of the substrate 124. According to the light emitting device package according to the embodiment, the sum of the areas of the first and second pad electrodes 121 and 122 may be set at 10% or less based on the area of the upper surface of the substrate 124 in order to secure a light emitting area emitted from the light emitting device and increase light extraction efficiency.

In addition, according to an embodiment, the sum of the areas of the first and second pad electrodes 121 and 122 may be provided at 0.7% or more based on the area of the upper surface of the substrate 124. According to the light emitting device package according to an embodiment, the sum of the areas of the first and second pad electrodes 121 and 122 may be set at 0.7% or more based on the area of the upper surface of the substrate 124 in order to provide a stable bonding force to the light emitting device to be mounted.

According to the light emitting device package according to the embodiment, the sum of the areas of the first and second pad electrodes 121 and 122 may be set at 0.7% or more based on the area of the upper surface of the substrate 124 so that the first conductor 221 and the second conductor 222 can be stably arranged.

According to the embodiment, an area where the adhesive 130 is overlapped with the light emitting device 120 based on the first direction may be provided to be larger than that of a region where the first and second openings TH1 and TH2 are overlapped with the first and second pad electrodes 121 and 122.

As described above, as the area of the first and second pad electrodes 121 and 122 is provided to be small, an amount of light transmitted to the lower surface of the light emitting device 120 may be increased. In addition, the adhesive 130 having a good reflection characteristic may be provided under the light emitting device 120. Therefore, the light emitted in a downwards direction of the light emitting device 120 is reflected at the adhesive 130, and is effectively emitted toward an upper direction of the light emitting device package 100, so that the light extraction efficiency may be improved.

Meanwhile, the light emitting device package according to the embodiment may be applied to the light source apparatus.

Further, the light source apparatus may include a display apparatus, a lighting apparatus, a head lamp, and the like based on the industrial field.

As an example of the light source apparatus, the display apparatus includes a bottom cover, a reflective plate disposed on the bottom cover, a light emitting module emitting light and including a light emitting device, a light guide plate disposed on a front of the reflective plate and guiding light emitted from the light emitting module, an optical sheet including prism sheets disposed in front of the light guide plate, a display panel disposed in front of the optical sheet, an image signal output circuit connected to the display panel and supplying an image signal to the display panel, and a color filter disposed in front of the display panel. Herein, the bottom cover, the reflective plate, the light emitting module, the light guide plate, and the optical sheet may form a backlight unit. In addition, the display apparatus may have a structure in which light emitting devices each emitting red, green, and blue light are disposed without including the color filter.

As another example of the light source apparatus, the head lamp may include a light emitting module including a light emitting device package disposed on a substrate, a reflector for reflecting light emitted from the light emitting module in a predetermined direction, for example, in a forward direction, a lens for forwardly refracting the light, and a shade for blocking or reflecting a portion of the light reflected by the reflector and directed to the lens to form a light distribution pattern desired by a designer.

The lighting apparatus as another light source apparatus may include a cover, a light source module, a heat sink, a power supply, an inner case, and a socket. In addition, the light source apparatus according to an embodiment may further include at least one of a member and a holder. The light source module may include a light emitting device package according to the embodiment.

Meanwhile, the light emitting device package according to the embodiment described above may comprise various modifications.

Hereinafter, modifications of the light emitting device package according to the embodiment will be described with reference to the drawings, and each modification may be applied to each of the embodiments of the light emitting device package described above. In addition, each modification described below may be applied by combining a plurality of modifications within a range not conflicting with each other.

Figure 36:
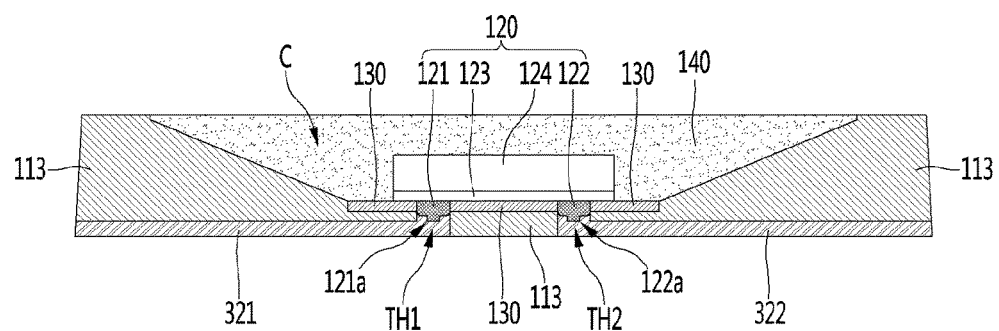
FIG. 36 is a view illustrating still another example of a light emitting device package according to an embodiment of the present invention.

First, still another example of a light emitting device package according to an embodiment of the present invention will be described with reference to FIG. 36. In describing of the light emitting device package according to the embodiment with reference to FIG. 36, the description of contents overlapping with the contents described above may be omitted.

The light emitting device package according to the embodiment may comprise a body 113 and a light emitting device 120. The body 113 may comprise first and second openings TH1 and TH2. The light emitting device 120 may comprise first and second pad electrodes 121 and 122.

The first and second pad electrodes 121 and 122 may be electrically connected to first and second semiconductor layers of the light emitting device 120, respectively, and may be referred to as first and second bonding parts, respectively.

The first and second pad electrodes 121 and 122 may comprise protruding portions 121a and 122a, respectively. For example, the first and second pad electrodes 121 and 122 may comprise the protruding portions 121a and 122a protruded to extend downward in the first and second openings TH1 and TH2, respectively. The protruding portions 121a and 122a of the first and second pad electrodes 121 and 122 may be disposed in the first and second openings TH1 and TH2, respectively.

A lower surface of the protruding portion 121a of the first pad electrode 121 may be disposed lower than an upper surface of the first opening TH1. A lower surface of the protruding portion 122a of the second pad electrode 122 may be disposed lower than an upper surface of the second opening TH2.

The protruding portions 121a and 122a of the first and second pad electrodes 121 and 122 may be provided in a cylindrical shape or a polygonal column shape as an example. a shape of the first and second pad electrodes 121 and 122 may be selected corresponding to a shape of upper regions of the first and second openings TH1 and TH2. a width or a diameter of the protruding portions 121a and 122a of the first and second pad electrodes 121 and 122 may be provided smaller than those of the upper regions of the first and second openings TH1 and TH2.

A light emitting device package according to the embodiment may comprise the first and second conductive layers 321 and 322. The first conductive layers 321 may be disposed to be spaced apart from the second conductive layers 322. The first and second conductive layers 321 and 322 may be disposed to be spaced apart from each other on a lower surface of the body 113.

A first region of the upper surface of the first conductive layer 321 may be disposed under the first opening TH1. The first region of the upper surface of the first conductive layer 321 may be disposed to be overlapped with the first opening TH1 in a vertical direction. The first conductive layer 321 may be disposed under the first pad electrode 121. The first conductive layer 321 may be disposed at the periphery of the protruding portion 121a of the first pad electrode 121.

In addition, a second region of the upper surface of the first conductive layer 321 may be disposed under the lower surface of the body 113. The second region of the upper surface of the first conductive layer 321 may be disposed to be overlapped with the lower surface of the body 113 in a vertical direction. For example, the upper surface of the first conductive layer 321 may be connected to the lower surface of the body 113 via an adhesive resin.

A first region of the upper surface of the second conductive layer 322 may be disposed under the second opening TH2. The first region of the upper surface of the second conductive layer 322 may be disposed to be overlapped with the second opening TH2 in a vertical direction. The second conductive layer 322 may be disposed under the second pad electrode 122. The second conductive layer 322 may be disposed at the periphery of the protruding portion 122a of the second pad electrode 122.

In addition, a second region of the upper surface of the second conductive layer 322 may be disposed under the lower surface of the body 113. The second region of the upper surface of the second conductive layer 322 may be disposed to be overlapped with the lower surface of the body 113 in a vertical direction. For example, the upper surface of the second conductive layer 322 may be connected to the lower surface of the body 113 via an adhesive resin.

The first conductive layer 321 and the second conductive layer 322 may comprise at least one material selected from the group consisting of Ag, Au, Pt, Sn, Cu, etc. or an alloy thereof. However, the present invention is not limited thereto, and a material capable of securing a conductive function may be used for the first conductive layer 321 and the second conductive layer 322.

For example, the first conductive layer 321 and the second conductive layer 322 may be formed by using a conductive paste. The conductive paste may comprise a solder paste, a silver paste, or the like, and may comprise multiple layers or a single layer composed of multiple layers or alloys composed of different materials. As an example, the first conductive layer 321 and the second conductive layer 322 may comprise a SAC (Sn—Ag—Cu) material.

In addition, the first and second conductive layer 321 and 322 may be disposed to extend to an end portion of the body 113.

The first and second conductive layer 321 and 322 may provide a kind of a lead frame function. The first and second conductive layer 321 and 322 may be electrically connected to the first and second pad electrode 121 and 122, respectively.

In addition, the light emitting device package according to the embodiment may comprise an adhesive 130. The adhesive 130 may be referred to as a first resin, as described above.

The adhesive 130 may provide a stable fixing force between the light emitting device 120 and the body 113. The adhesive 130 may be disposed, for example, in direct contact with the upper surface of the body 113. In addition, the adhesive 130 may be disposed in direct contact with the lower surface of the light emitting device 120.

For example, the adhesive 130 may be disposed to move a periphery of the first and second pad electrode 121 and 122 and a lower portion of the light emitting device 120. In addition, the adhesive 130 may be disposed to move inside the first and second openings TH1 and TH2.

The adhesive 130 may seal the upper region of the first and second openings TH1 and TH2, and prevent moisture or foreign substance from flowing from outside into a region in which the light emitting device 120 is disposed through the first and second openings TH1 and TH2. In addition, the adhesive 130 may improve a fixing force between the light emitting device 120 and the body 113.

In addition, when a space for providing the adhesive 130 between the light emitting device 120 and the body 113 is sufficiently secured, the recess may not be provided on the upper surface of the package body 110.

The light emitting device package according to an embodiment may be mounted and supplied on a submount, a circuit board, or the like. At this point, the first and second conductive layer 321 and 322 may be electrically connected to a first and second pad parts provided on a submount, a circuit board, or the like, respectively.

In the light emitting device package according to the embodiment, power may be connected to the first pad electrode 121 through the region of the first opening TH1, and power may be connected to the second pad electrode 122 through the region of the second opening TH2.

Accordingly, the light emitting device 120 may be driven by the driving power supplied through the first pad electrode 121 and the second pad electrode 122. In addition, the light emitted from the light emitting device 120 may be provided in the upper direction of the package body 110.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided in the light emitting device package, so that stability of electrical connection and physical coupling may be weakened.

However, according to the light emitting device package and a manufacturing method of the light emitting device package according to an embodiment, the first pad electrode and the second pad electrode of the light emitting device according to the embodiment may be provided with driving power by the conductive layers disposed in the openings. In addition, the melting point of the conductive layers disposed in the openings may be selected so as to have a higher value than that of the general bonding material.

Therefore, since the light emitting device package according to the embodiment does not cause a re-melting phenomenon even when the light emitting device package is bonded to the main substrate by a reflow process, the electrical connection and the physical bonding force may not be deteriorated.

In addition, according to the light emitting device package and the manufacturing method of the light emitting device package according to an embodiment, the body 113 does not need to be exposed to a high temperature in the manufacturing process of the light emitting device package. Therefore, according to an embodiment, it is possible to prevent the body 113 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphthalamide (PPA) resin, polycyclohexylenedimethylene terephthalate (PCT) resin, epoxy molding compound (EMC) resin, and silicone molding compound (SMC) resin.

Figure 37:
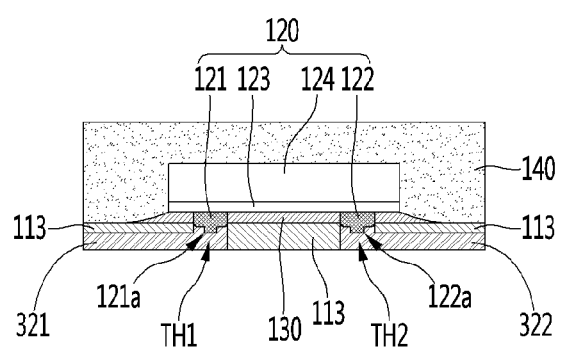
FIG. 37 is a view illustrating still another example of a light emitting device package according to an embodiment of the present invention.

Meanwhile, in the above description, it is described based on the case in which the body 113 comprises the cavity C. The light emitting device 120 may be disposed in the cavity C. However, according to another embodiment, as shown in FIG. 37, the body 113 may be provided in a form not comprising a cavity. For example, the body 113 may be provided with a flat upper surface without comprising a cavity.

A side surface of the body 113 and a side surface of the first conductive layer 321 may be provided in the same plane. In addition, another side surface of the body 113 and a side surface of the second conductive layer 322 may be provided in the same plane In addition, in the above description, it is described based on the case in which the first conductive layer 321 and the second conductive layer 322 disposed on a lower surface of the body 113 is disposed to extend to a side surface of the body 113. However, the first conductive layer 321 and the second conductive layer 322 disposed on a lower surface of the body 113 may not be extend to a side surface of the body 113 and may be disposed in only a portion of the lower surface of the body 113, and may be disposed to be overlapped with the cavity C in a vertical direction Meanwhile, the adhesive 130 may also be disposed on a side surface of the light emitting device 120. This is because the adhesive 130 may ride up the side surface of the light emitting device 120 due to the OH—provided on the surface of the light emitting device 120. At this time, when a thickness of the adhesive 130 provided on the side surface of the light emitting device 120 is too thick, the light intensity Po may be lowered, so that it is necessary to control the thickness thereof appropriately. In addition, since the adhesive 130 may be disposed on the side surface of the light emitting device 120, the adhesive 130 may be provided in a double protective film structure, and the moisture resistance may be improved, and the light emitting device 120 may be protected from other contaminants In addition, when the adhesive 130 is provided under and around the light emitting device 120, for example, the adhesive 130 may be provided through a centrifugal separation method or the like. The adhesive 130 may be applied to the body 113 and the adhesive 130 may be diffused into a lower portion and peripheral regions of the light emitting device 120 through a centrifugal separation method. As described above, when the centrifugal separation method or the like is applied, a reflective material contained in the adhesive 130 may be precipitated into the lower portion region. Accordingly, only one kind of clear molding part is disposed on a side of an active layer of the light emitting device 120, and the reflective material may be disposed in a lower region than the active layer of the light emitting device 120, so that the light intensity Po may be further improved.

Furthermore, according to another embodiment, the adhesive 130 and the body 113 may comprise the same material.

In addition, according to the embodiment, physical properties of the adhesive 130 may be selected in consideration of coefficient of thermal expansion (CTE) matching between the body 113, the adhesive 130, and the light emitting device 120, and thus cracks or delamination of the light emitting device package due to thermal shock may be improved.

The features, structures, effects and the like described in the above embodiments are included in at least one embodiment and are not limited to one embodiment only. Further, with respect to the features, structures, effects, and the like described in the embodiments, other embodiments may be carried out with combinations or modifications by those having ordinary skill in the art. Accordingly, the contents relevant to the combinations and modifications should be construed as being included in the scope of the embodiments.

Although preferable embodiments have been proposed and set forth in the aforementioned description, the present invention should not be construed as limited thereto. It will be apparent that various deformations and modifications not illustrated are available within the scope without departing from inherent features of the embodiment of the present invention by any one having ordinary skill in the art. For example, each component specifically shown in the embodiments may be carried out with the modifications. In addition, it is apparent that differences relevant to the modifications and deformations are included in the scope of the embodiments set in the accompanying claims of the present invention.

What is claimed is:

1. A light emitting device package comprising:
a body comprising an opening passing through an upper surface of the body and a lower surface of the body;
a light emitting device disposed on the body and including a first part and a second part; and
a first conductive adhesive member and a second conductive adhesive member disposed in the opening,
wherein the light emitting device includes a first conductivity type semiconductor layer, a second conductivity type semiconductor layer, and an active layer disposed between the first conductivity type semiconductor layer and the second conductivity type semiconductor layer,
wherein the first part is electrically connected to the first conductivity type semiconductor layer,
wherein the second part is electrically connected to the second conductivity type semiconductor layer,
wherein the first part includes a first protrusion,
wherein the second part includes a second protrusion,
wherein a portion of the first protrusion is disposed in the opening and contacts the first conductive adhesive member, and
wherein a portion of the second protrusion is disposed in the opening and contacts the second conductive adhesive member.

2. The light emitting device package of claim 1, further comprising a resin disposed between the body and the light emitting device.

3. The light emitting device package of claim 1, wherein the first and second protrusions of the first and second parts are disposed in the opening.

4. The light emitting device package of claim 1, wherein the first and second parts comprise at least one material selected from the group consisting of Ti, Al, In, Ir, Ta, Pd, Co, Cr, Mg, Zn, Ni, Si, Ge, Ag, Ag alloy, Au, Hf, Pt, Ru, Rh, Sn, Cu, ZnO, IrOx, RuOx, NiO, RuOx/ITO, Ni/IrOx/Au, Ni/IrOx/Au/ITO, or an alloy thereof.

5. The light emitting device package of claim 2, wherein the resin comprises a white silicone.

6. The light emitting device package of claim 2, wherein the resin is provided to be in direct contact with the upper surface of the body and a lower surface of the light emitting device.

7. The light emitting device package of claim 2, wherein the resin is provided at a periphery of the first and second parts.

8. The light emitting device package of claim 2, wherein the body comprises a recess that is concave from the upper surface of the body toward the lower surface thereof, and
wherein the resin is provided in the recess.

9. The light emitting device package of claim 1, wherein the body includes a first frame and a second frame,
wherein the first frame includes a first opening, and
wherein the second frame includes a second opening.

10. The light emitting device package of claim 9, wherein the body includes a sidewall,
wherein the opening passes through an upper surface of the sidewall and a lower surface of the sidewall, and
wherein an inner inclined surface of the sidewall comprises a cavity.

11. The light emitting device package of claim 9, wherein a portion of the body disposed between the first frame and the second frame includes a recess at an upper surface.

12. The light emitting device package of claim 11, wherein the first part further comprises a first pad,
wherein the second part further comprises a second pad, wherein a width of the first protrusion is less than a width of the first pad, and wherein a width of the second protrusion is less than a width of the second pad.

13. The light emitting device package of claim 12, wherein a resin portion disposed on the recess of the portion of the body contacts the first pad and the second pad.

14. The light emitting device package of claim 9, wherein a lower surface of the first protrusion of the first part is disposed lower than an upper surface of the first opening.

15. The light emitting device package of claim 9, wherein a shape of the first and second parts corresponds to a shape of upper regions of the first and second openings, respectively.

16. The light emitting device package of claim 9, wherein a width of the first and second protrusions of the first and second parts is provided smaller than that of upper regions of the first and second openings, respectively.

17. The light emitting device package of claim 9, wherein the first and second openings are disposed under the light emitting device.

18. The light emitting device package of claim 10, wherein the light emitting device is disposed in the cavity, and wherein an upper surface of the light emitting device is disposed lower than the upper surface of the sidewall.

19. The light emitting device package of claim 9, wherein each of the first opening, the second opening, the first protrusion, and the second protrusion is horizontally overlapped.

20. The light emitting device package of claim 12, wherein the first pad is disposed to overlap with the first protrusion in a vertical direction, and is electrically connected to the first protrusion, and wherein the second pad is disposed to overlap with the second protrusion in the vertical direction, and is electrically connected to the second protrusion.

* * * * *